United States Patent
Or-Bach et al.

(10) Patent No.: US 11,152,386 B2
(45) Date of Patent: Oct. 19, 2021

(54) 3D SEMICONDUCTOR DEVICE AND STRUCTURE

(71) Applicant: Monolithic 3D Inc., San Jose, CA (US)

(72) Inventors: Zvi Or-Bach, San Jose, CA (US); Jin-Woo Han, San Jose, CA (US); Eli Lusky, Ramat Gan (IL)

(73) Assignee: MONOLITHIC 3D INC., Klamath Falls, OR (US)

( * ) Notice: Subject to any disclaimer, the term of this patent is extended or adjusted under 35 U.S.C. 154(b) by 109 days.

(21) Appl. No.: 16/483,431

(22) PCT Filed: Feb. 3, 2018

(86) PCT No.: PCT/US2018/016759
§ 371 (c)(1),
(2) Date: Aug. 4, 2019

(87) PCT Pub. No.: WO2018/144957
PCT Pub. Date: Aug. 9, 2018

(65) Prior Publication Data
US 2020/0013791 A1   Jan. 9, 2020

Related U.S. Application Data

(60) Provisional application No. 62/625,961, filed on Feb. 2, 2018, provisional application No. 62/539,054, filed on Jul. 31, 2017, provisional application No. 62/531,880, filed on Jul. 13, 2017, provisional application No. 62/523,760, filed on Jun. 22, 2017, provisional application No. 62/517,959, filed on Jun. 11, 2017, provisional application No. 62/501,136, filed on May 4, 2017, provisional application No.
(Continued)

(51) Int. Cl.
| H01L 29/76 | (2006.01) |
| H01L 27/11556 | (2017.01) |
| H01L 21/28 | (2006.01) |
| H01L 27/11582 | (2017.01) |
| H01L 29/423 | (2006.01) |

(52) U.S. Cl.
CPC .. *H01L 27/11556* (2013.01); *H01L 27/11582* (2013.01); *H01L 29/40114* (2019.08); *H01L 29/40117* (2019.08); *H01L 29/42332* (2013.01); *H01L 29/42348* (2013.01)

(58) Field of Classification Search
None
See application file for complete search history.

(56) References Cited

U.S. PATENT DOCUMENTS

2017/0092655 A1\* 3/2017 Jung ................ H01L 27/1157
2019/0006014 A1\* 1/2019 Harari ............... H01L 29/7926

\* cited by examiner

*Primary Examiner* — Hung K Vu
(74) *Attorney, Agent, or Firm* — Power Patent; Bao Tran

(57) ABSTRACT

A 3D memory device, the device including: a first vertical pillar; a second vertical pillar, where the first vertical pillar and the second vertical pillar function as a source or a drain for a plurality of overlaying horizontally-oriented memory transistors, where the plurality of overlaying horizontally-oriented memory transistors are self-aligned being formed following the same lithography step; and memory control circuits, where the memory control circuits are disposed at least partially directly underneath the plurality of overlaying horizontally-oriented memory transistors, or are disposed at least partially directly above the plurality of overlaying horizontally-oriented memory transistors.

20 Claims, 49 Drawing Sheets

Vertical layer via process to connect SL and Source select gate of NAND cell and logic.

Related U.S. Application Data

62/488,757, filed on Apr. 22, 2017, provisional application No. 62/484,284, filed on Apr. 11, 2017, provisional application No. 62/473,308, filed on Mar. 17, 2017, provisional application No. 62/468,372, filed on Mar. 8, 2017, provisional application No. 62/454,785, filed on Feb. 4, 2017.

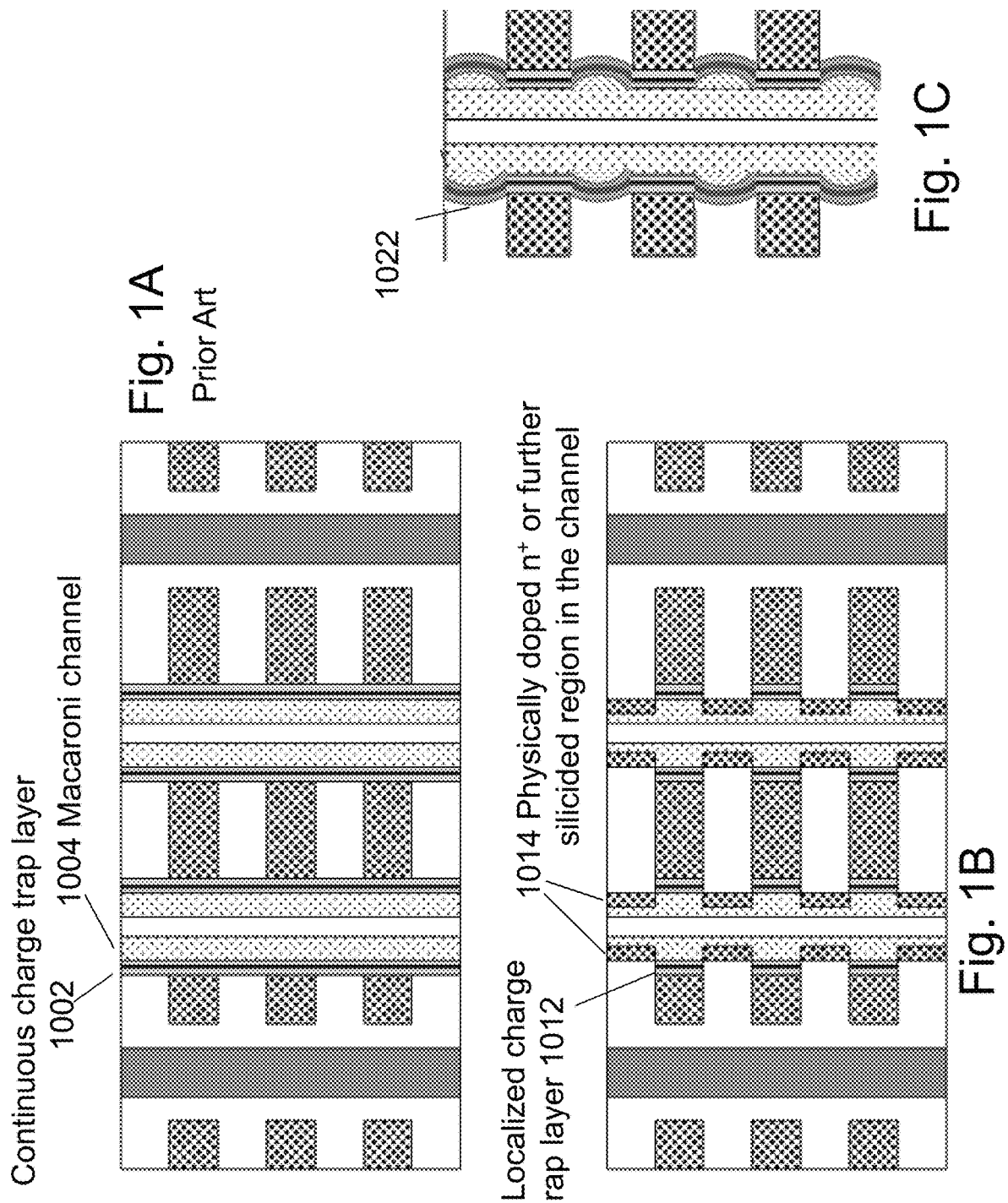

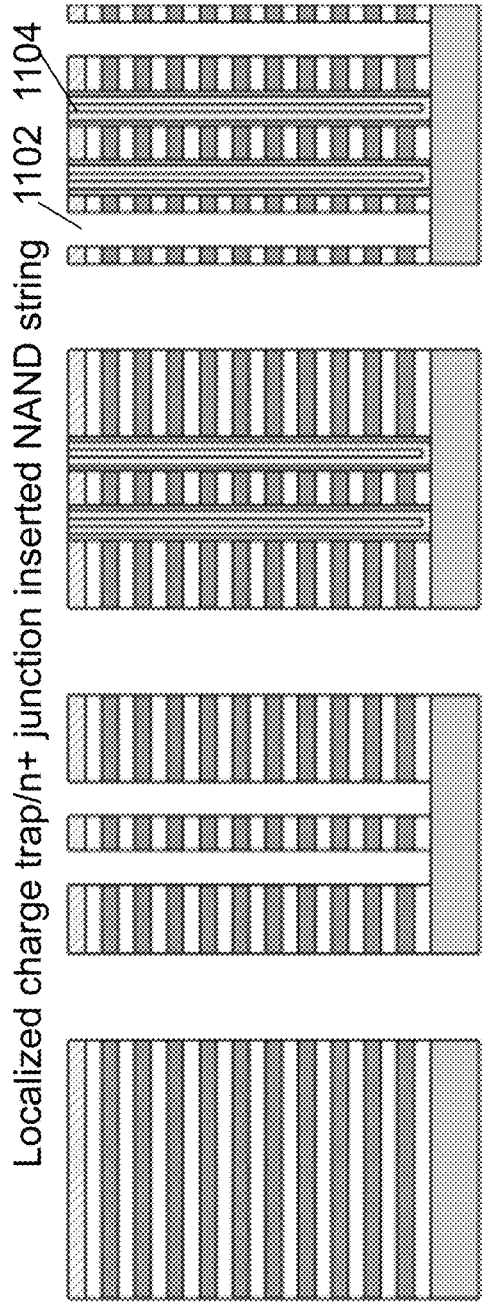
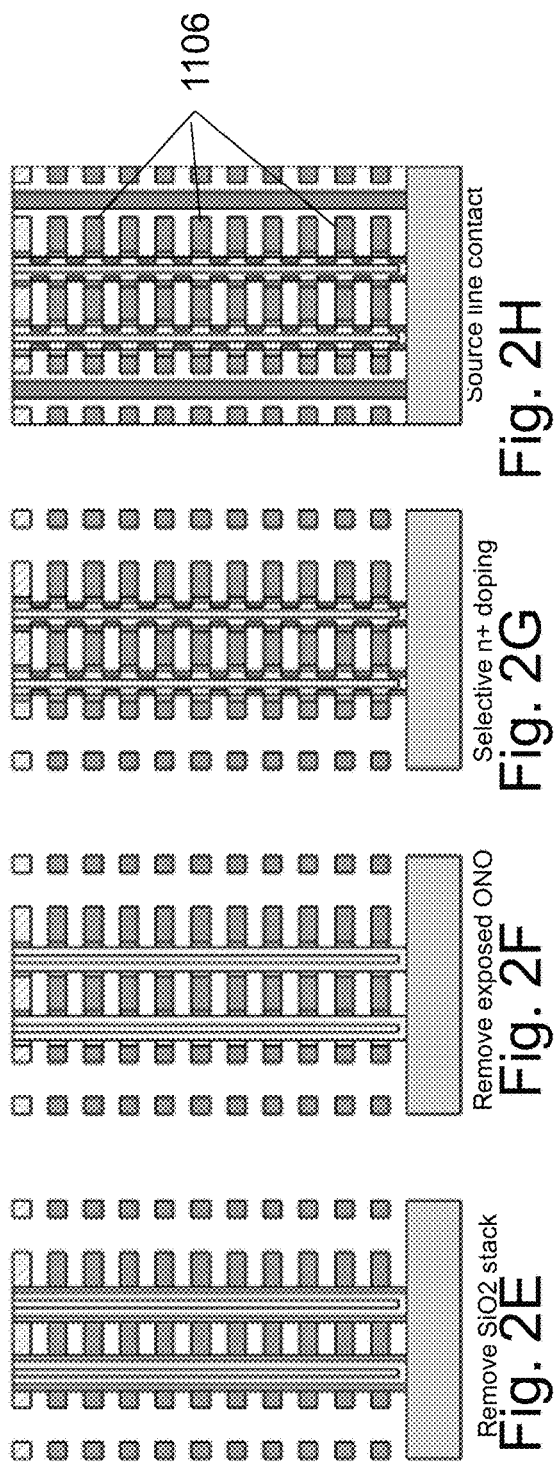

SiO2/Nitride stack
Vertical hole for channel

Poly channel fill

Vertical hole for source contact
Nitride removal

ONO fill

Metal gate fill

Remove exposed ONO and SiO2 stack

Selective n+ doping and/or Silicidation on exposed polysilicon

SiO2 fill and source line contact

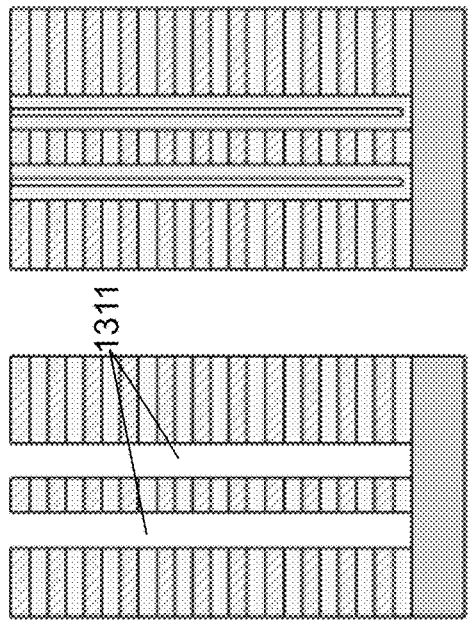
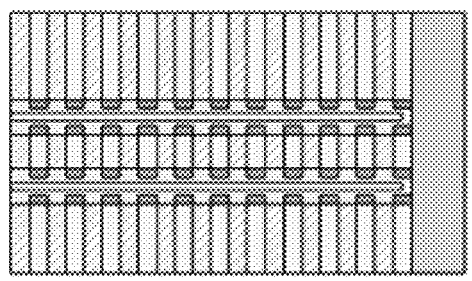
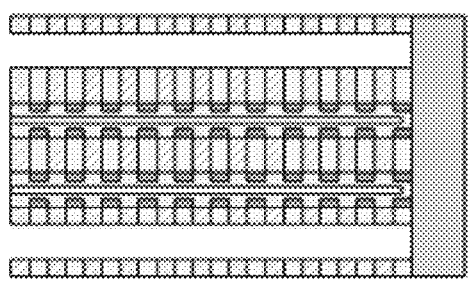
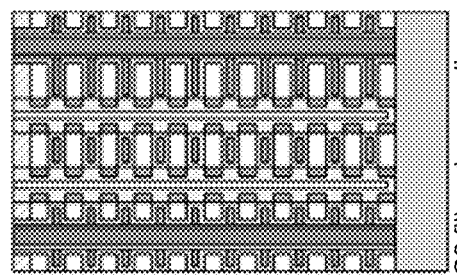
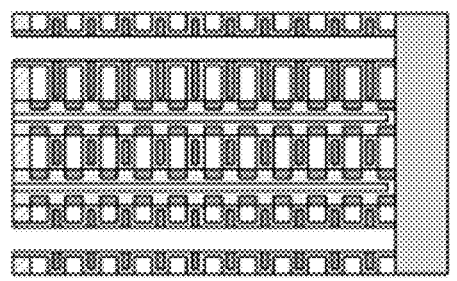
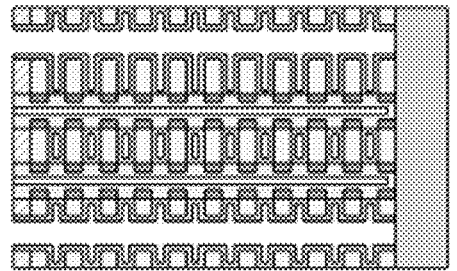
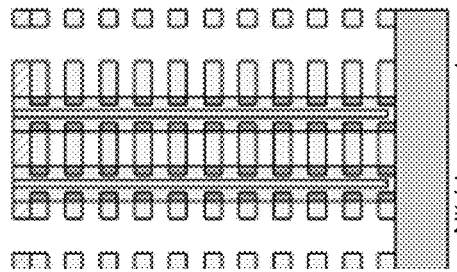

Wordline staircase etch for V-NAND
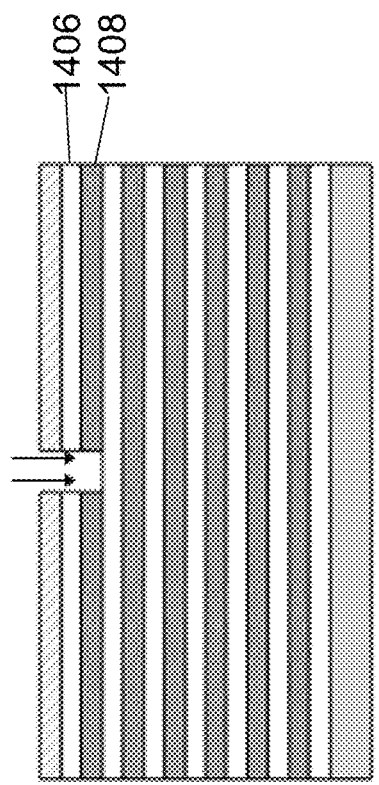
Fig. 5A  Hard mark opening
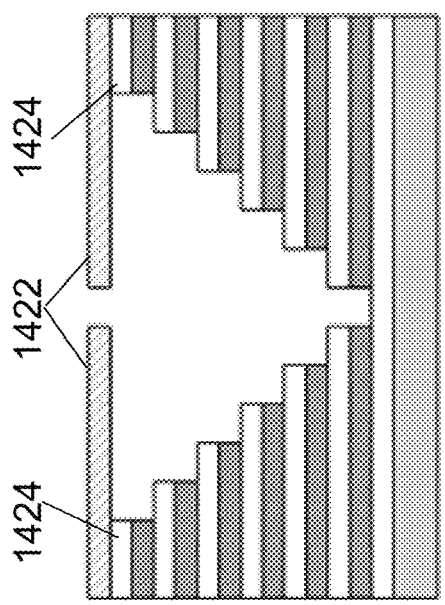
Fig. 5B  Anisotropic SiO2/poly etch
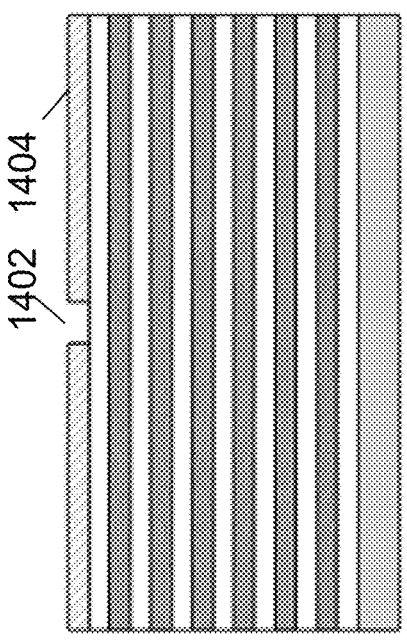
Fig. 5C  Isotropic SiO2/poly etch
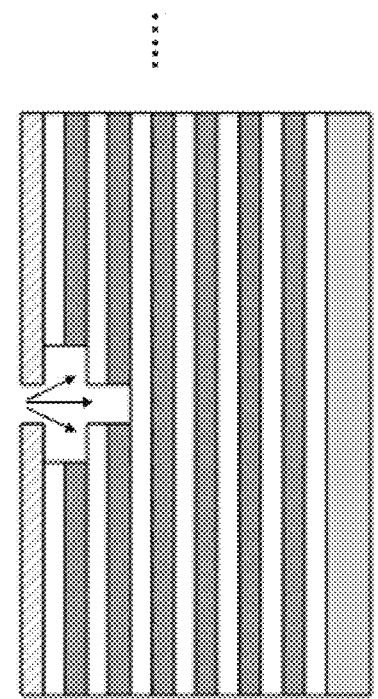
Fig. 5D  Repeat Anisotropic and Isotropic SiO2/poly etch

Prior art of V-NAND
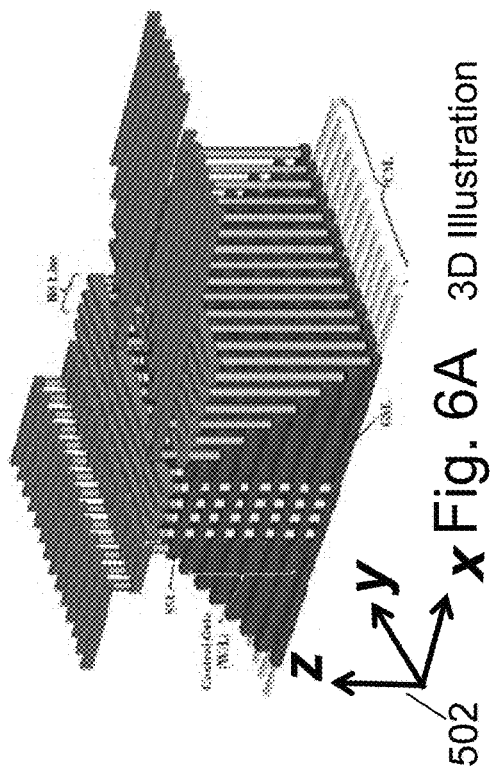
Fig. 6A 3D Illustration
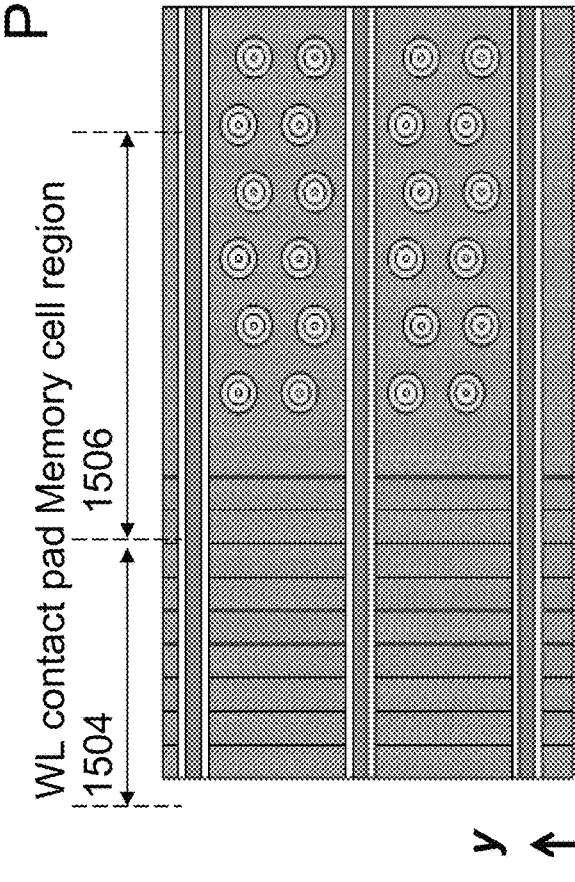
Fig. 6B XY-cut
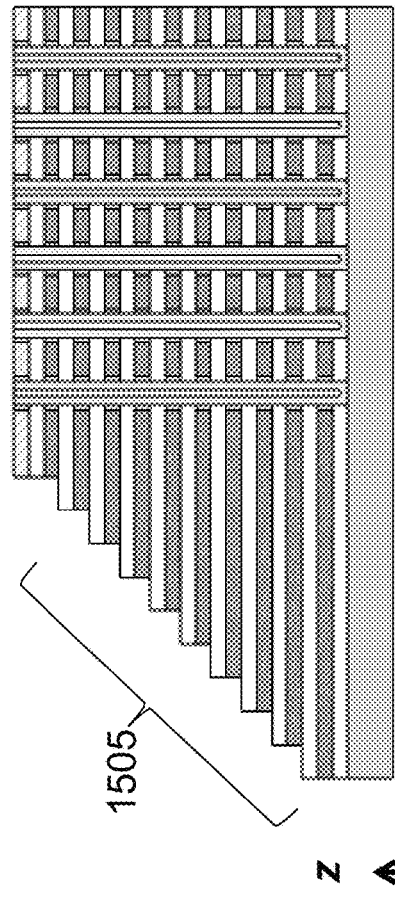
Fig. 6C YZ-cut
Fig. 6D XZ-cut

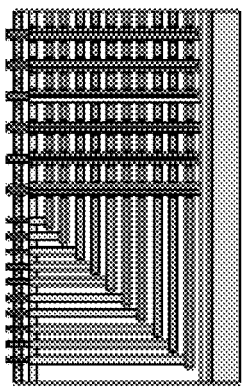
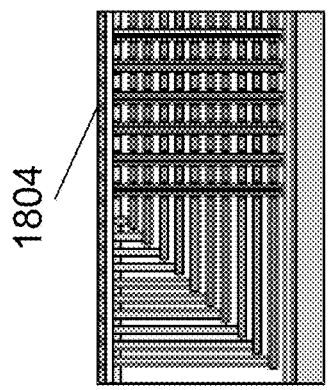
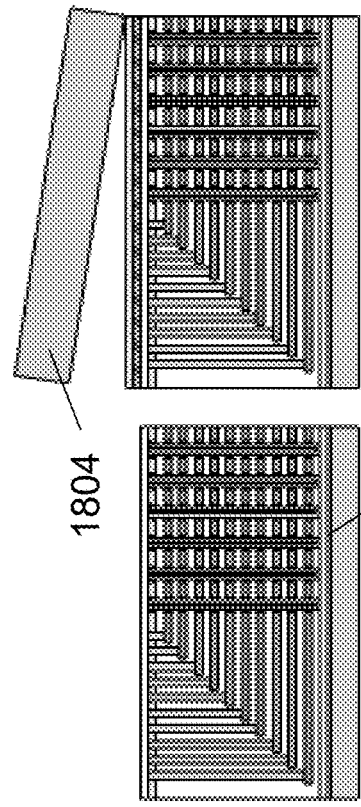

V-NAND cell only on 1802 cut-able substrate

Fig. 9A

Transfer the layer of processed logic or silicon film to be processed

Fig. 9B

Post-process as necessary such as local interconnect.

Fig. 9C

Vertical layer via process to connect WL, BL, Bitline select gate of NAND cell and logic.

Fig. 9D

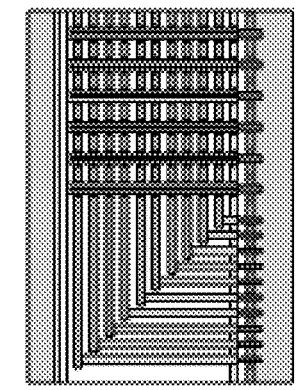
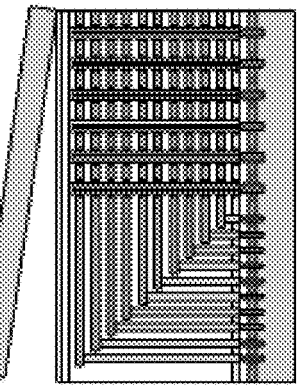
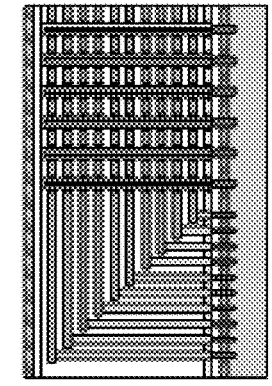
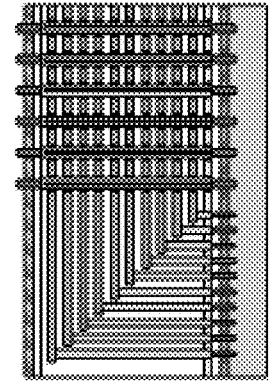

- Flip and bond to carrier substrate,

Fig. 9E

- Remove NAND cell cut-able substrate

Fig. 9F

Transfer the layer of processed logic or silicon film to be processed

Fig. 9G

Vertical layer via process to connect SL and Source select gate of NAND cell and logic.

Fig. 9H

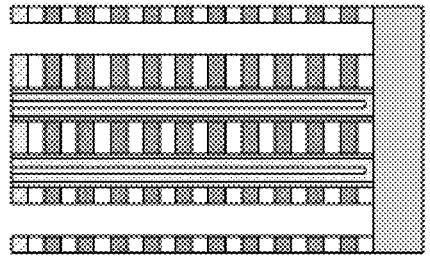
Fig. 10A SiO2/Gate-1 stack
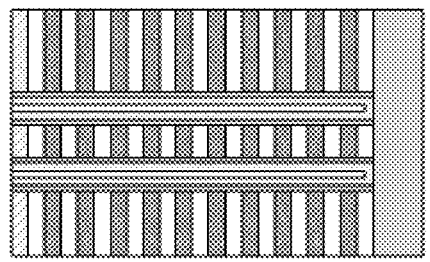
Fig. 10B Vertical hole for channel
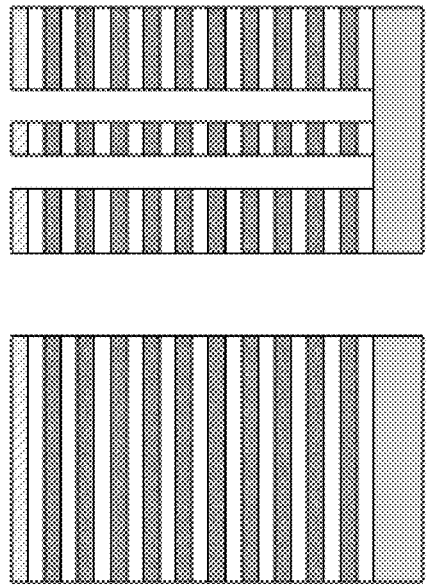
Fig. 10C ONO-1/poly channel fill
Fig. 10D Vertical hole for source contact
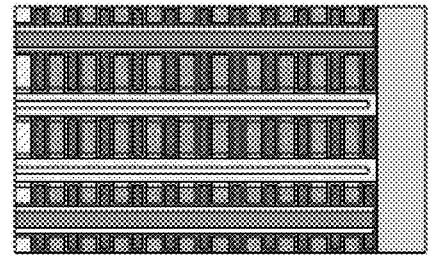
Fig. 10E Remove SiO2 stack
Fig. 10F Remove exposed ONO
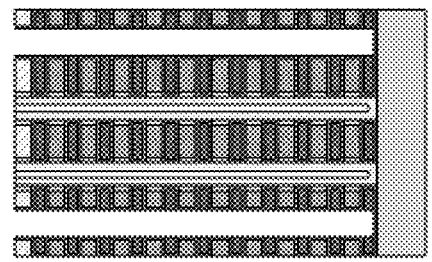
Fig. 10G ONO-2/Gate-2 fill
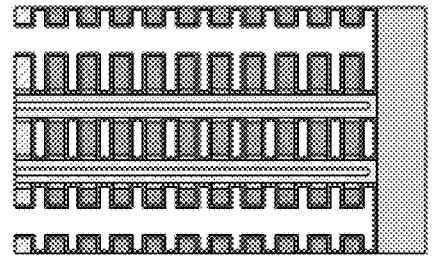
Fig. 10H Source line contact

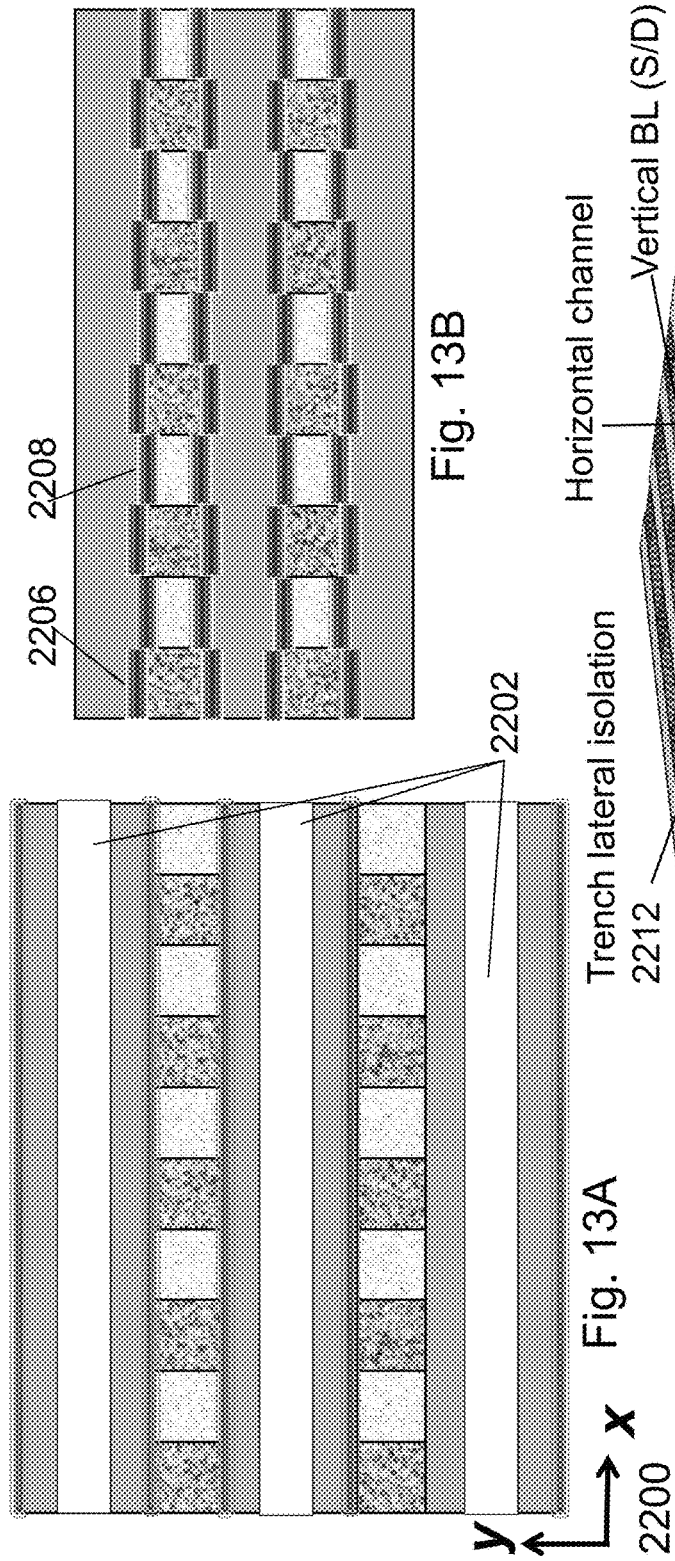
Fig. 13A
Fig. 13B
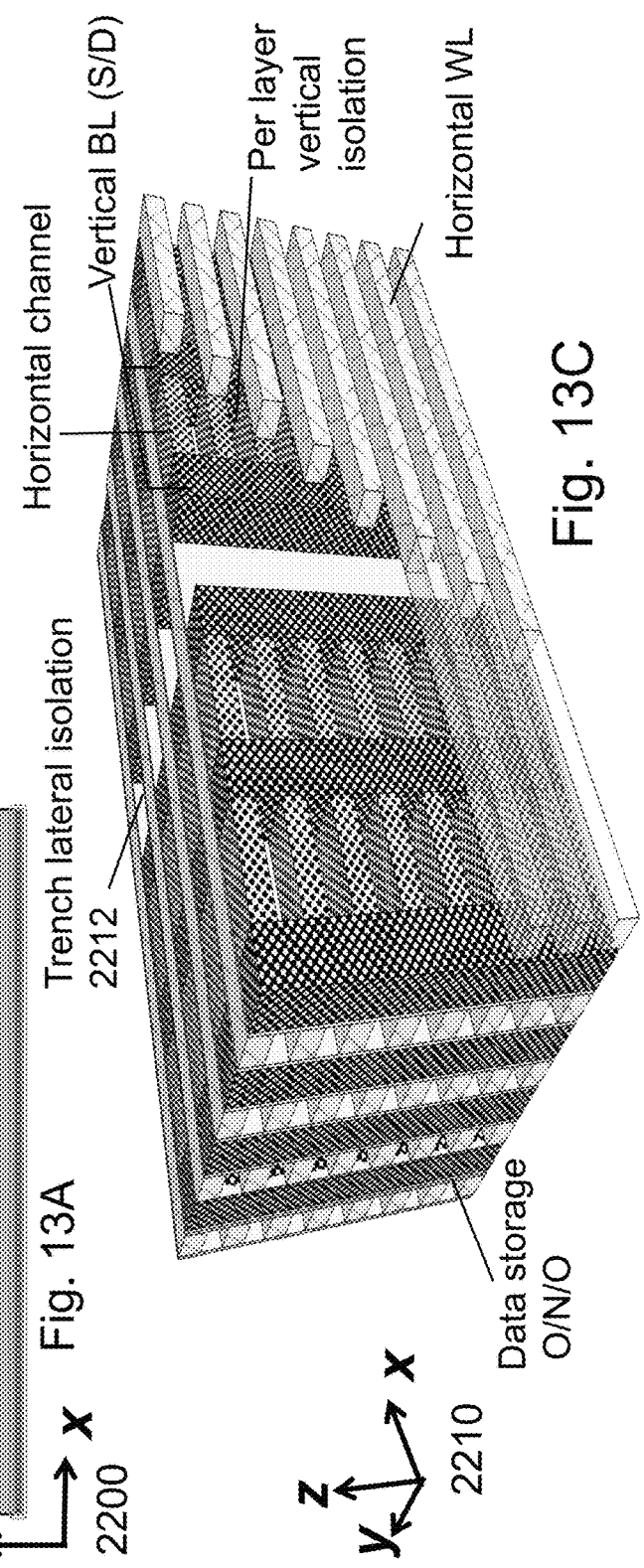
Fig. 13C

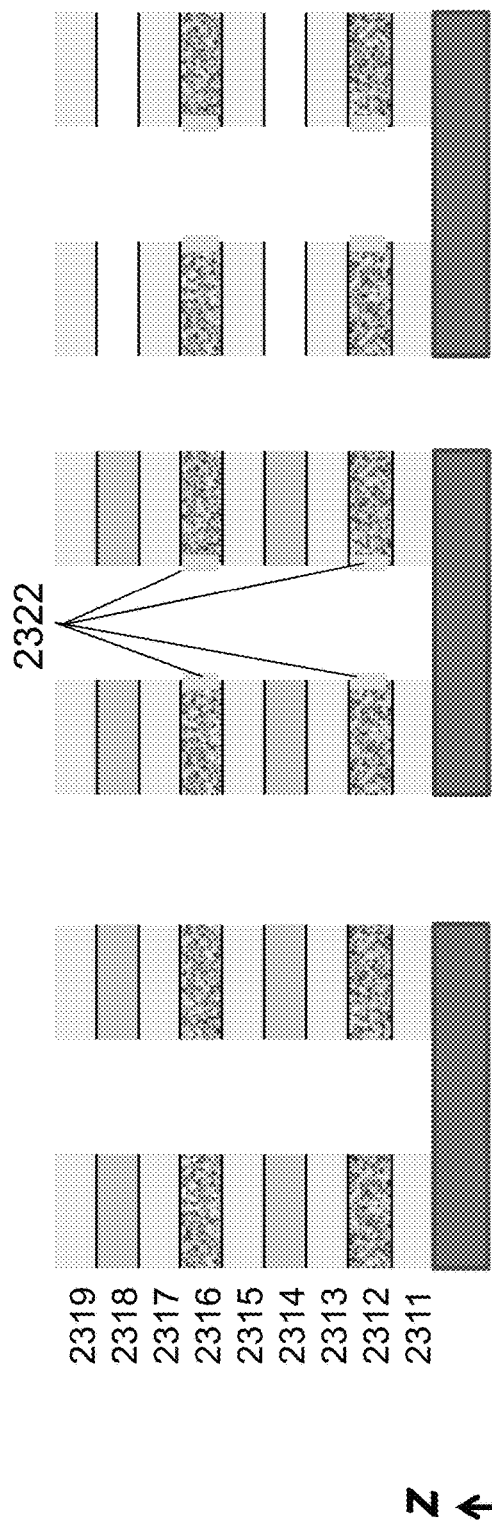
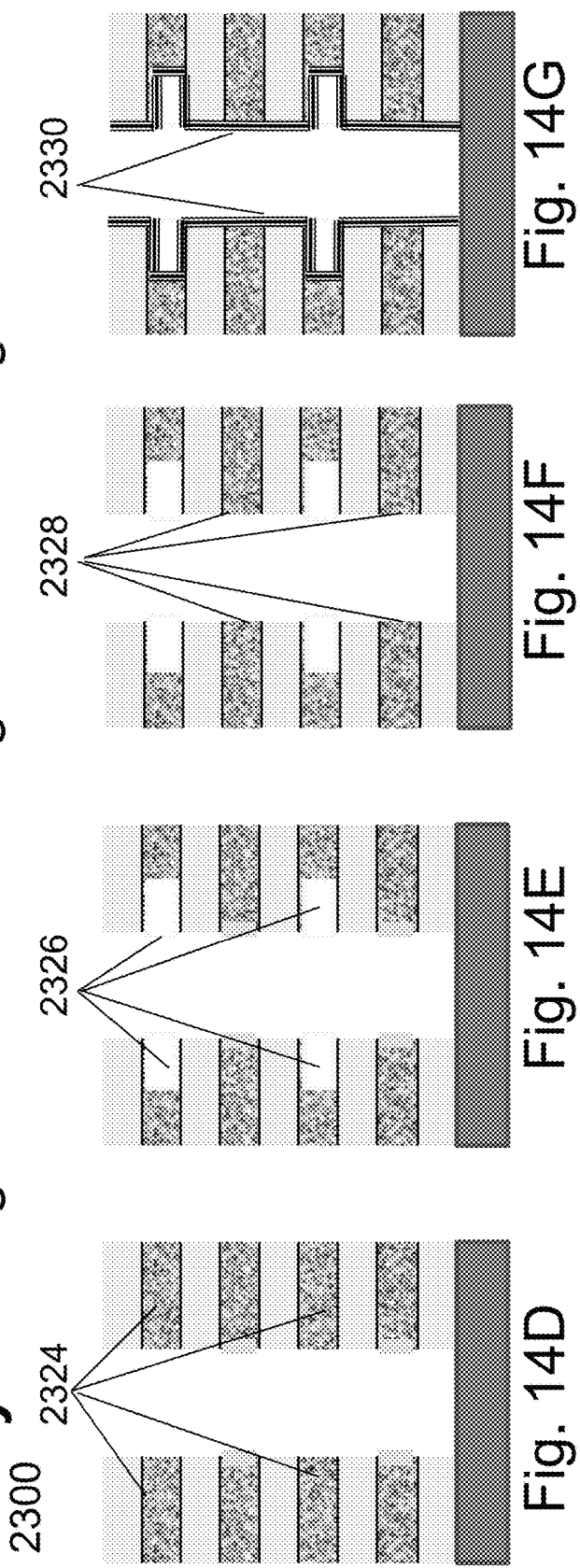

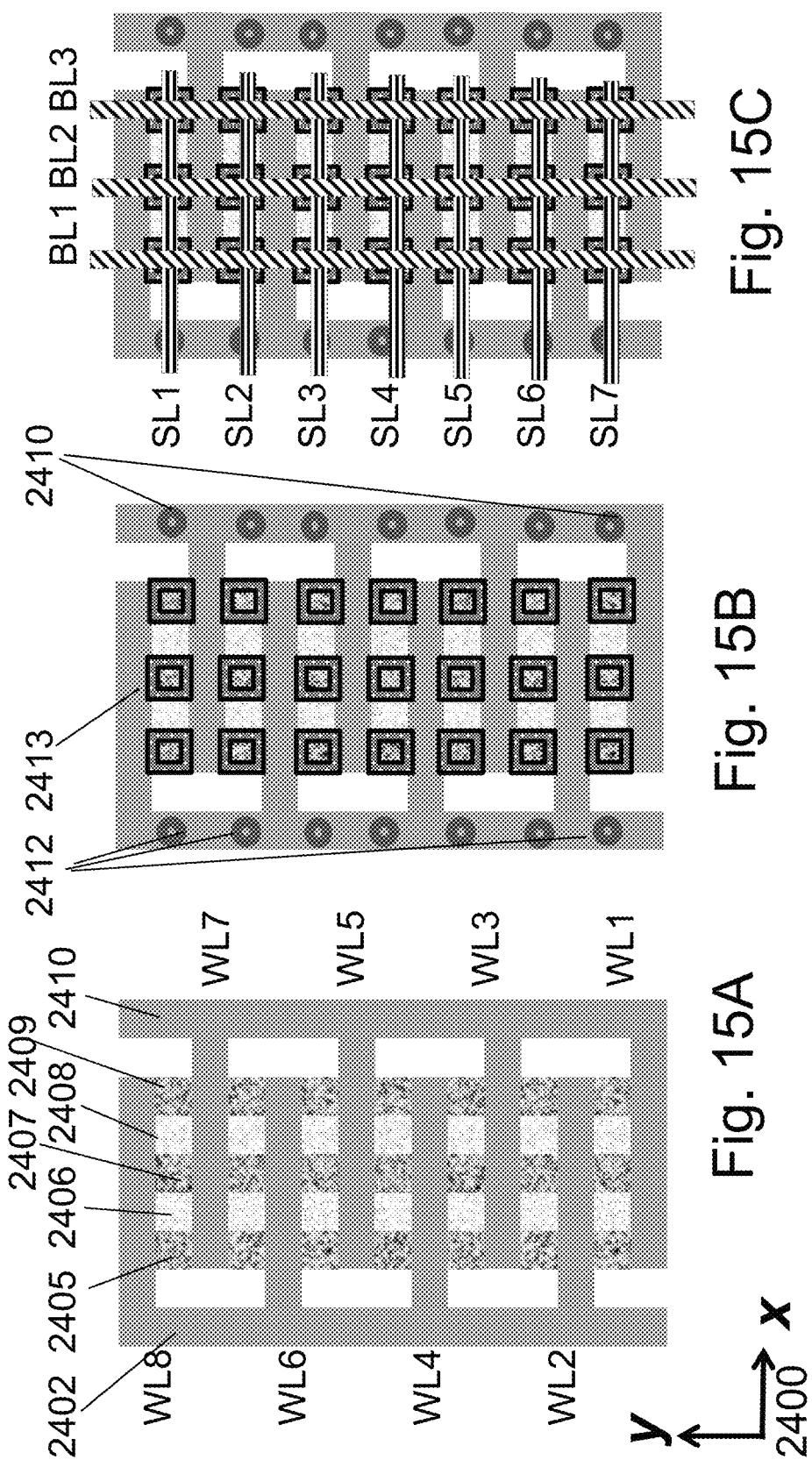

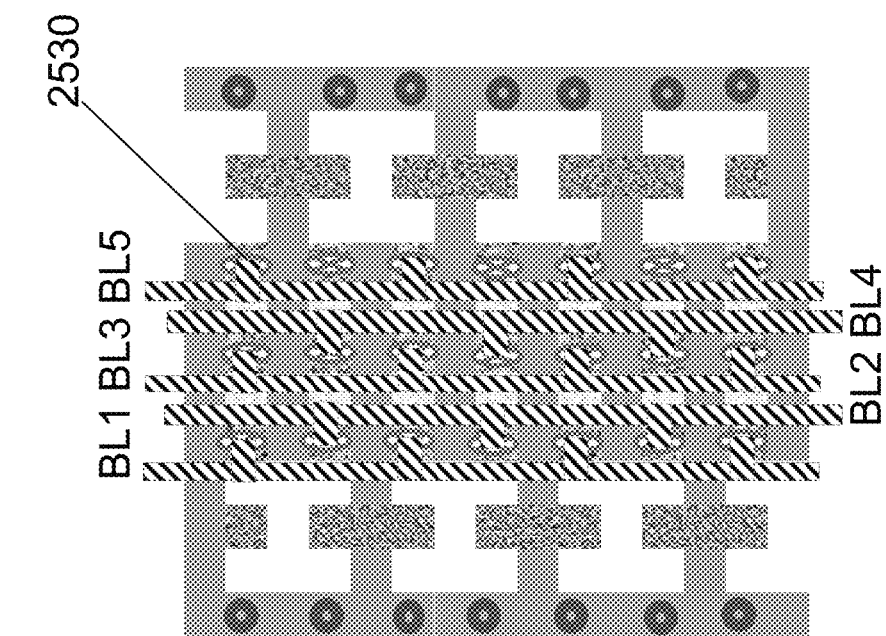
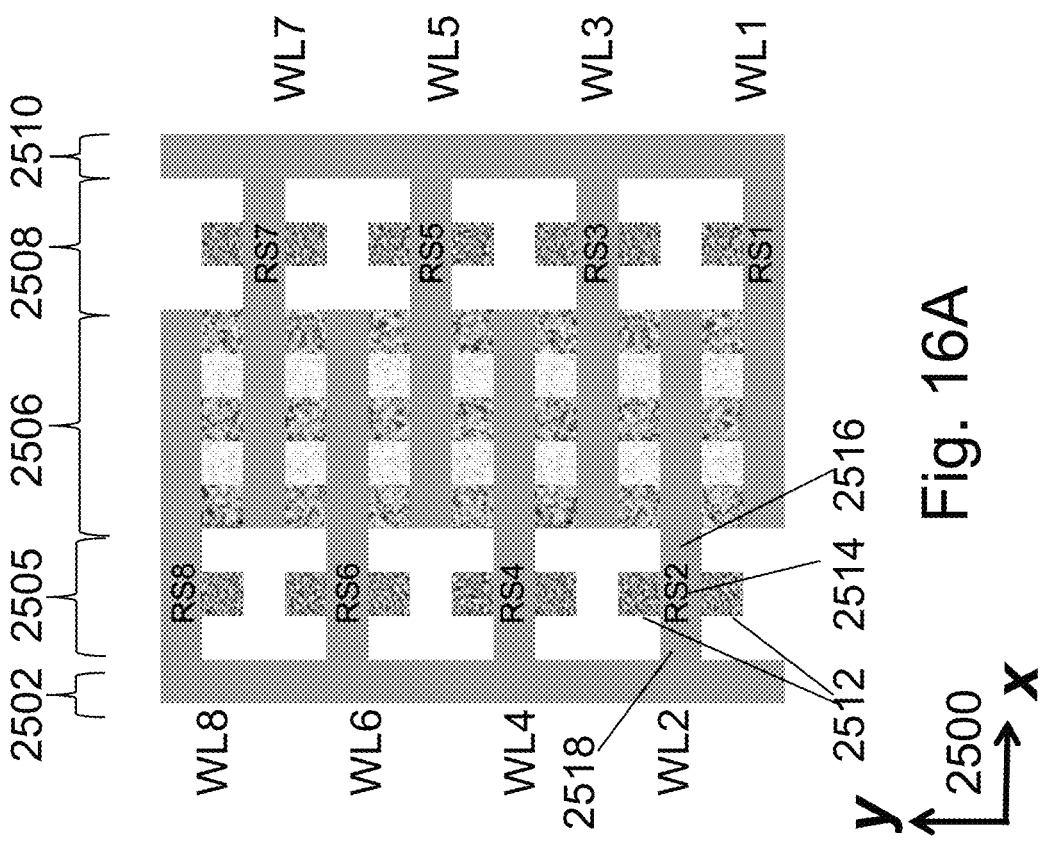
Fig. 16B
Fig. 16A

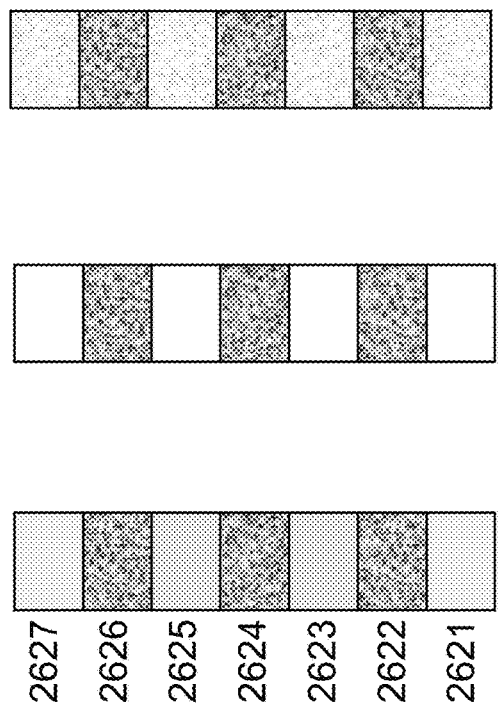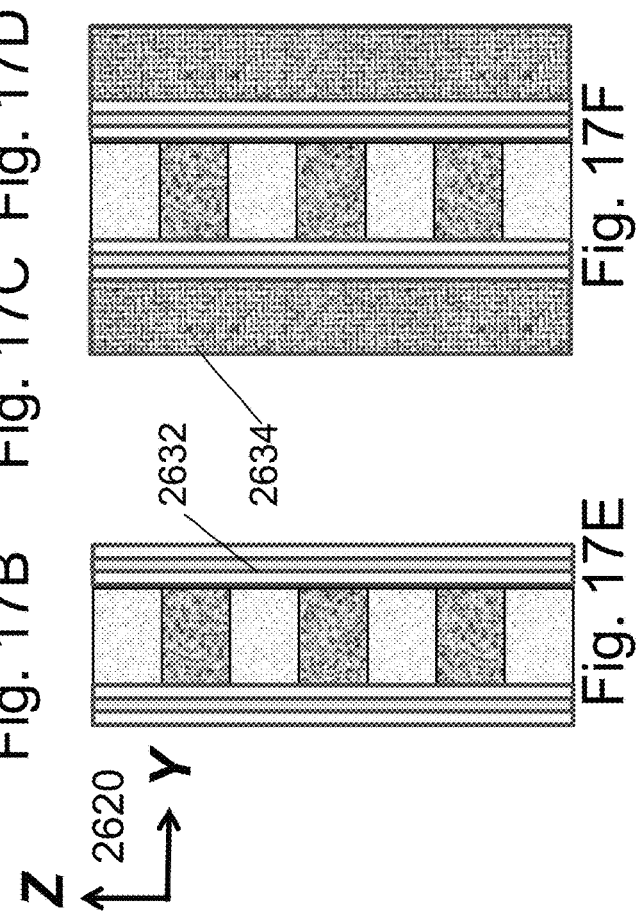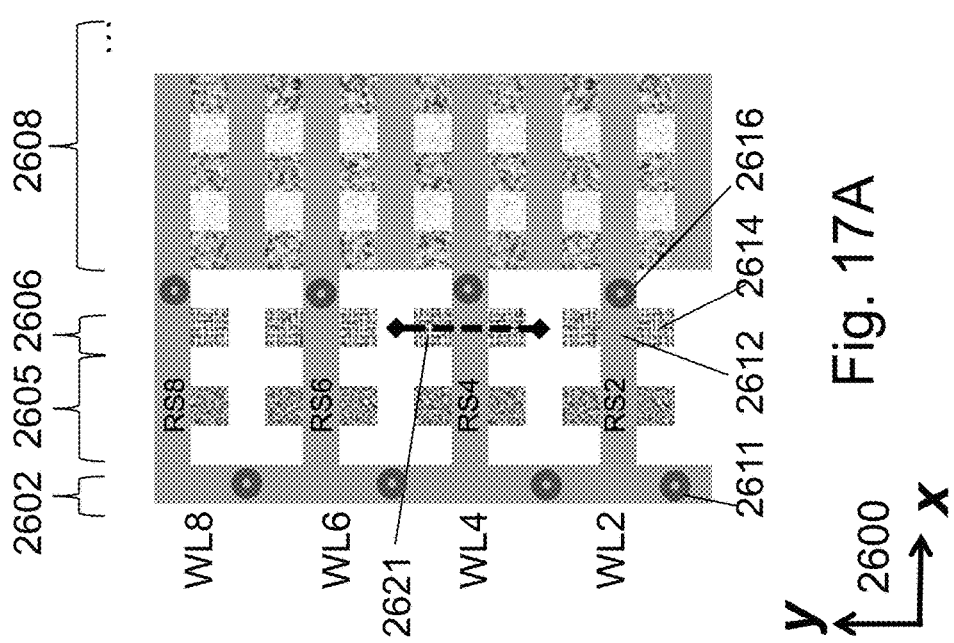

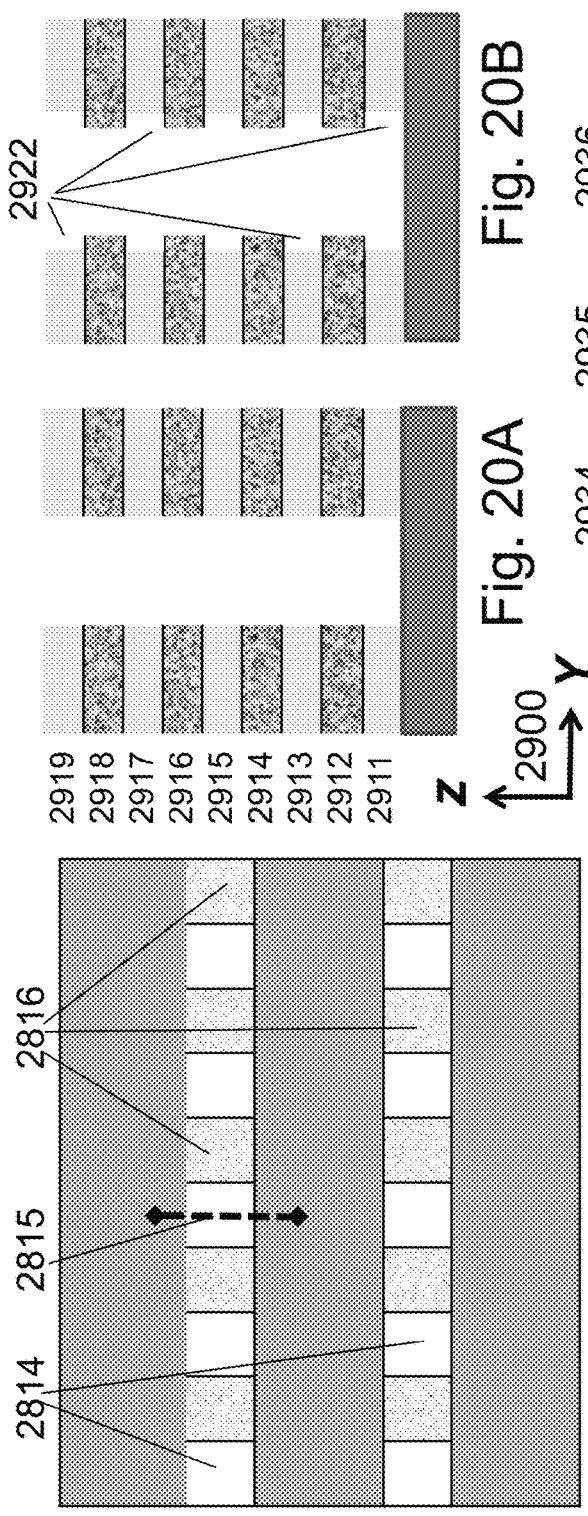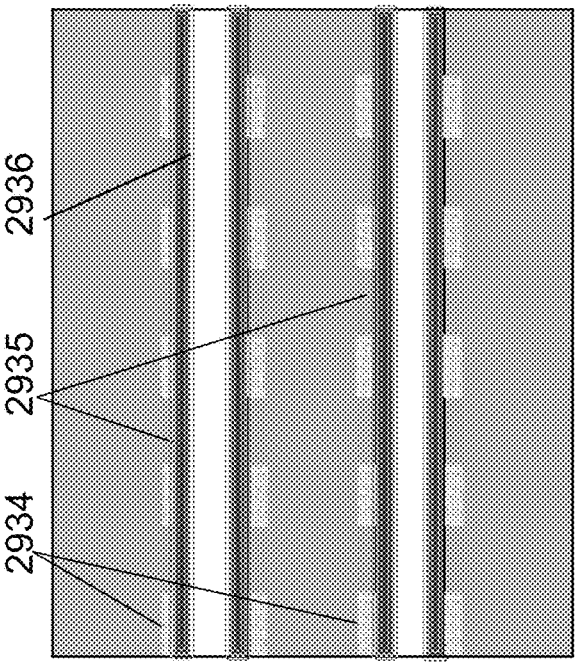

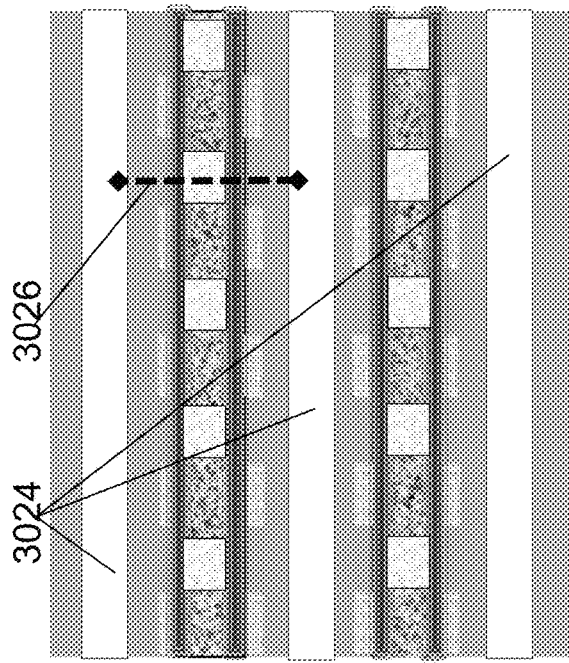
Fig. 21A
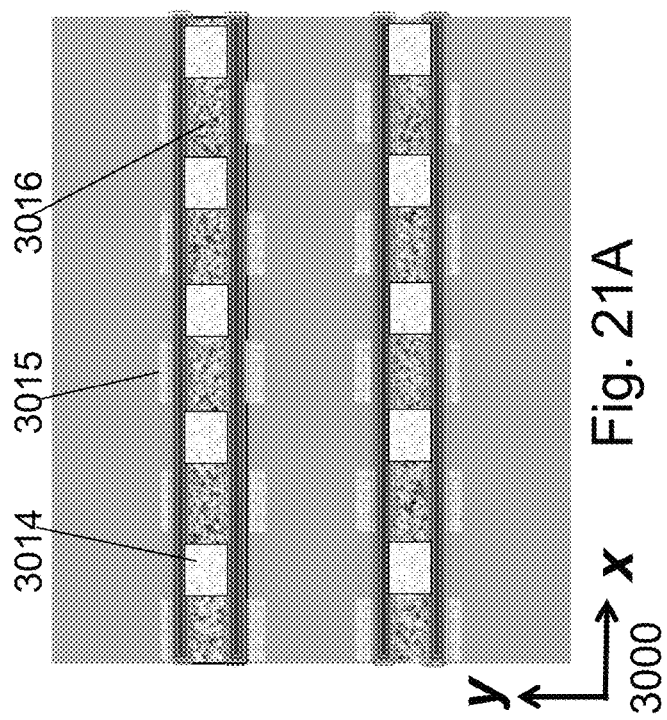
Fig. 21B
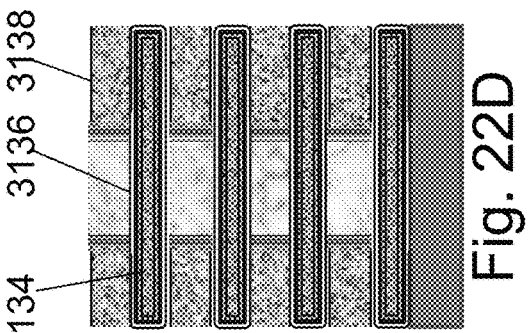
Fig. 22A
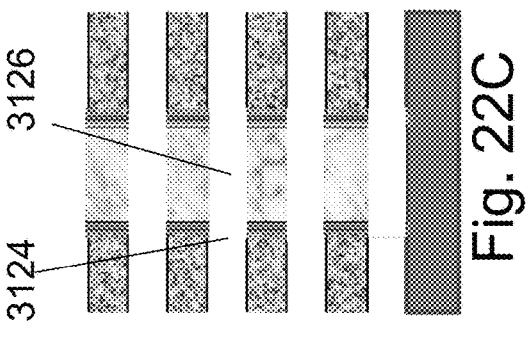
Fig. 22B
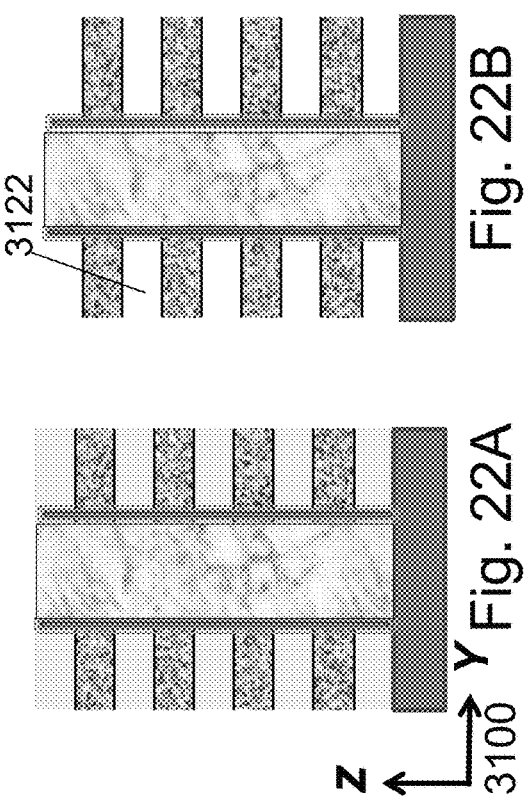
Fig. 22C
Fig. 22D

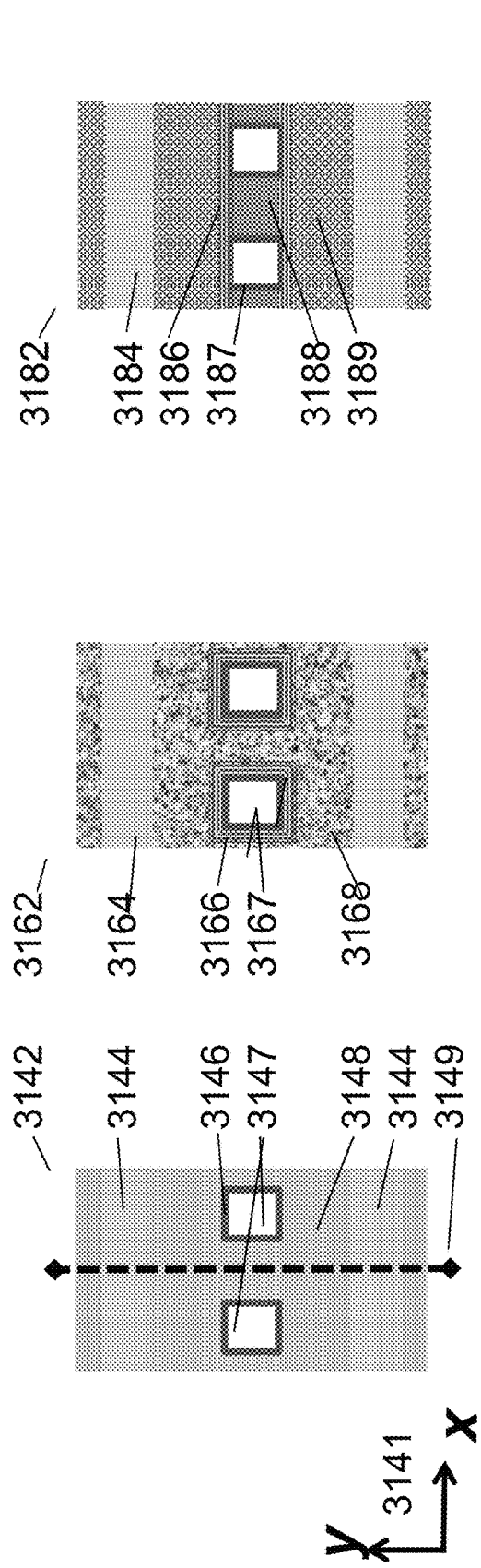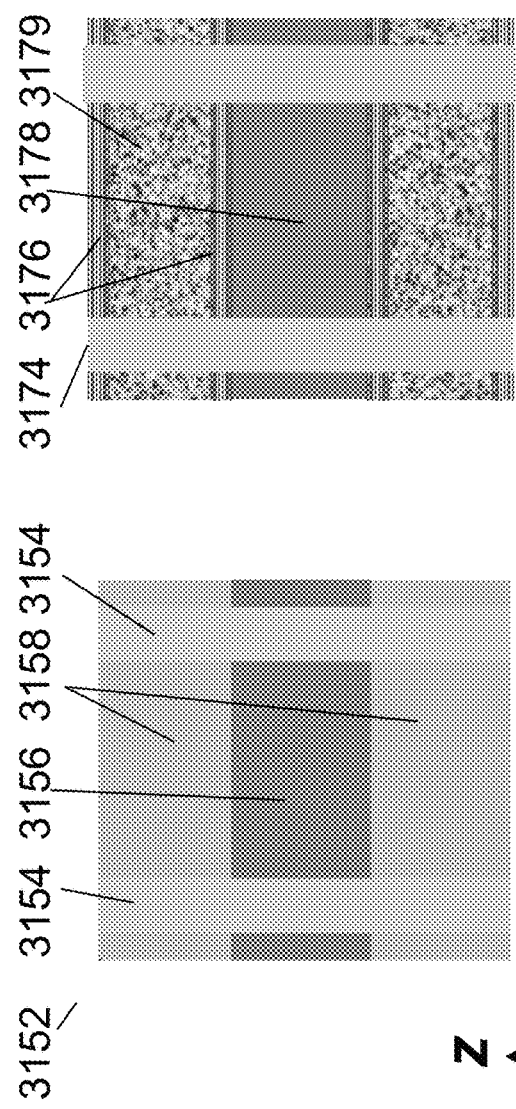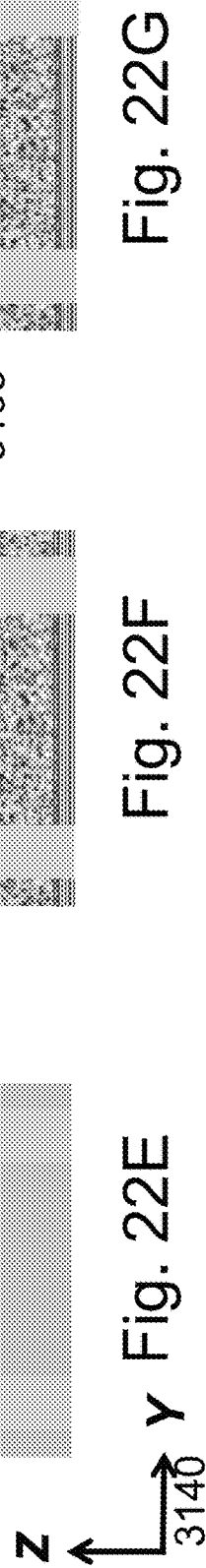
Fig. 22G
Fig. 22F
Fig. 22E

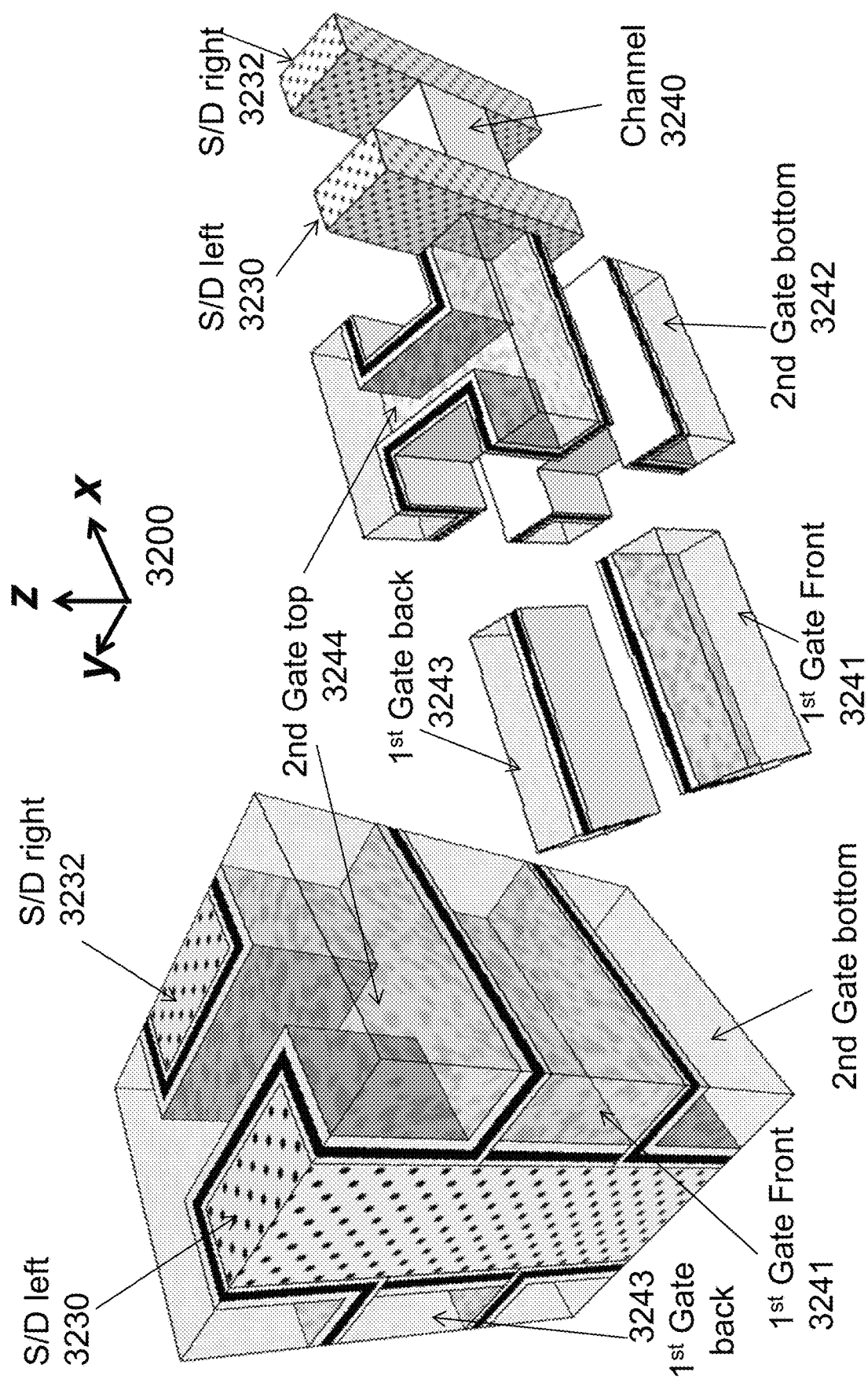

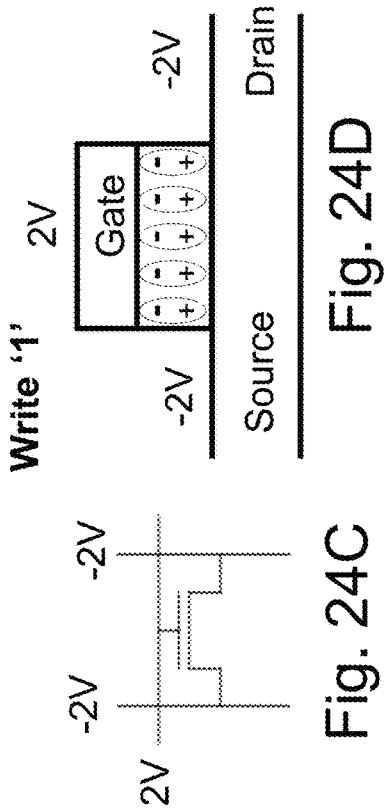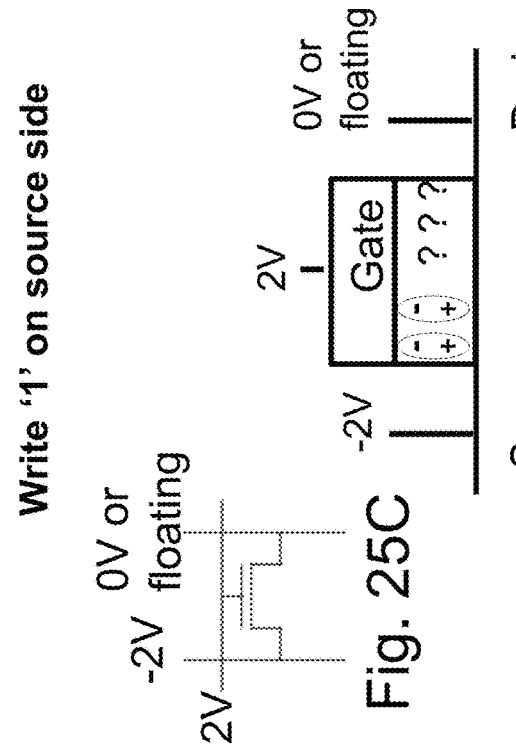
Fig. 24A Single-bit writing
Fig. 24B Write '0'
Fig. 24C
Fig. 24D Write '1'
Mirror-bit writing
Fig. 25A Write '0' on source side
Fig. 25B
Fig. 25C Write '1' on source side
Fig. 25D
Analogues for drain side writing by swapping source and drain

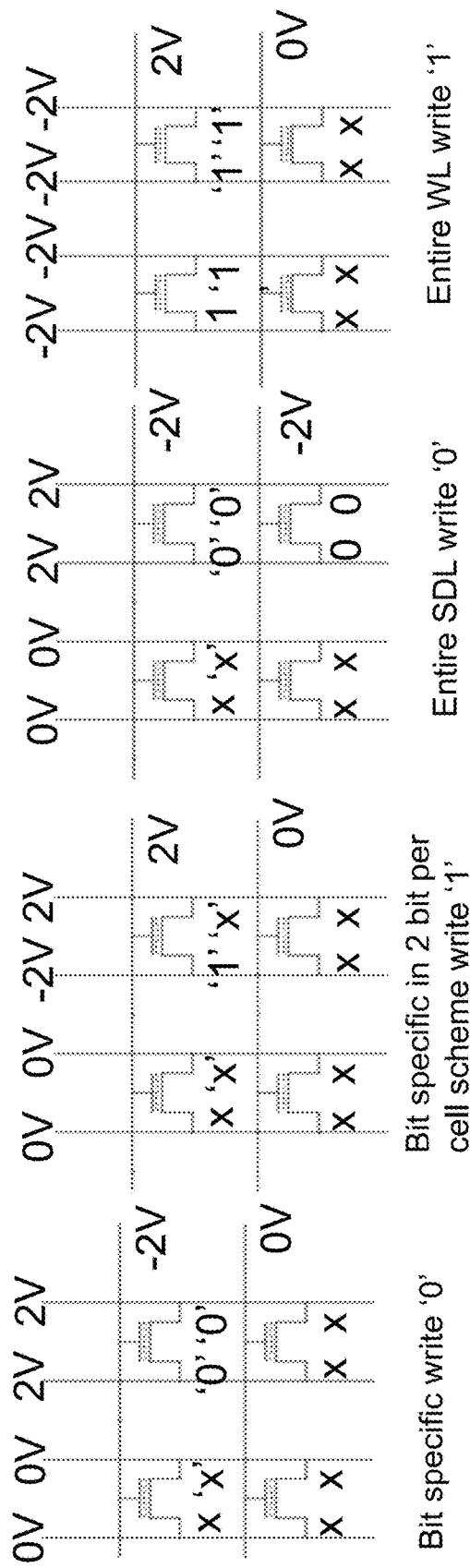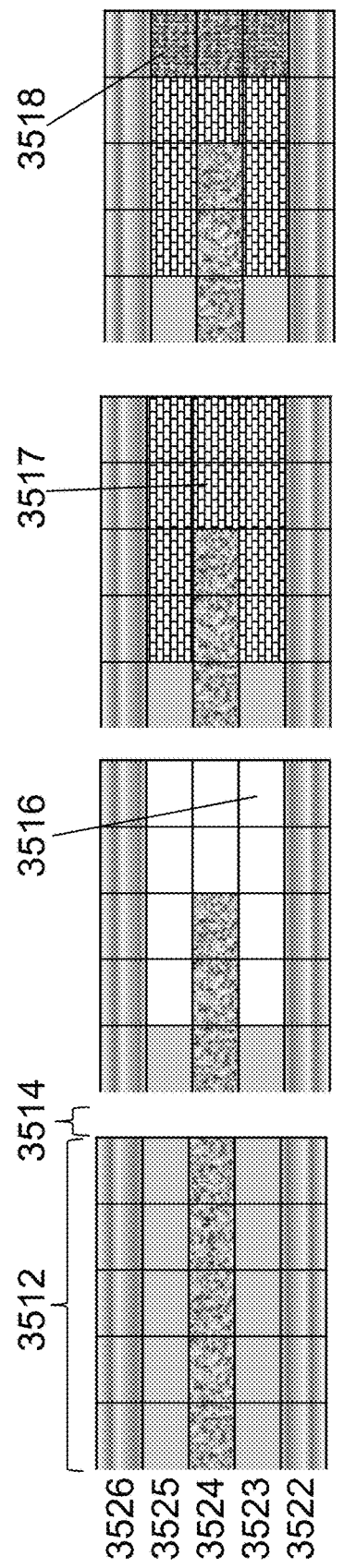

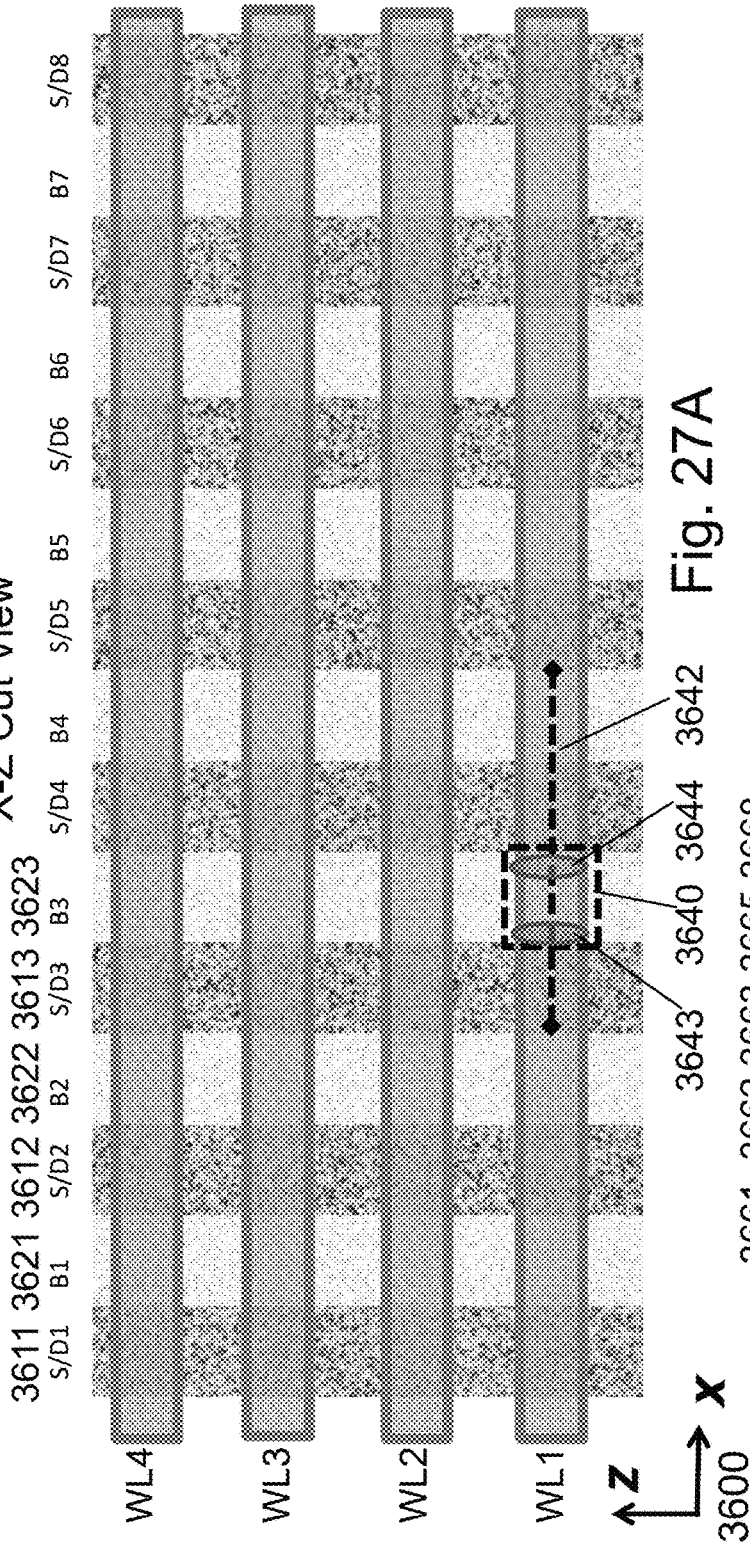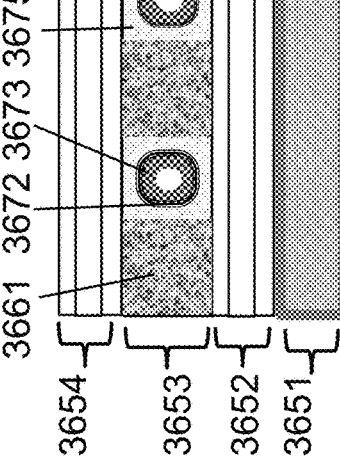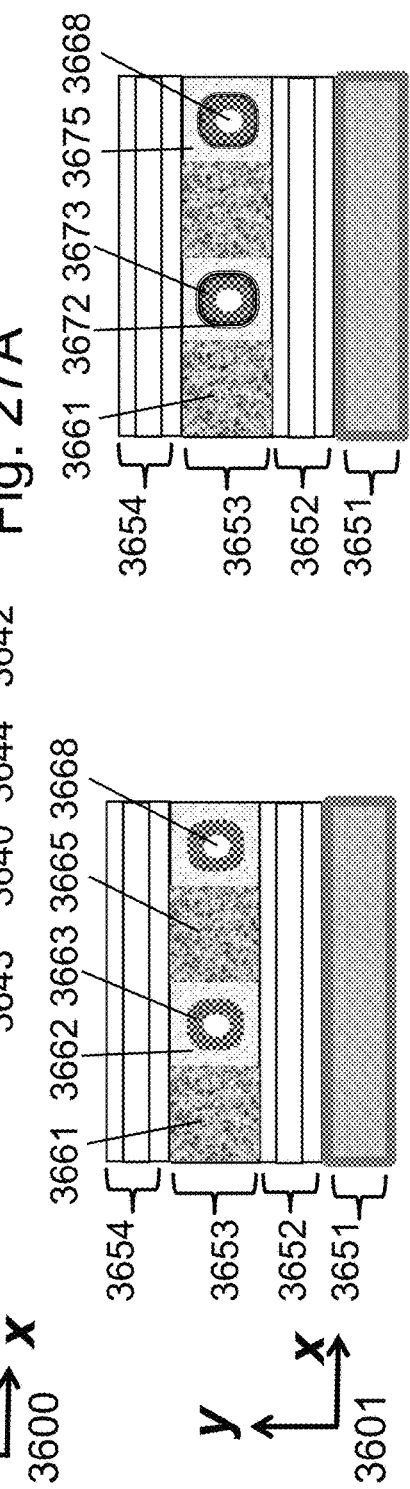
Fig. 27A
Fig. 27B
Fig. 27C

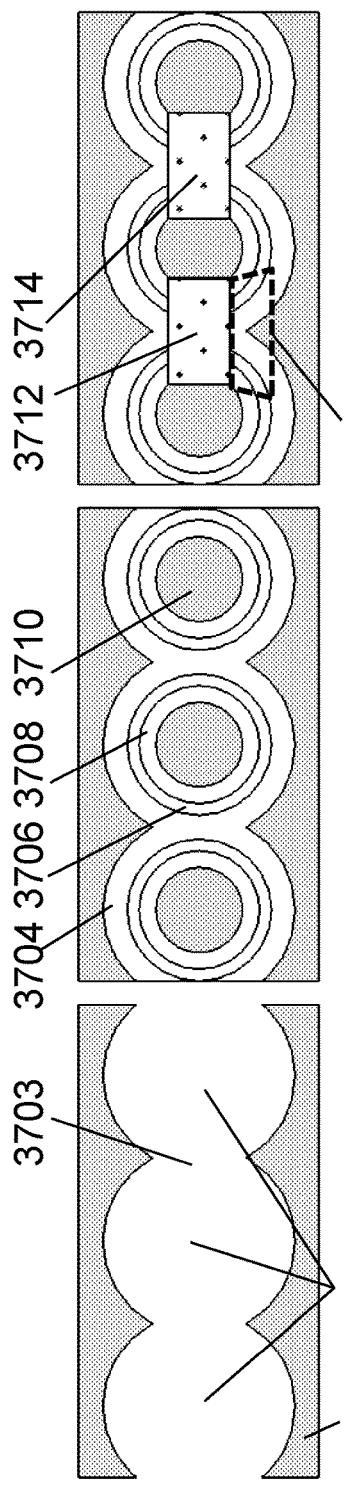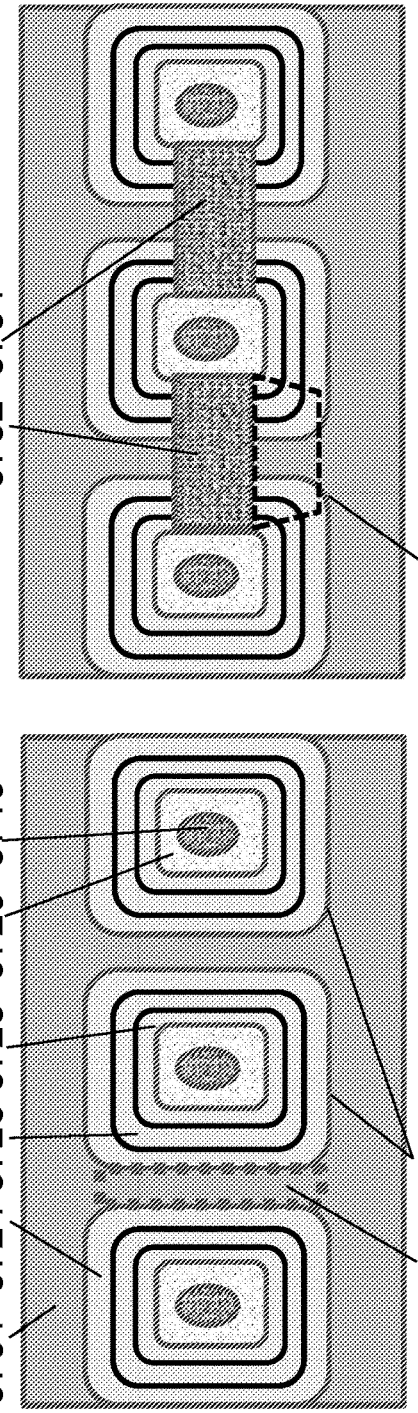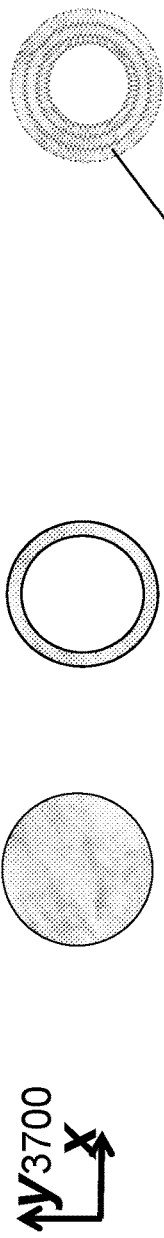

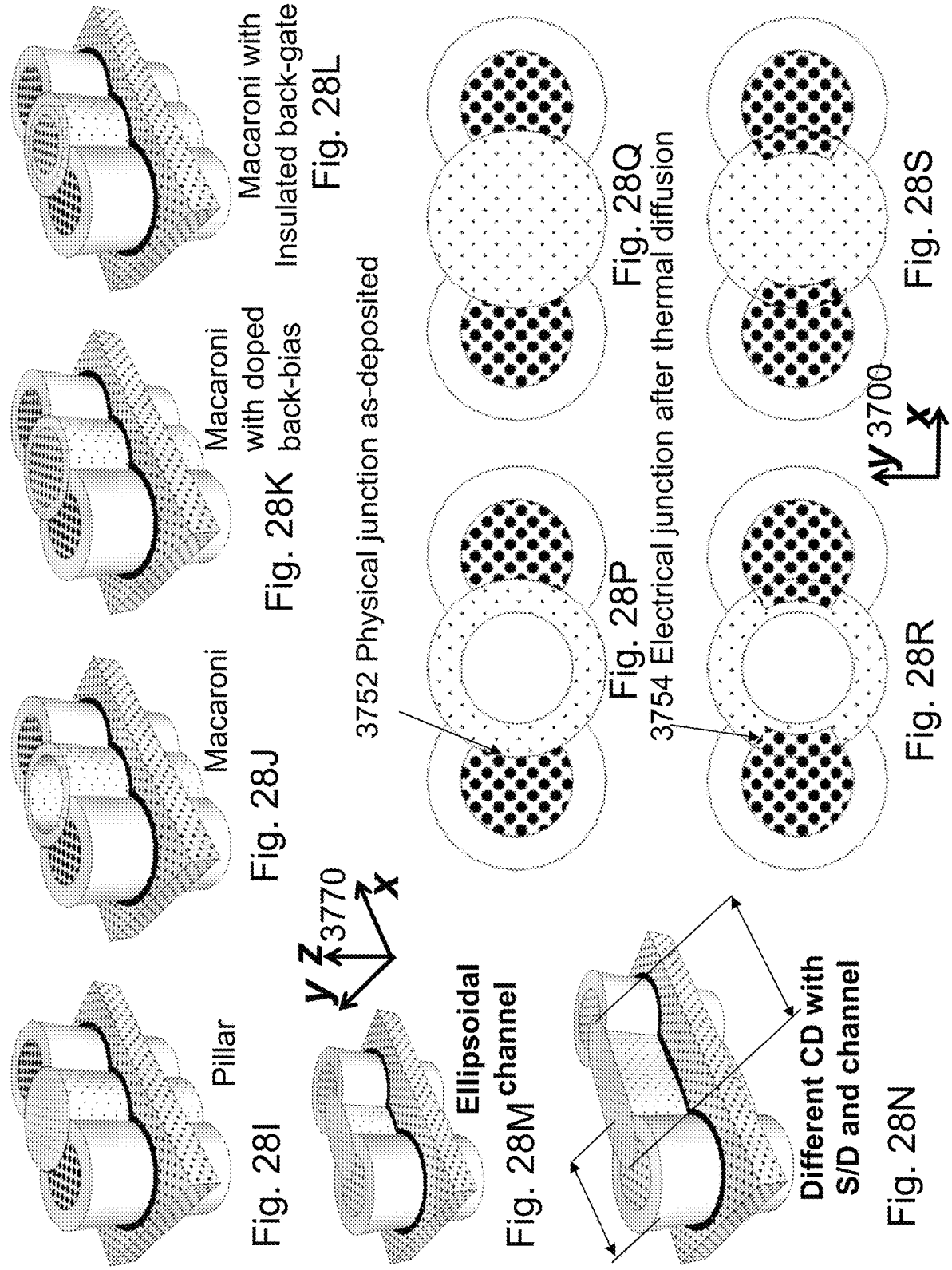

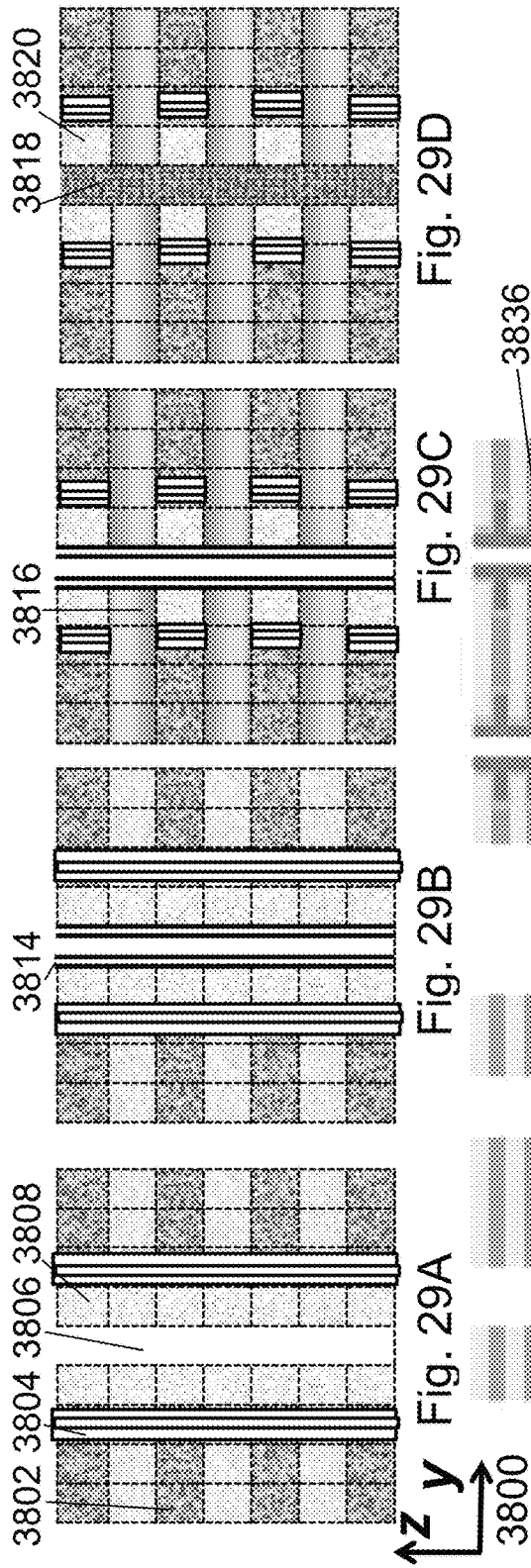
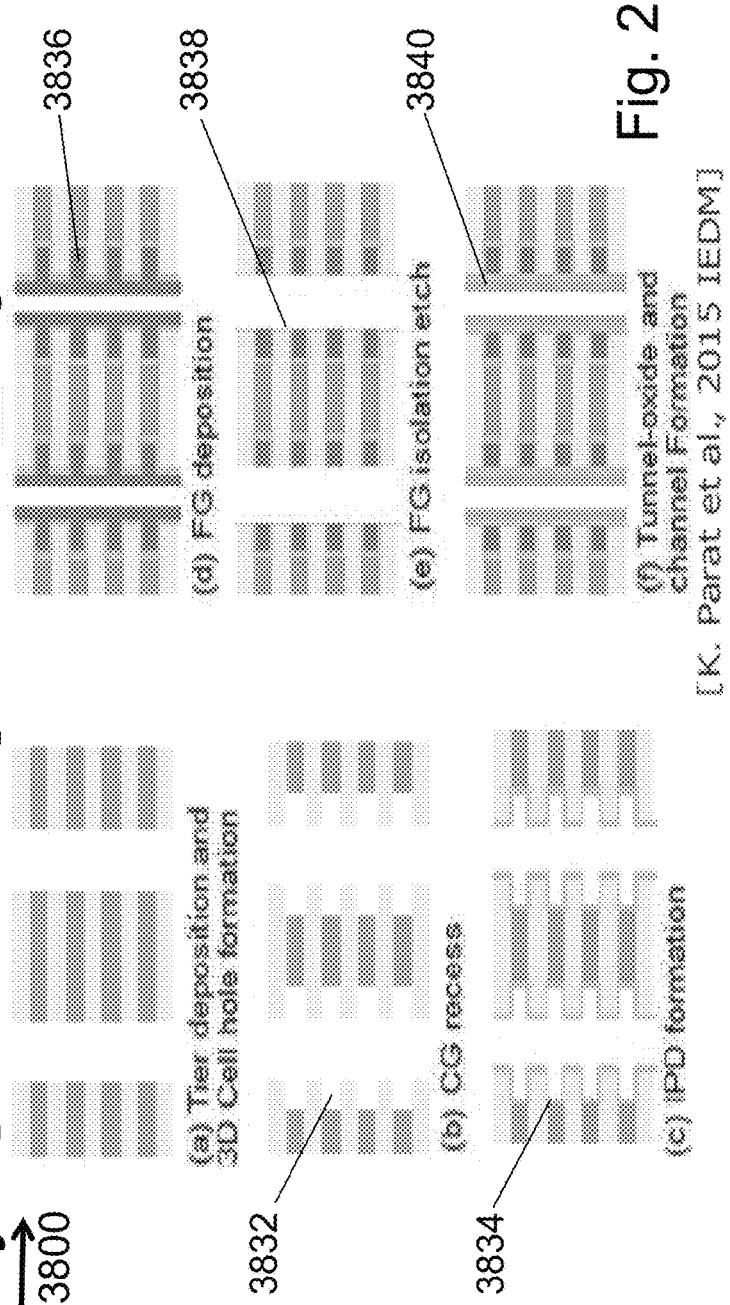

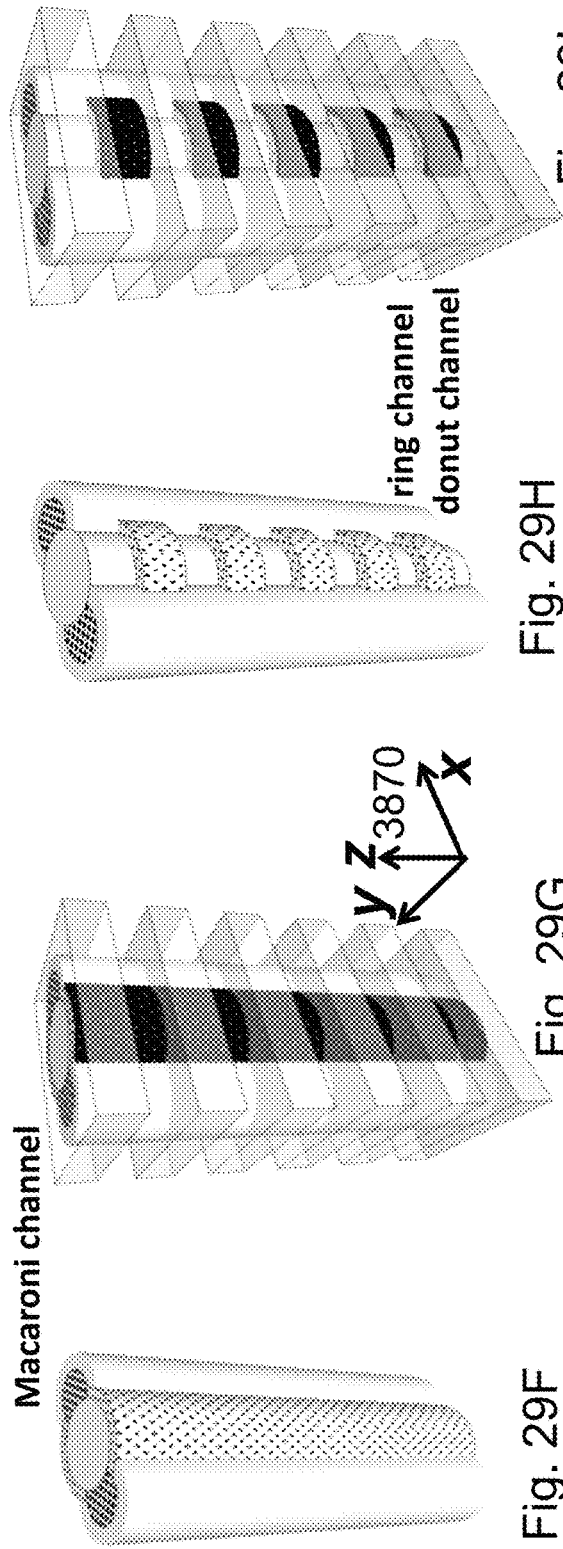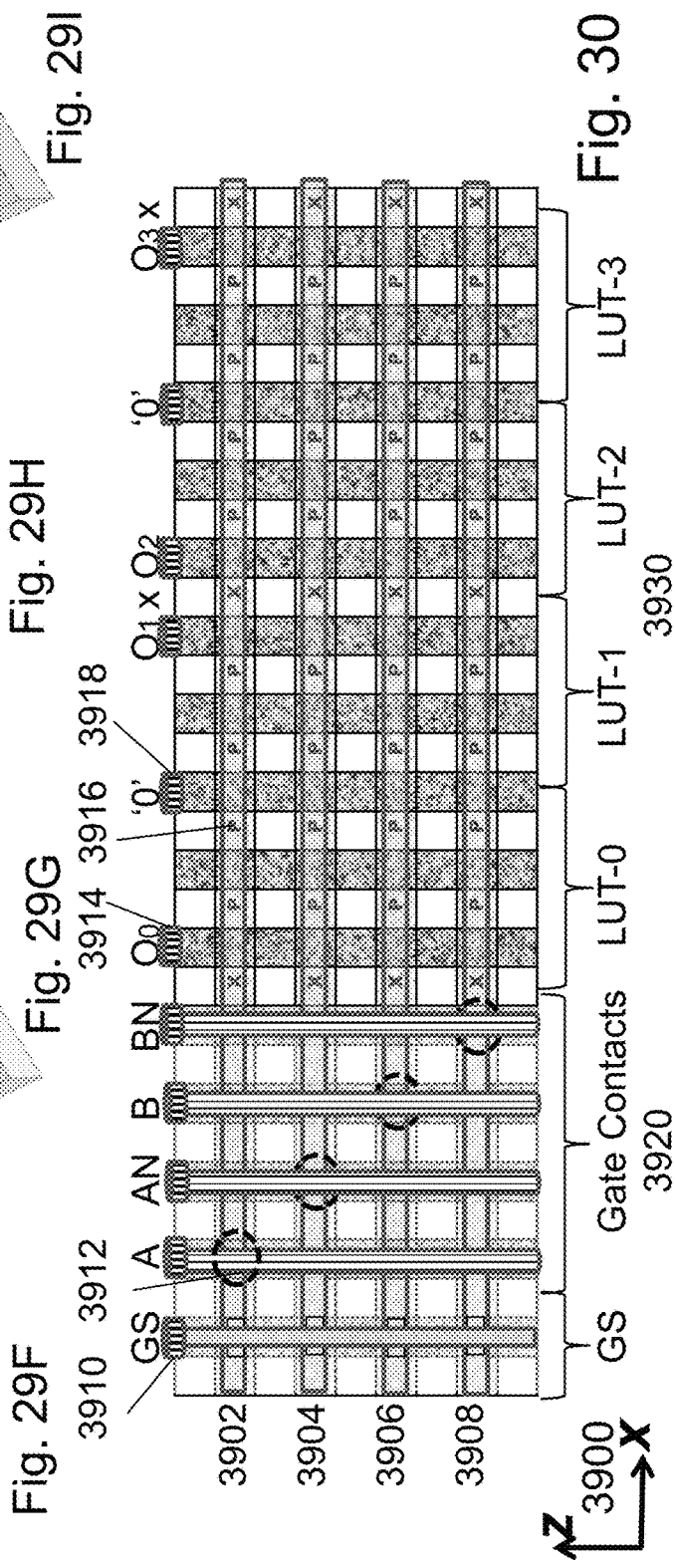

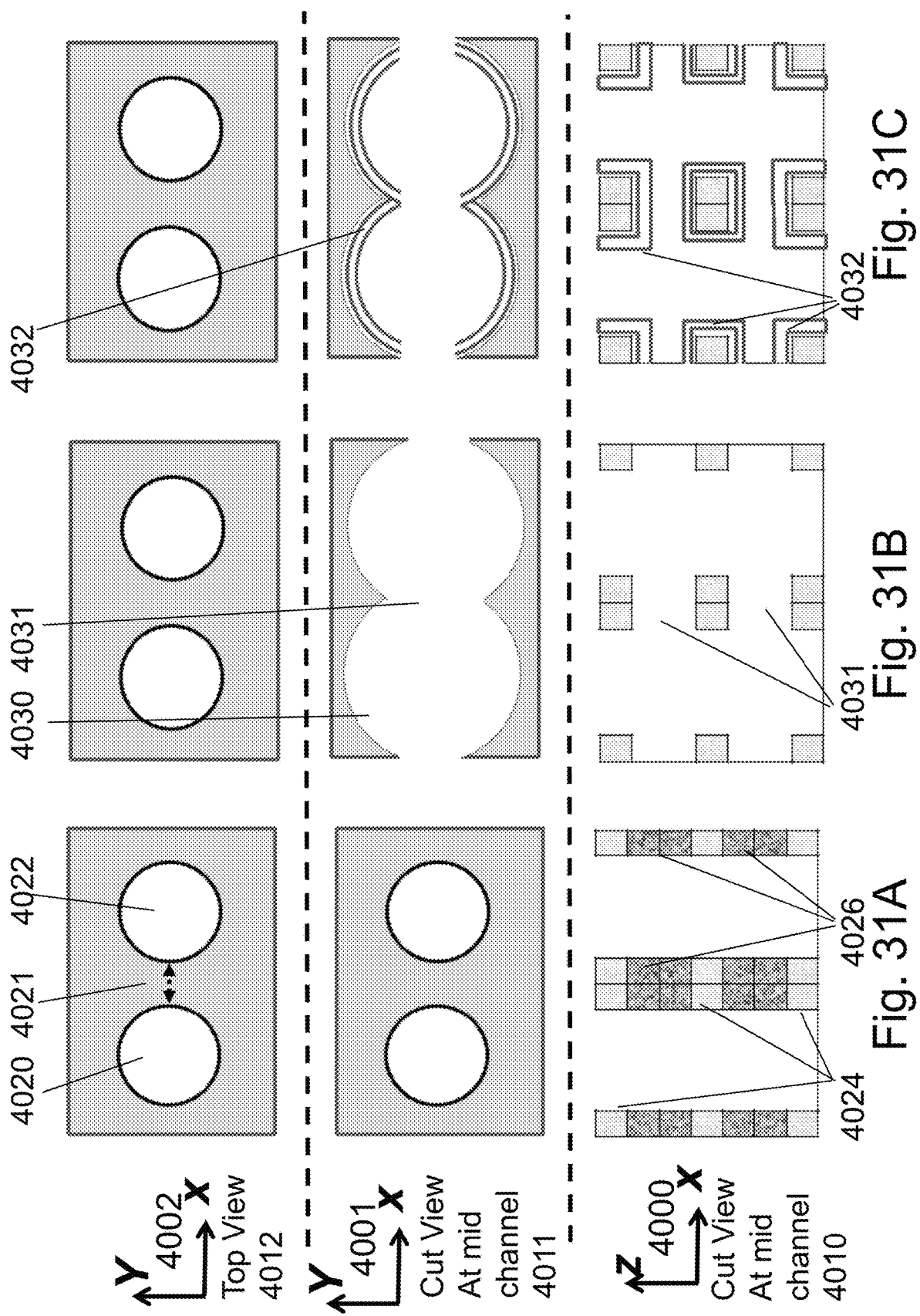

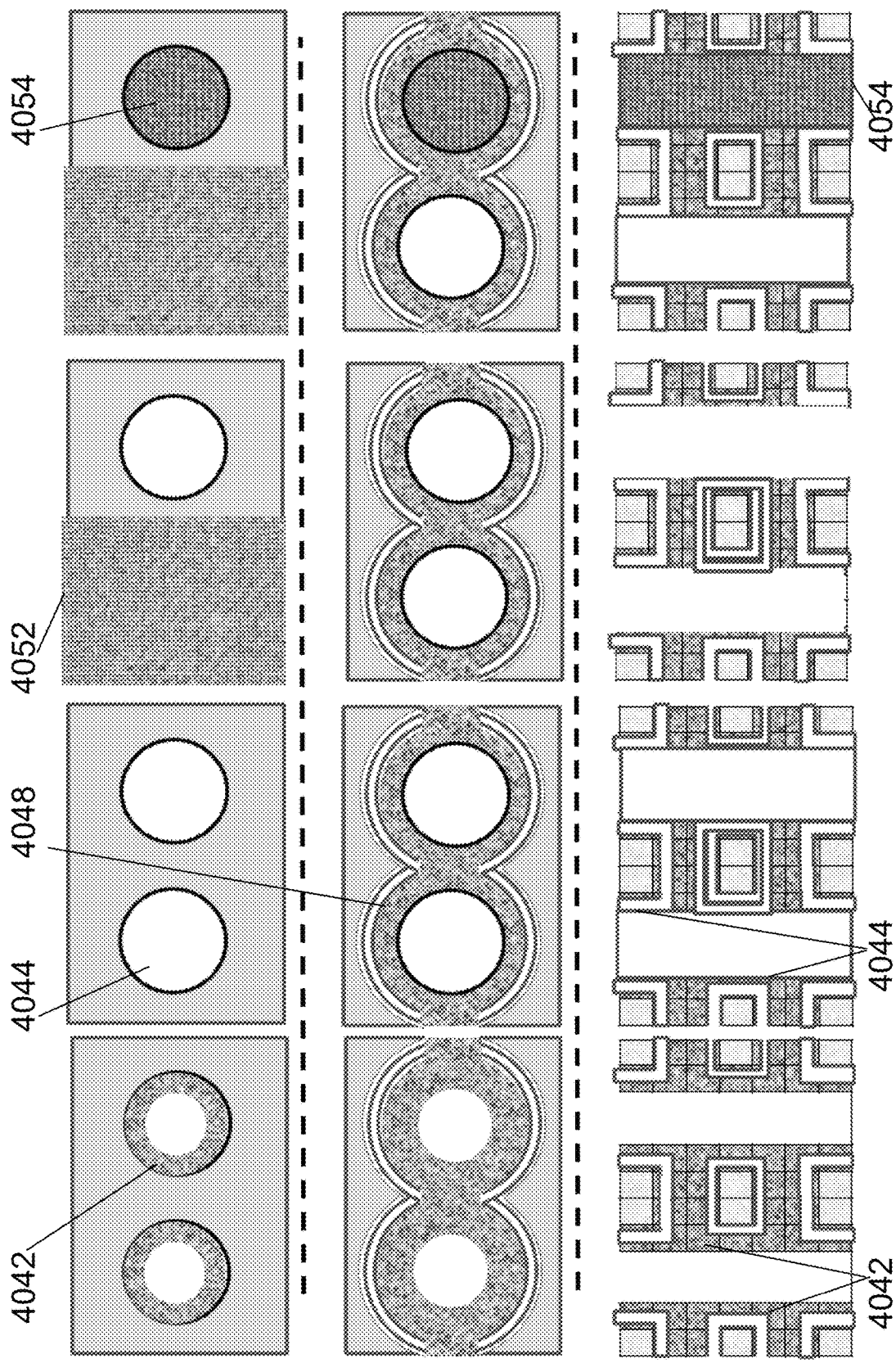

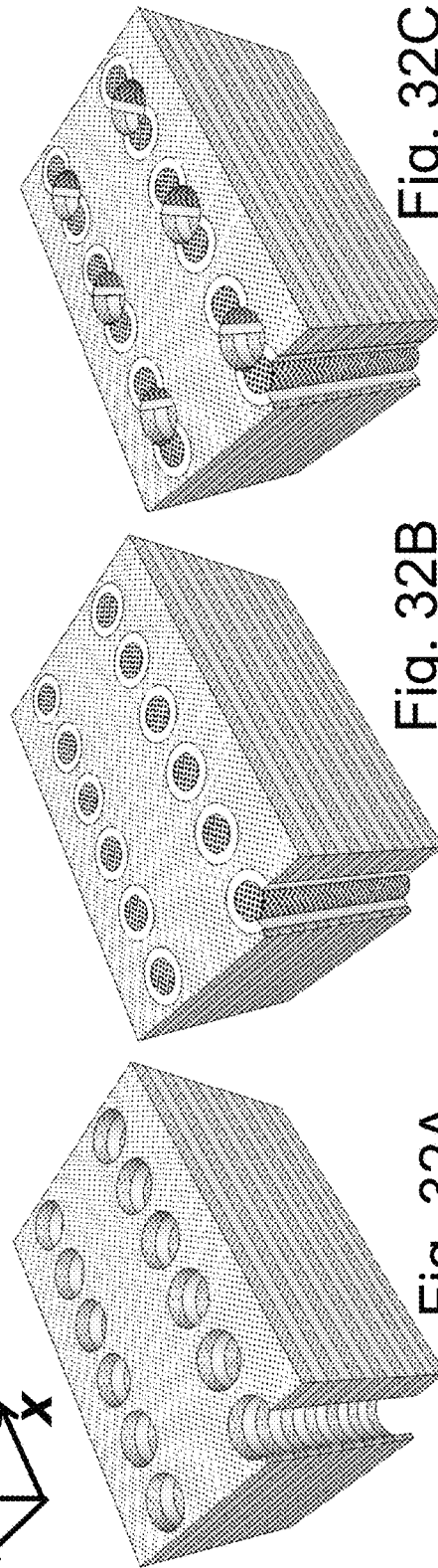

Dual punch & plug 3D NOR-P – ON stack/ SD first / metal gate replacement version Fig. 32A
Oxide/Nitride
First punch for S/D Fig. 32B
Oxide liner for sufficient spacing
First plug with n+ doped polysilicon S/D Fig. 32C
Second punch for channel

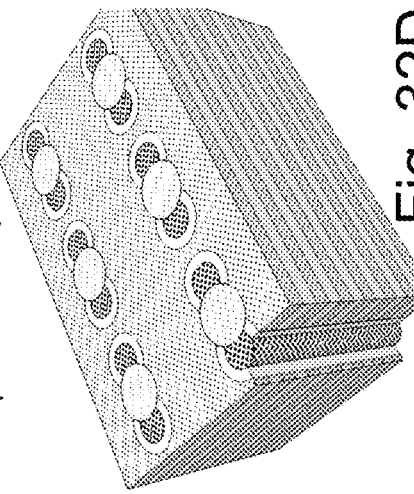

Fig. 32D
Second plug with undoped channel

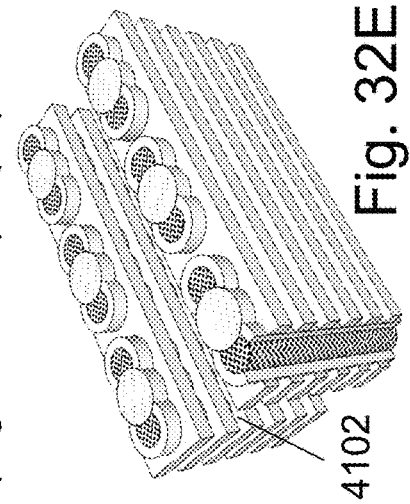

Fig. 32E
Slit for replacement gate
Selective remove nitride layer
Optional channel doping

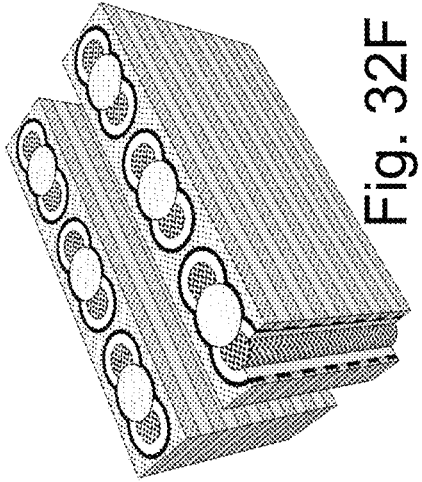

Fig. 32F
Charge trap layer or ferroelectric layer
Replacement of metal gate

Dual punch & plug 3D NOR-P – OP stack/ poly gate first / SD (metallic) last

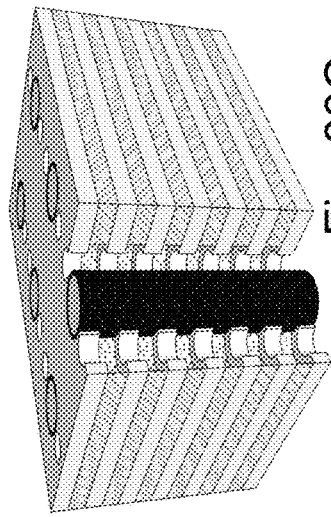

Fig. 33A

- Oxide/Poly stack
- First punch hole for channel
- Charge trap layer or ferroelectric layer
- First plug for channel

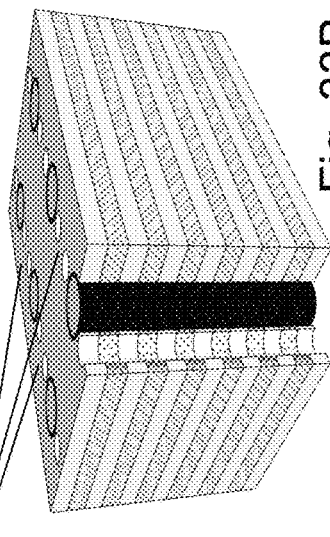

Fig. 33B

Second punch hole for S/D
* Hole is close enough to channel but not expose the channel

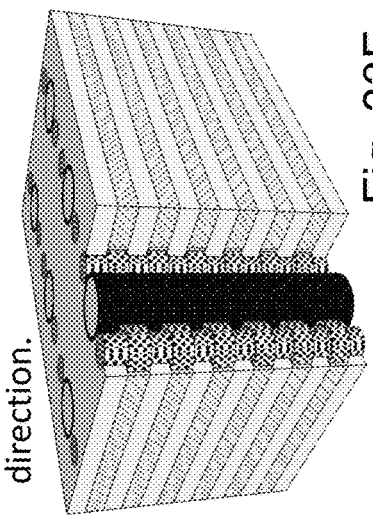

Fig. 33C

Selectively indent the poly
* Indentation depth toward the channel is limited by CT layer, but greater toward other direction.

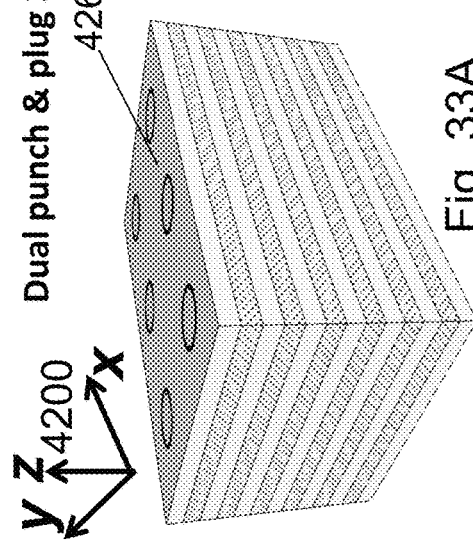

Fig. 33D

Fill oxide to the indentation region.

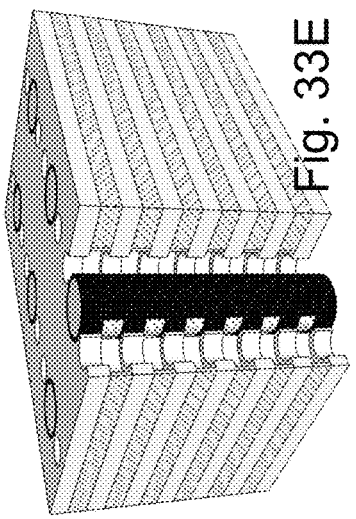

Fig. 33E

- Partially remove the fill oxide until the CT sidewall exposed.
- Remove the CT layer through window

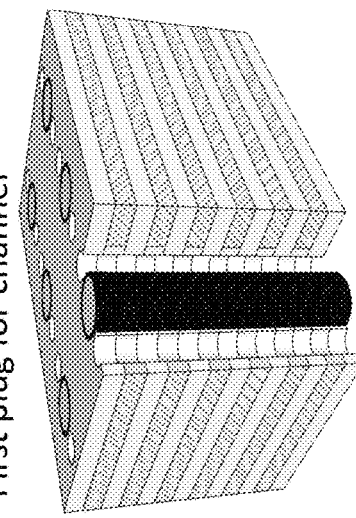

Fig. 33F

- (metallic) S/D fill.
- (Optional) Slice the WL

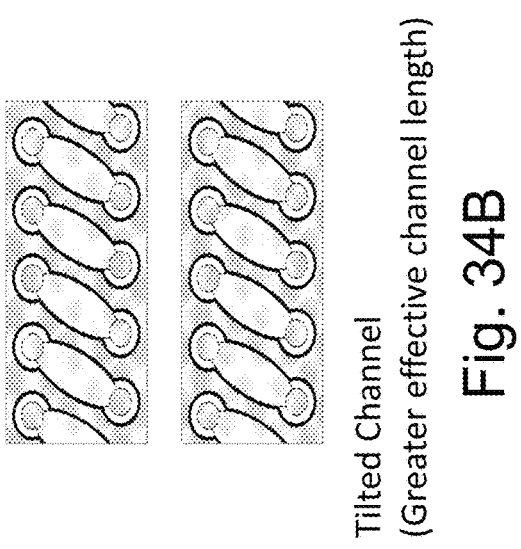
Tilted Channel
(Greater effective channel length)
Fig. 34B
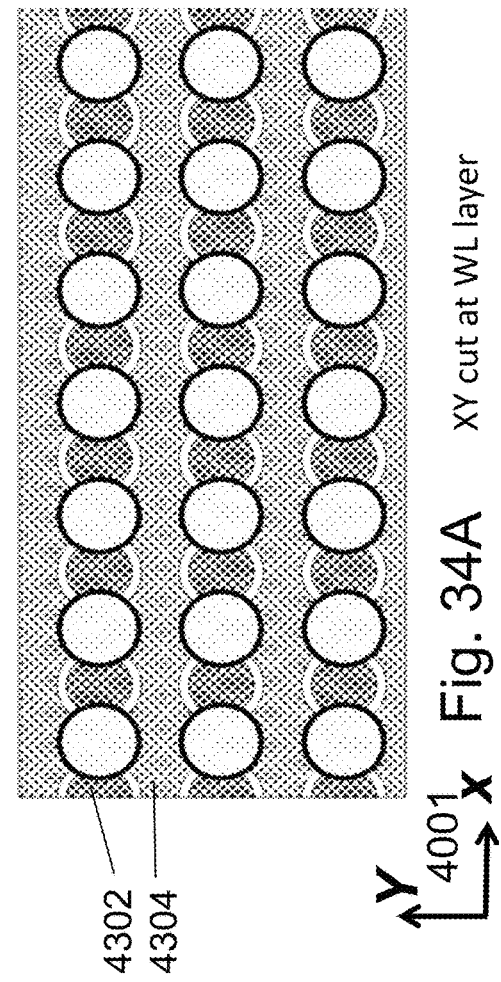
Fig. 34A  XY cut at WL layer
4302
4304
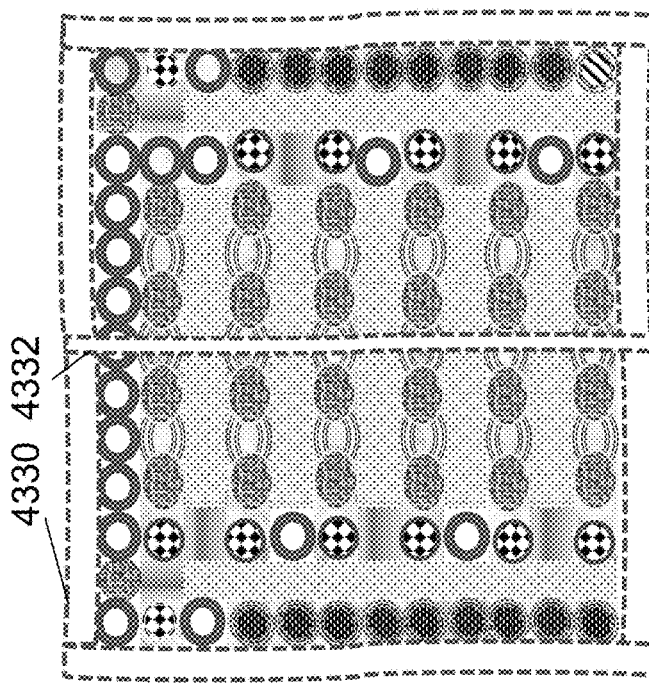
Fig. 34C
4330 4332
Ledger
4310
4312
4314
4316
4318
4320
4322
4324
4326
4328
4339

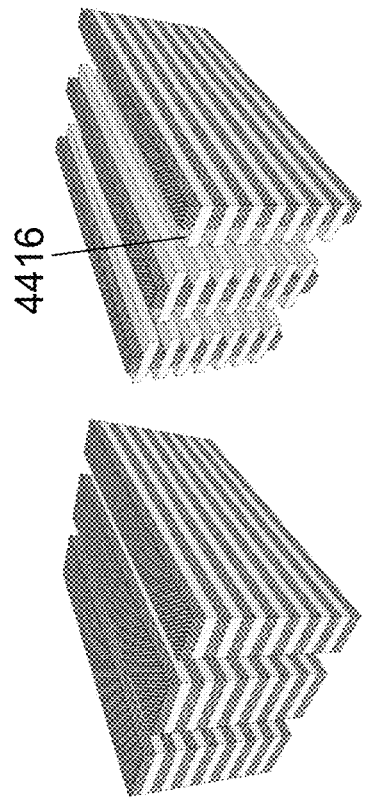

Fig. 35A
- Epitaxial growth of multiple stack of first and second single crystalline semiconductors
- The first semiconductor such as silicon will be body of the transistor
- The second semiconductor such as SiGe will be sacrificial layer Fig. 35B
- Pattern ridge to expose sidewall of semiconductor layers Fig. 35C
- Replace the sacrificial layers with dielectric such as SiO2
- The supporting pillar was assumed to be periodically formed (not shown).

Fig. 35D
- Selectively etch off the first semiconductor layer to create indentation overhang by oxide

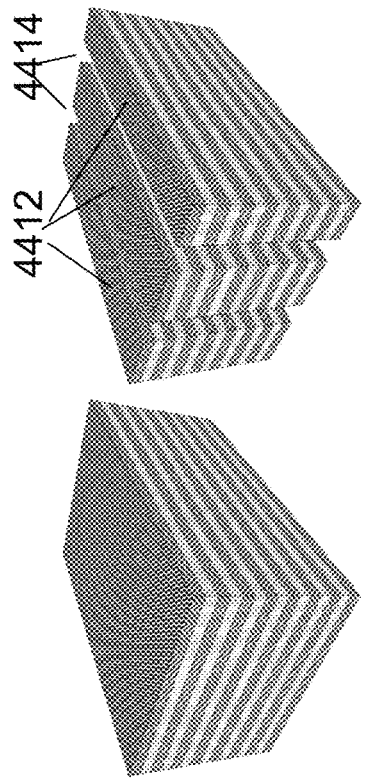

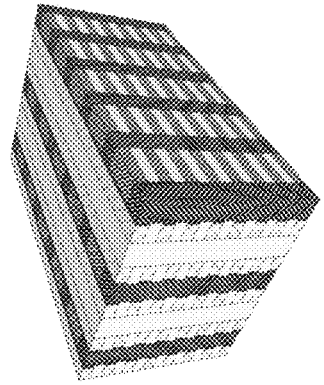

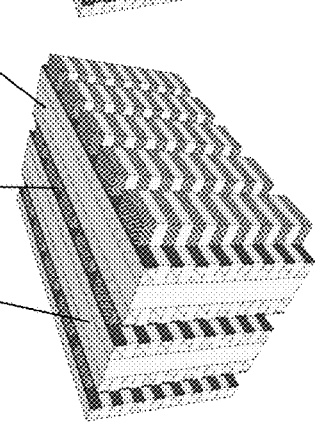

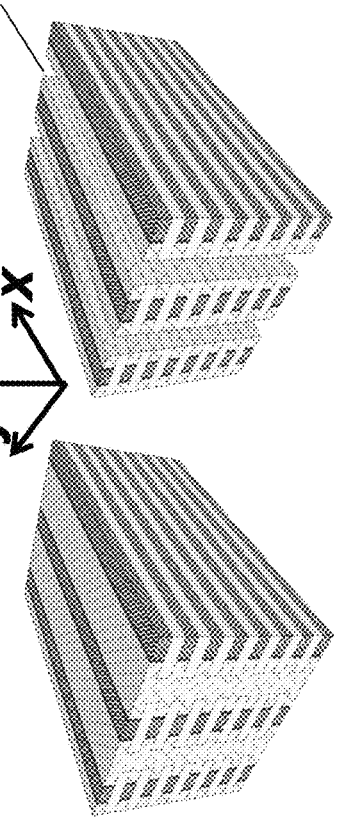

Fig. 35E
- Conformally deposit memory storage gate dielectric such as charge trapping layer or ferroelectric layer
- Fill out using gate materials.

Fig. 35F
- Pattern the gate material

Fig. 35G
- Etch the through holes in the ridge

Fig. 35H
- Fill out with source/drain material such as doped polysilicon or metal or thin dielectric inserted metal.

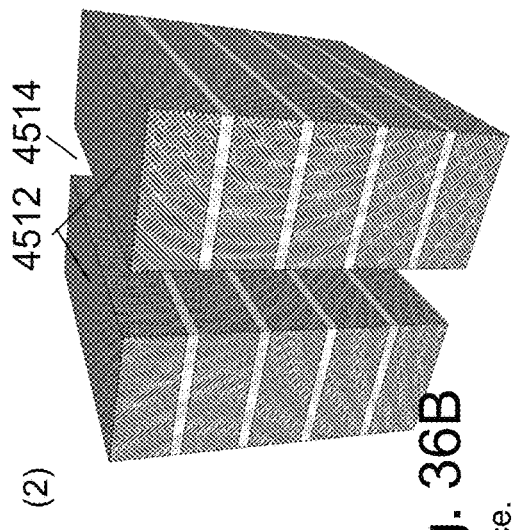

Fig. 36A
SiGe/Si epi-stack
Si will be channel, SiGe will be replaced with gate stack
SiGe will be thick to accommodate dual side gate stack

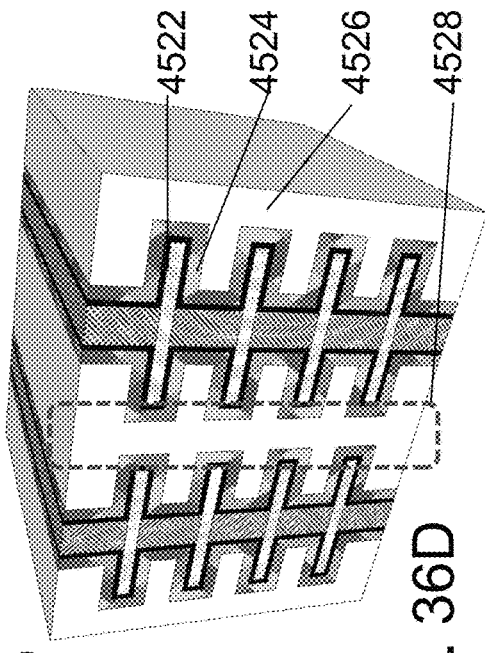

Fig. 36B
Slice.
With of slice will be two channels and subsequent slice therebetween

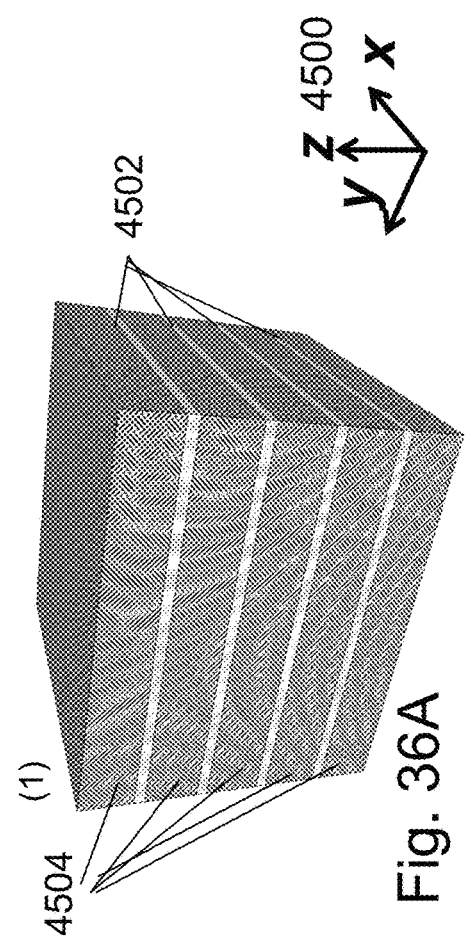

Fig. 36C
Selective indentation of SiGe.
The remaining SiGe will support the ridge.
The indentation to be filled with gate stacks

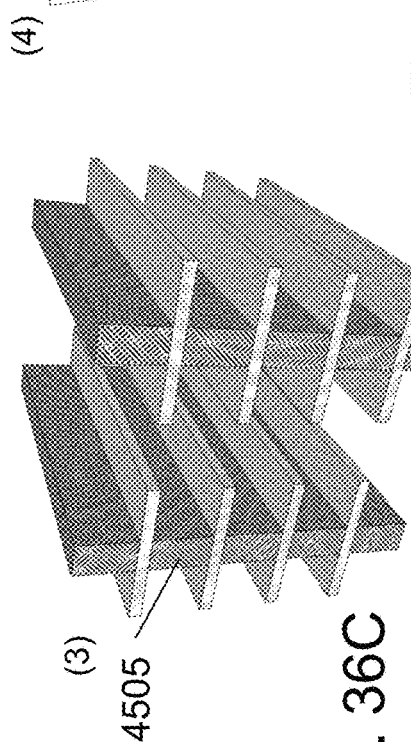

Fig. 36D
Storage node/gate/inter-gate oxide fill

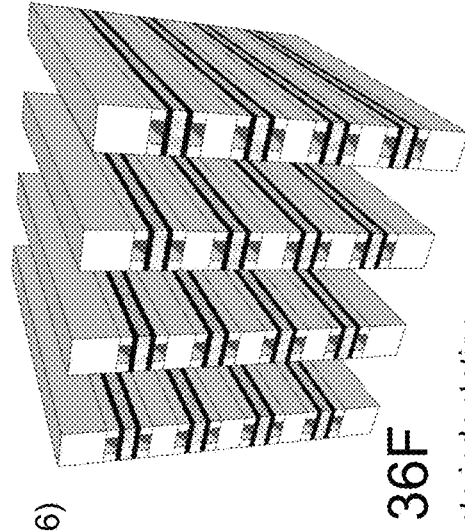

Another slice etch to halves the first ridge
Conditioned to remove the gate stacks on sidewall

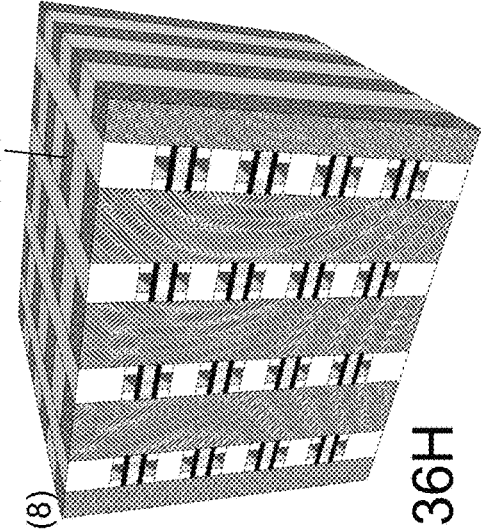

Selective gate indentation
Fill with decoupleing oxide to separate the gate
and subsequent S/D

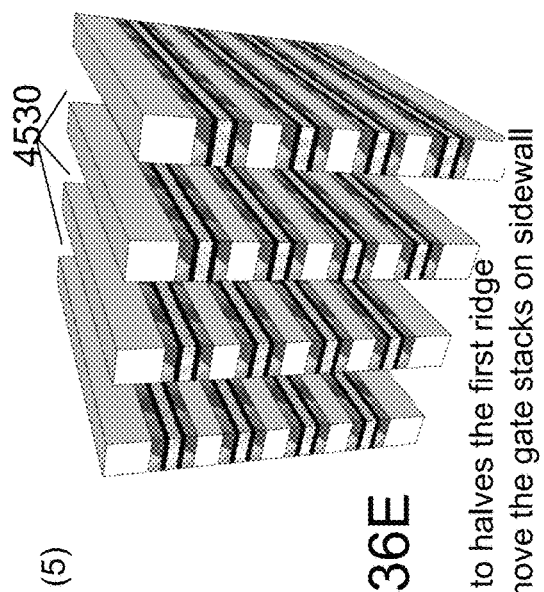

Fill oxide and punch holes for vertical S/D.
Silicon may be purposely indented for S/D to gate overlap.
Be sure that the silicon sidewall surface is exposure.
Step (6) and (7) can be swapped.

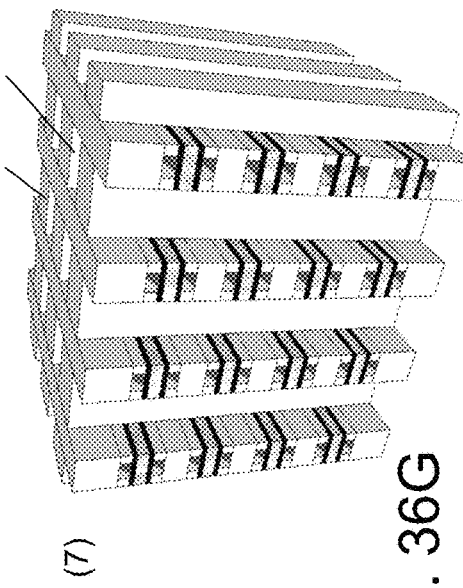

Fill with S/D

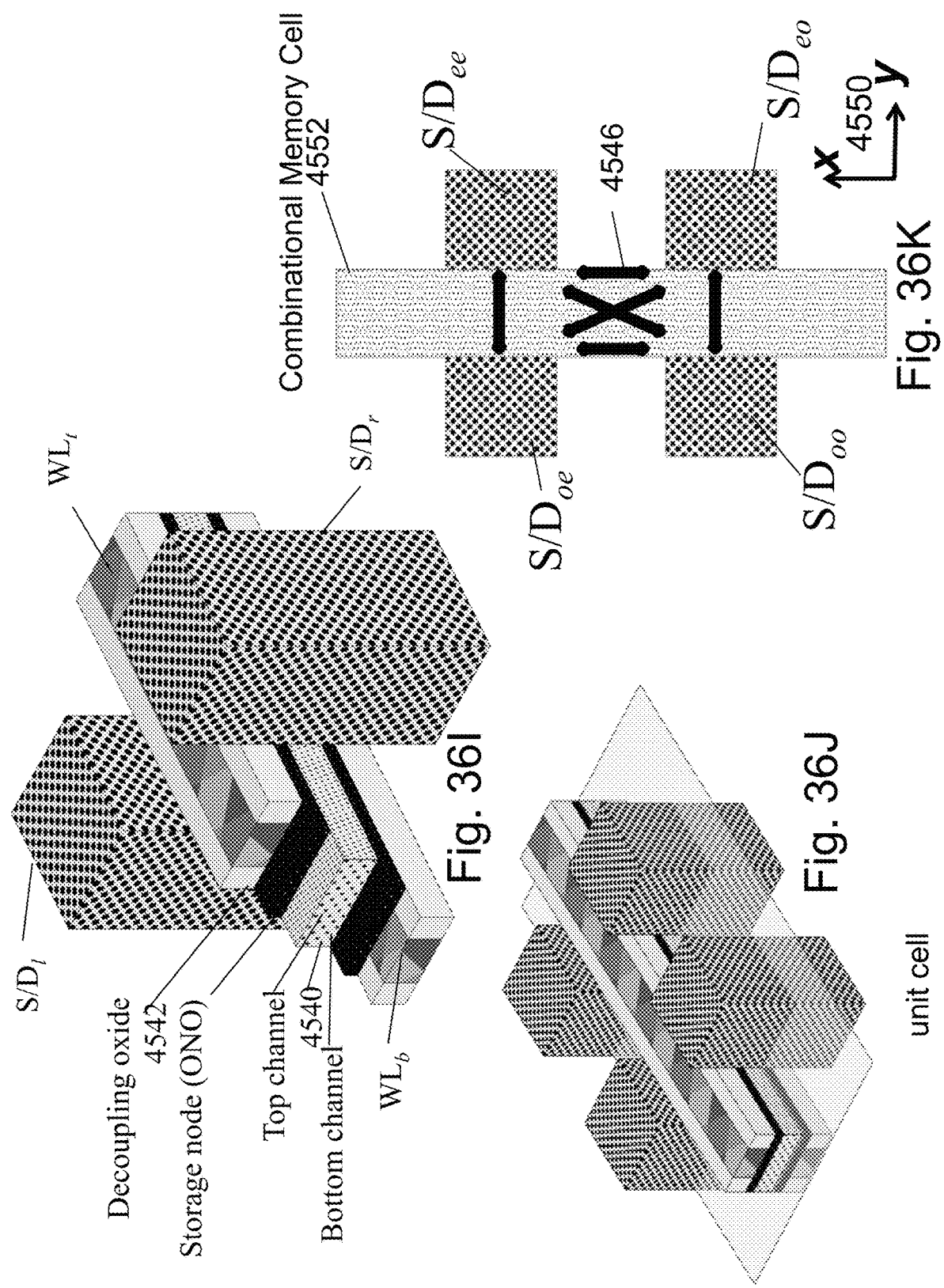

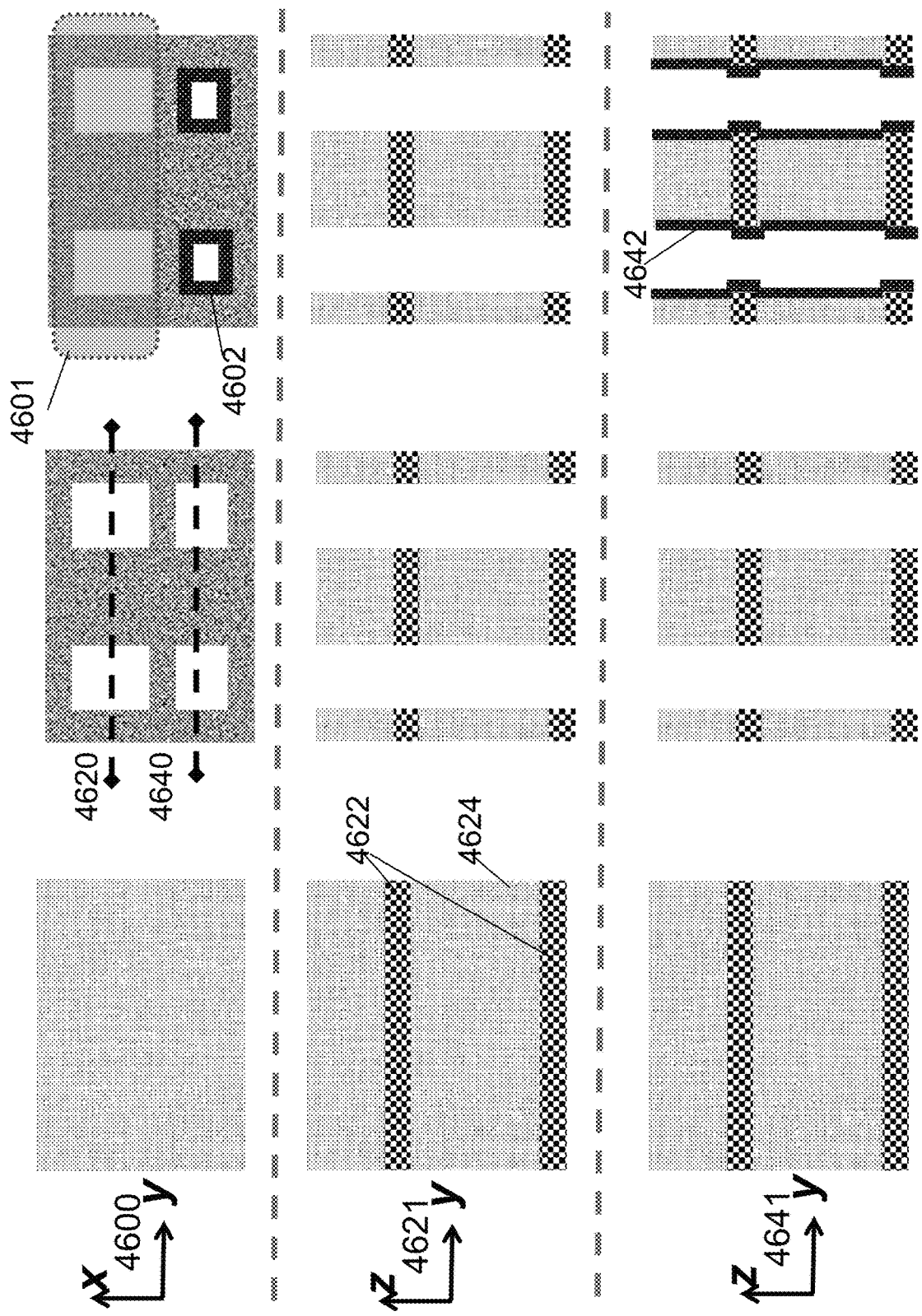

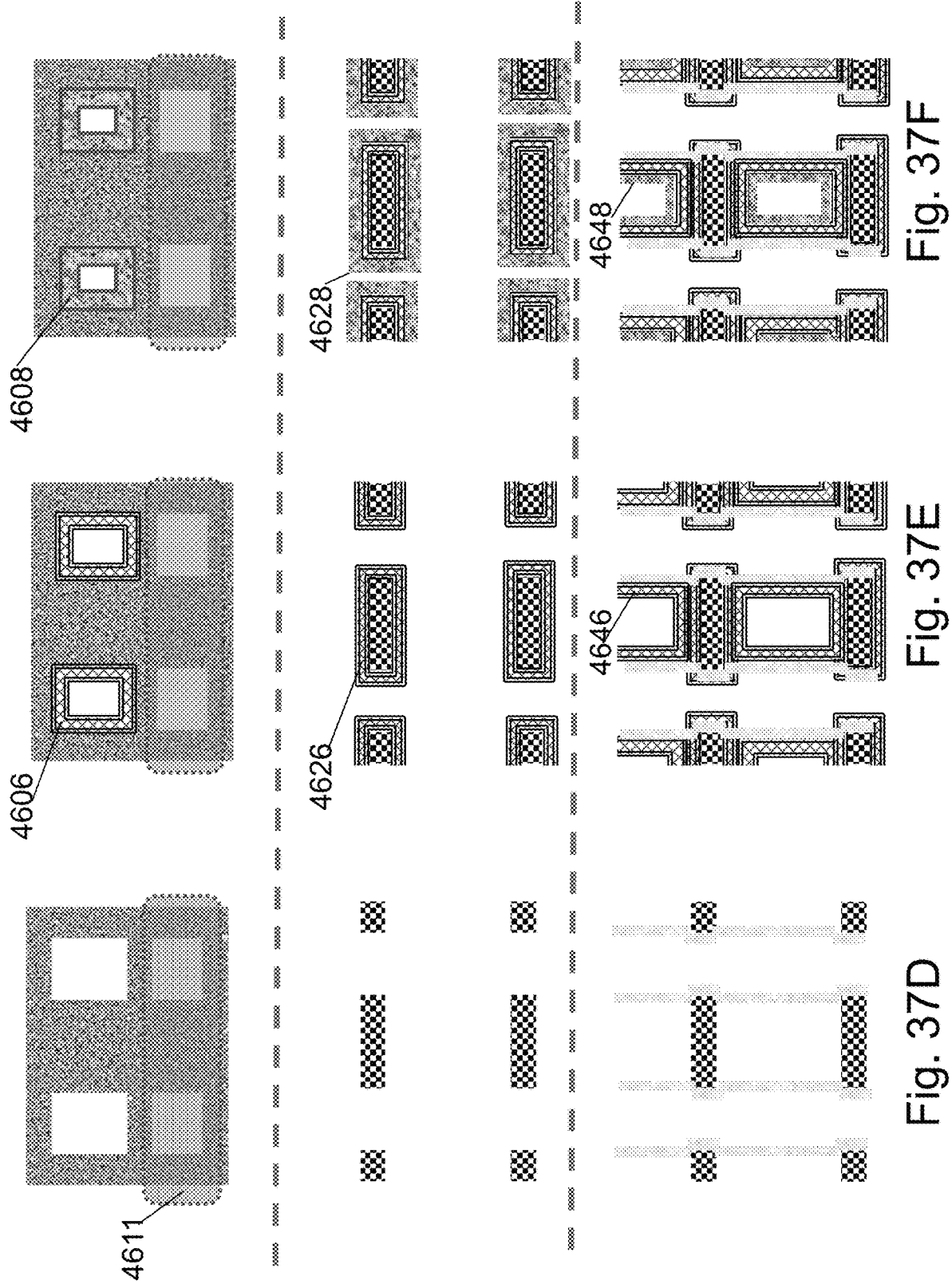

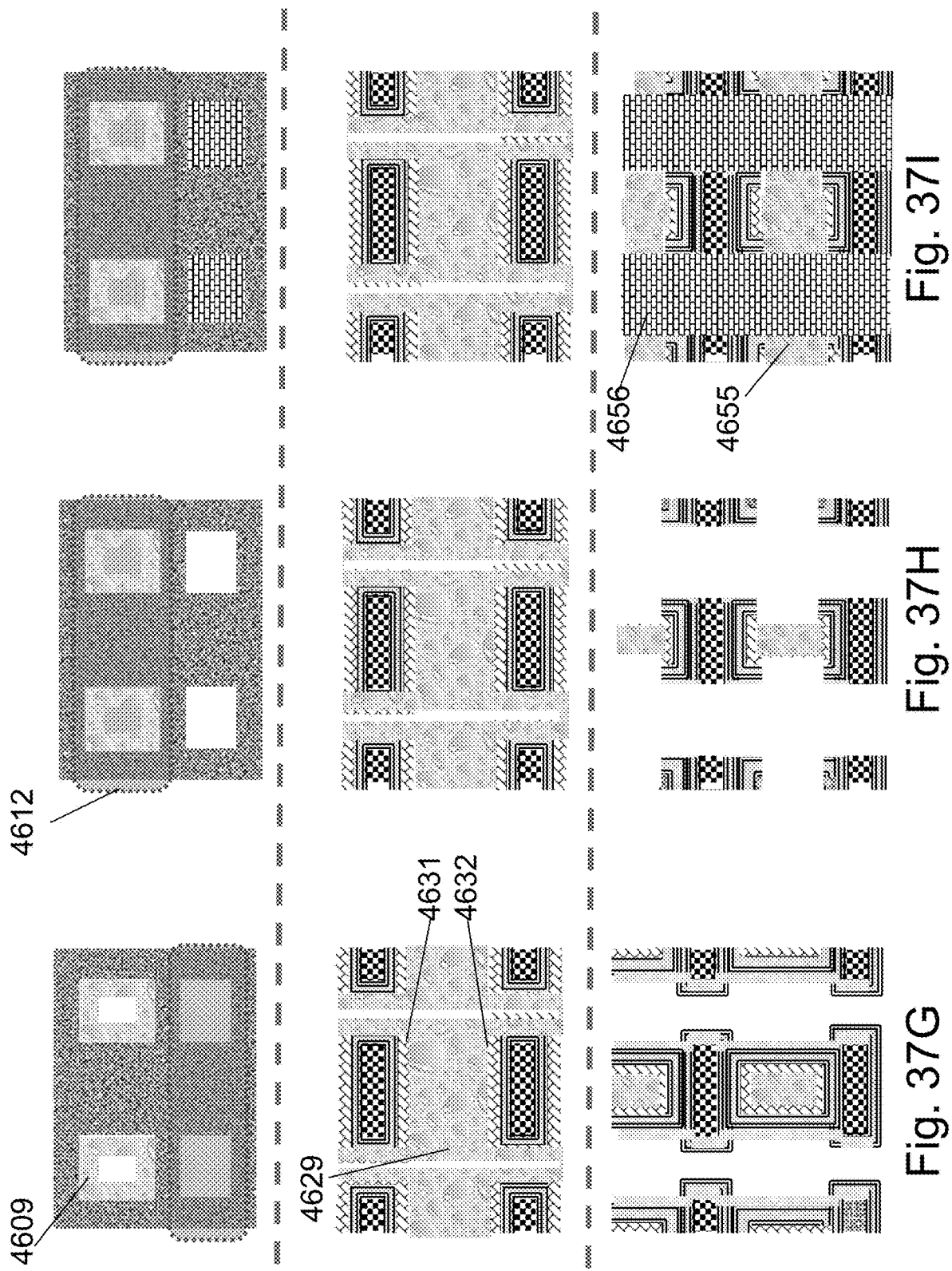

Single punch / single plug / macaroni or pillar channel junctionless transistor

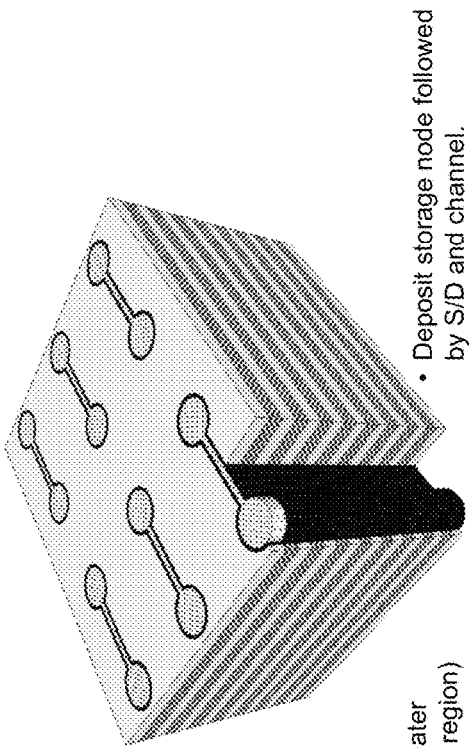

Fig. 40A

- Dumbbell shaped punch hole
- S/D region (bell region) is greater while the channel region (bar region) may be sufficiently narrow to form junctionless transistor.

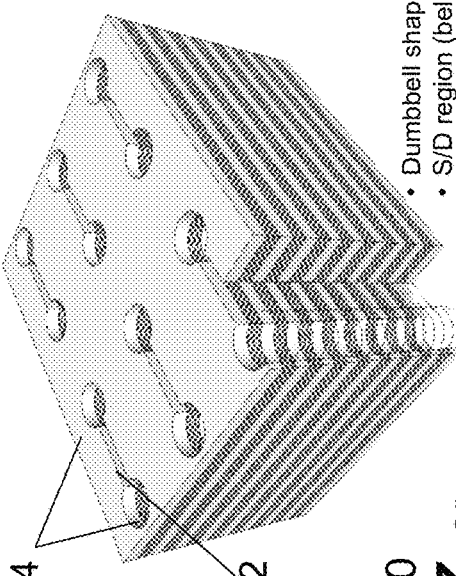

Fig. 40B

- Deposit storage node followed by S/D and channel.
- Both the channel and S/D region may be one material such as n++ polysilicon.
- Gate slice may be further followed.

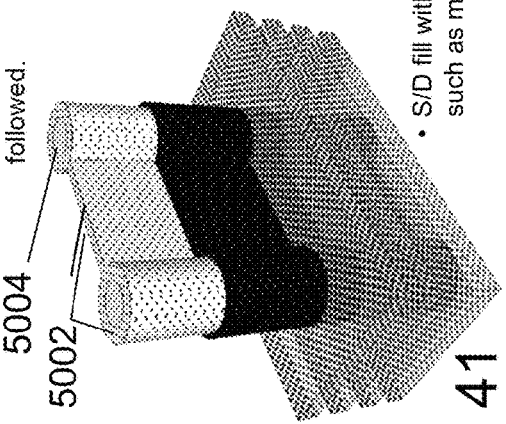

Fig. 41

- S/D fill with other material such as metal

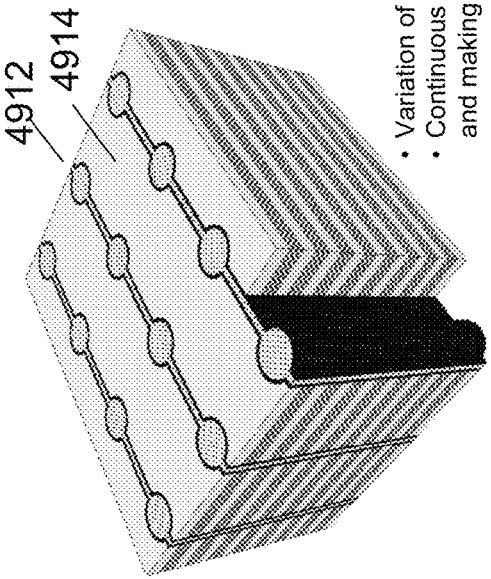

Fig. 40C

- Variation of (3a)
- Continuous punch/plug for self-WL etch and making double gate.

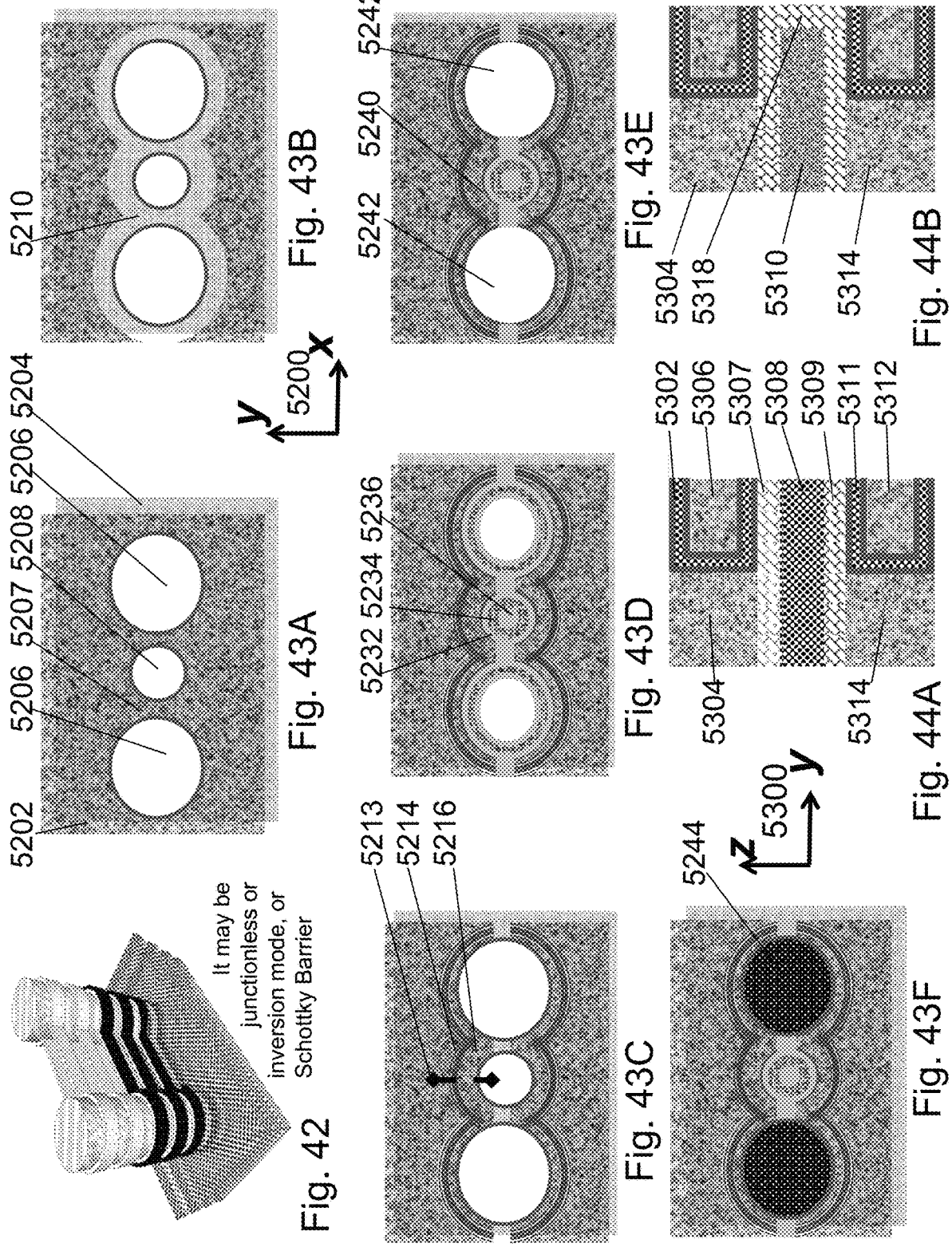

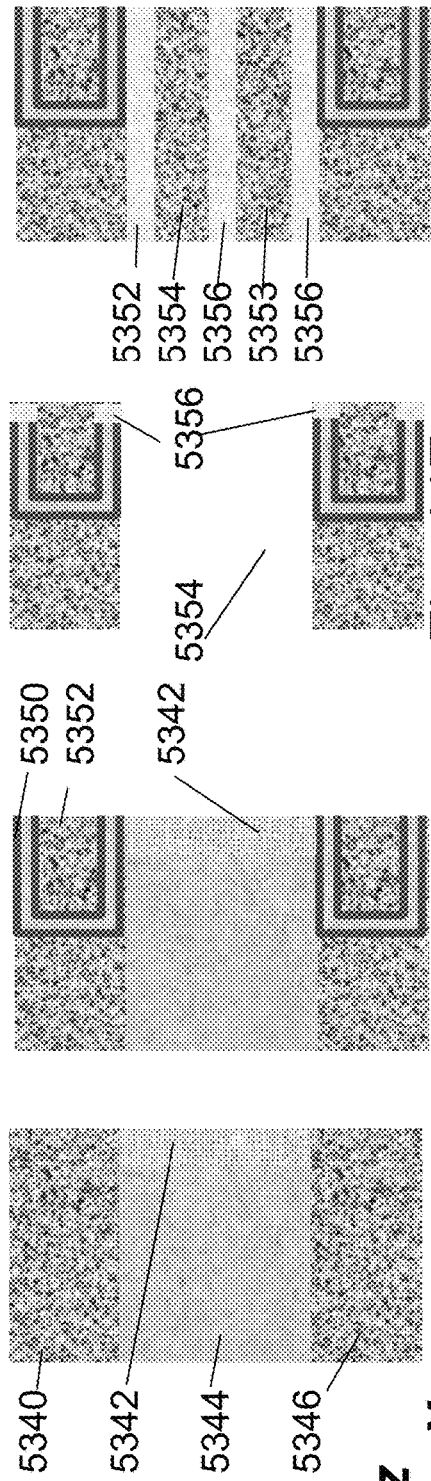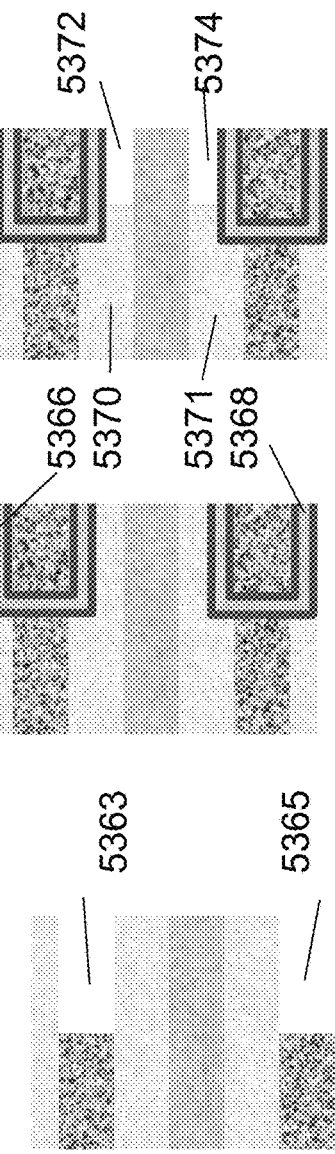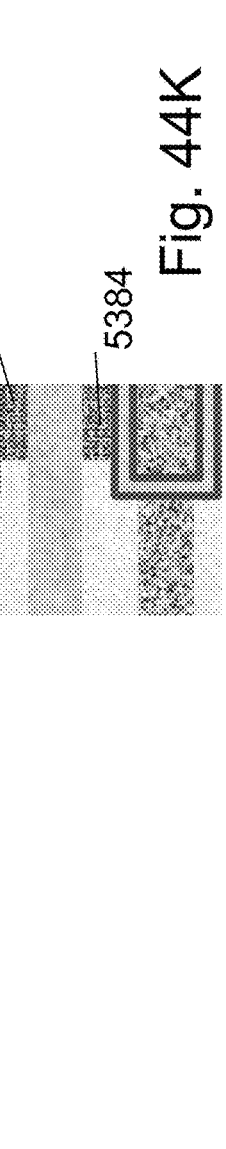

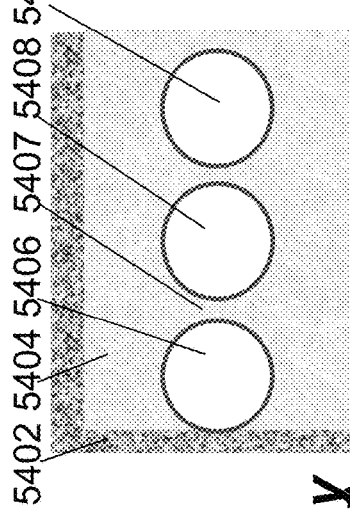
Fig. 45A
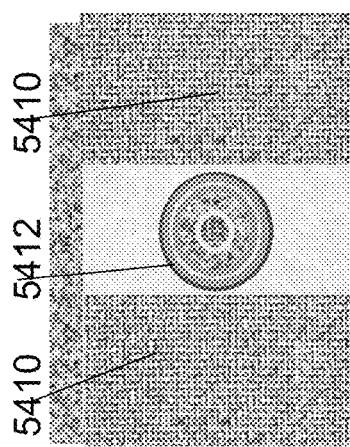
Fig. 45B
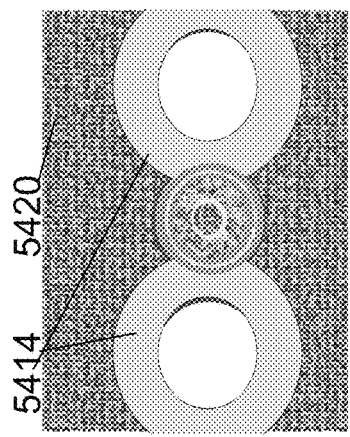
Fig. 45C
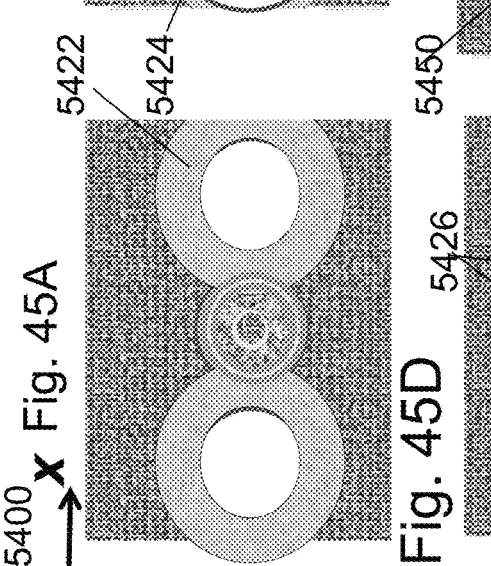
Fig. 45D
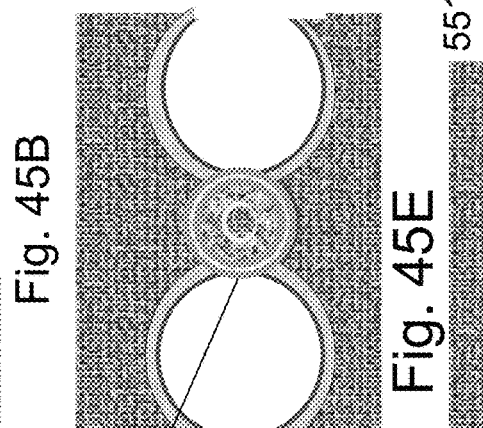
Fig. 45E
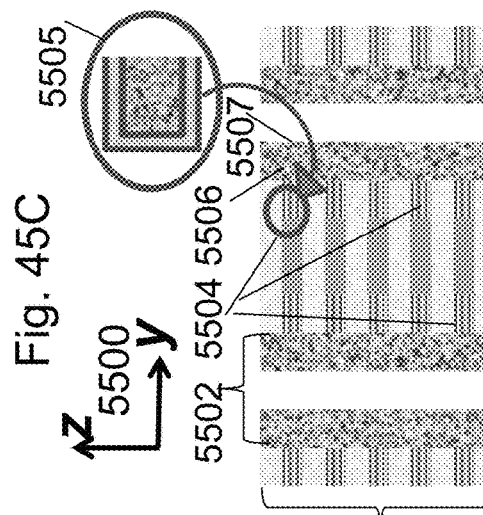
Fig. 45F
Fig. 45G
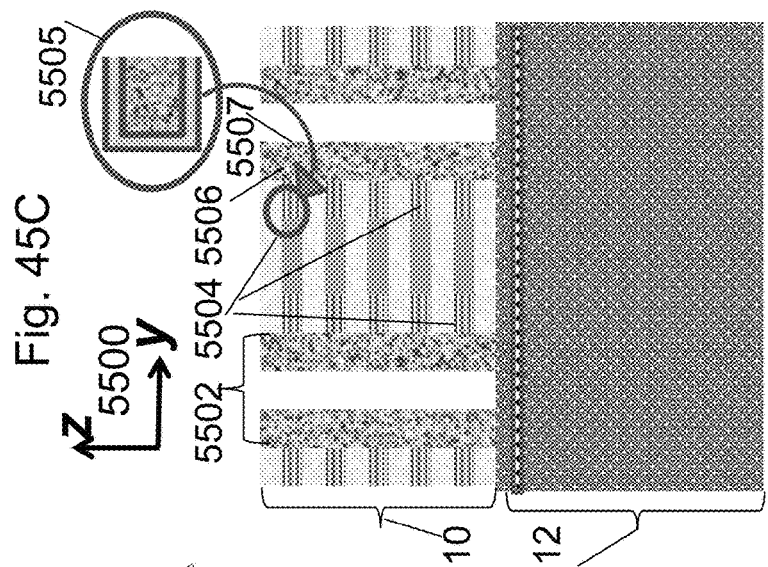
Fig. 46

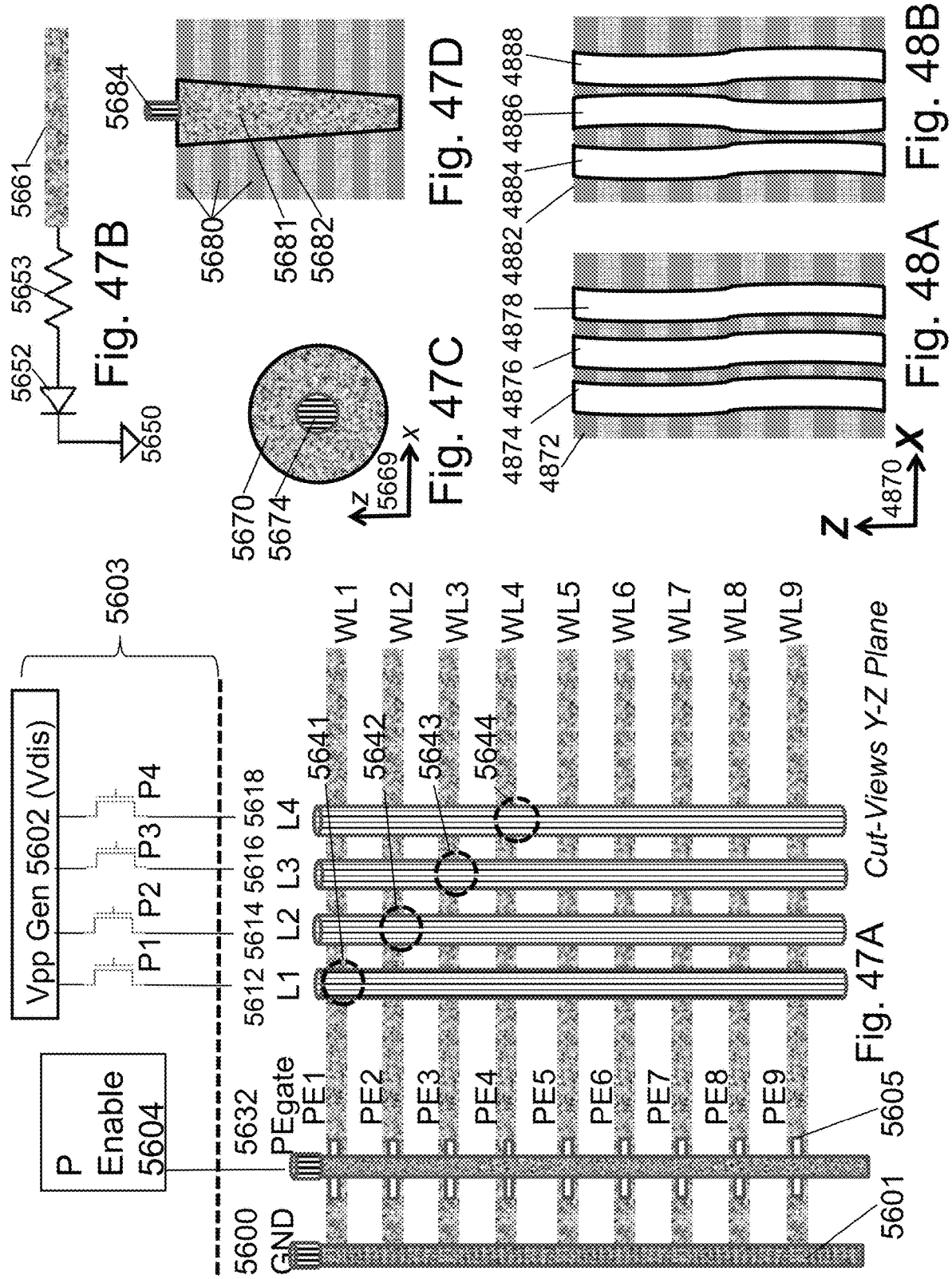

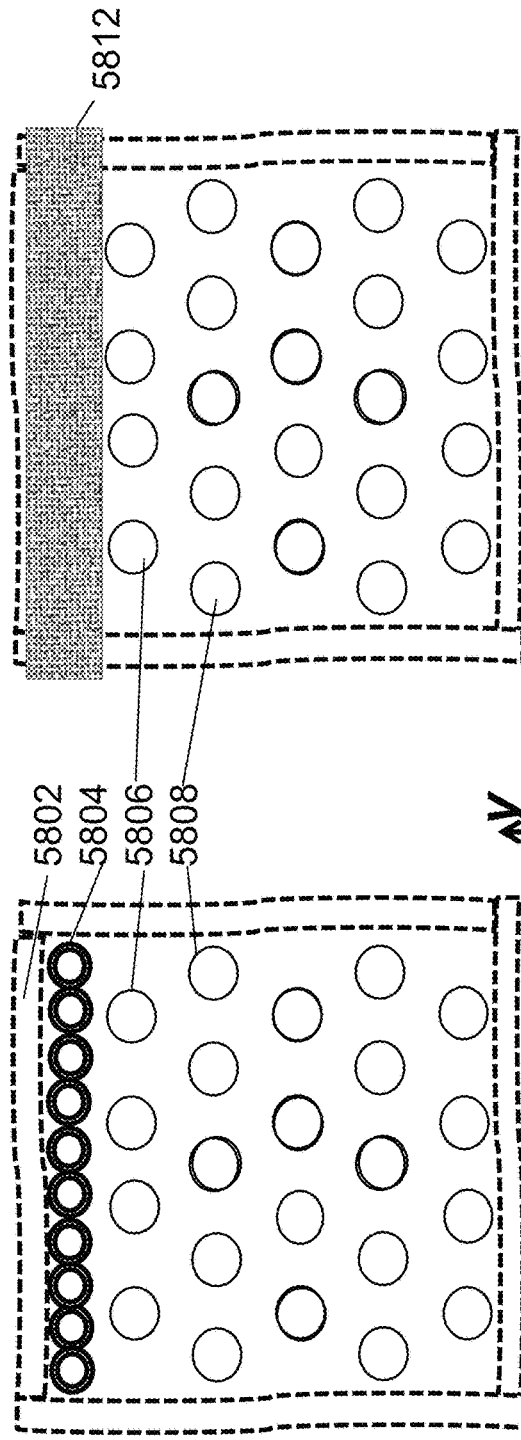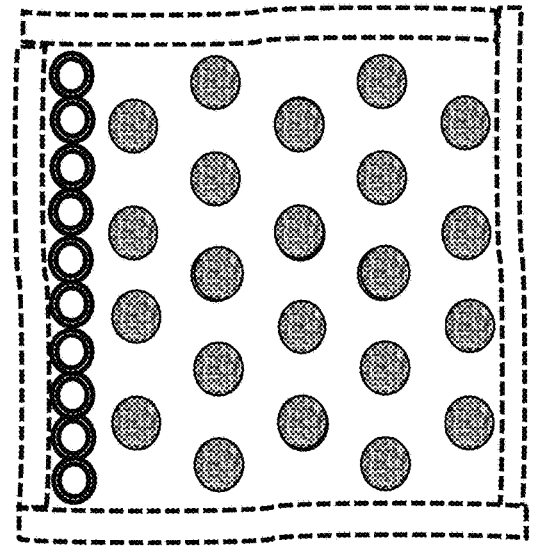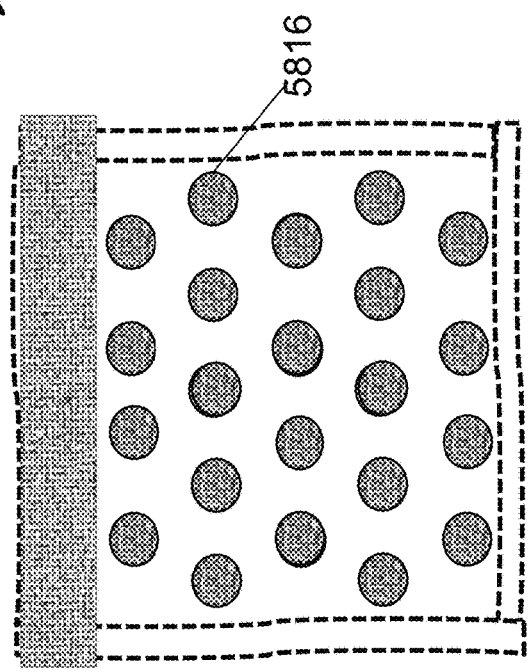
Fig. 49A  Fig. 49B  Fig. 49C  Fig. 49D

3D SEMICONDUCTOR DEVICE AND STRUCTURE

BACKGROUND OF THE INVENTION

1. Field of the Invention

This application relates to the general field of Integrated Circuit (IC) devices and fabrication methods, and more particularly to multilayer or Three Dimensional Integrated Memory Circuit (3D-Memory) and Three Dimensional Integrated Logic Circuit (3D-Logic) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,557,632, 8,298,875, 8,642,416, 8,362,482, 8,378,715, 8,379,458, 8,450,804, 8,574,929, 8,581,349, 8,642,416, 8,687,399, 8,742,476, 8,674,470, 8,803,206, 8,836,073, 8,902,663, 8,994,404, 9,021,414, 9,023,688, 9,030,858, 9,117,749, 9,142,553, 9,219,005, 9,385,058, 9,385,088, 9,406,670, 9,460,978, 9,509,313; U.S. patent publication 2011/0092030, 2016/0218046; and pending U.S. patent application Ser. Nos. 14/607,077, 14/642,724, 62/307,568, 62/297,857, 15/095,187, 15/150,395, 15/173,686, 15/243,941, PCT/US2016/052726, 62/406,376, 62/432,575, 62/440,720, 62/457,838, 62/460,989, 62/297,857, 62/443,751, 62/454,785, 62/468,372, 62/473,308, 62/484,284, 62/488,757, 62/501,136, 62/517,959, 62/523,760, 62/530,173, 62/531,880, 62/539,054, 62/549,952, 62/562,457, 62/625,961, PCT/US2017/052359, Ser. Nos. 15/333,138, 15/344,562, and 15/351,389. The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031; and U.S. Patent Publication No. 2016/0064439. The entire contents of the foregoing patents, publications, and applications are incorporated herein by reference.

Additionally the 3D technology according to some embodiments of the invention may enable some very innovative IC devices alternatives with reduced development costs, novel and simpler process flows, increased yield, and other illustrative benefits.

SUMMARY

The invention relates to multilayer or Three Dimensional Integrated Circuit (3D IC) devices and fabrication methods. Important aspects of 3D IC are technologies that allow layer transfer. These technologies include technologies that support reuse of the donor wafer, and technologies that support fabrication of active devices on the transferred layer to be transferred with it.

BRIEF DESCRIPTION OF THE DRAWINGS

Various embodiments of the invention will be understood and appreciated more fully from the following detailed description, taken in conjunction with the drawings in which:

FIGS. 2A-2H are example illustrations of the formation and structure of an enhancement for the 3D NAND class of gate first;

FIGS. 4A-4H are example illustrations of an additional formation and structure of an enhancement for the 3D NAND class of gate last;

FIGS. 5A-5D are example illustrations of a staircase formation flow;

FIGS. 6A-6D are example illustrations of a current conventional 3D NAND structure;

FIGS. 9A-9H are example illustrations of utilization of monolithic 3D integration to form 3D NAND;

FIGS. 10A-10H are example illustrations of memory stack formation with a second gate;

FIGS. 11A, 11B and 11D are example illustrations of some steps of formation of a polysilicon channel 3D NOR structure (3D NOR-P);

FIG. 11C is an example illustration of a NOR schematic;

FIG. 13A is an example illustration of a ridge splitting of a 3D NOR structure;

FIG. 13B is an example illustration of minor bits in a 3D NOR structure;

FIG. 13C is an example illustration of a 3D NOR-P structure with an alternative ridge splitting;

FIGS. 14A-14G are example illustrations of the formation of a 3D NOR with extended control from the adjacent gate above or below;

FIGS. 15A-15C are additional example illustrations of the formation of a 3D NOR with extended control from the adjacent gate above or below;

FIGS. 16A-16B are example illustrations of a 3D NOR-P with electrical programming for array access rather than a staircase;

FIGS. 17A-17F are example illustrations of a 3D NOR with programmable vertical transistors;

FIG. 19 are example illustrations of 3D NOR-P fabrics which use wordline replacement techniques;

FIGS. 20A-20D are example illustrations of formation of a second gate in the 3D NOR structure;

FIGS. 21A-21B are example illustrations of the formation of a 3D NOR fabric with up to 4 facets per channel and multiple storage locations per facet;

FIGS. 22A-22D are additional example illustrations of the formation of a 3D NOR fabric with up to 4 facets per channel and multiple storage locations per facet;

FIGS. 22E-22G are example illustrations of the formation of a 3D NOR fabric with single crystal cell channels;

FIGS. 23A-23B are example illustrations of a memory cell of the 3D NOR-P with $1^{st}$ and $2^{nd}$ gates;

FIGS. 24A-24D are example illustrations of writing a ferroelectric memory cell;

FIGS. 25A-25D are example illustrations of two bits stored in one facet of a memory cell;

FIGS. 26A-26D are example illustrations of writing bits in a small section of the 3D NOR-P fabric;

FIGS. 26E-26H are example illustrations of an alternative formation of the NOR-P structure with ferroelectric material incorporated;

FIGS. 27A-27B are example illustrations of engineering a 3D NOR-P memory structure;

FIG. 27C is an example illustration of an alternative engineering of a 3D NOR-P memory structure;

FIGS. 28A-28C are example illustrations of a modification of the construction of the 3D NOR-P structure;

FIGS. 28D-28E are example illustrations of an alternative modification of the construction of the 3D NOR-P structure;

FIGS. 28F-28S are example illustrations of various vertical channel configurations and structures;

FIGS. 29A-29D are example illustrations of adapting the 3D NOR-P to construct a Floating Body RAM ("FB-RAM") structure;

FIG. 29E is an example illustration of an isolated channel overview process flow;

FIGS. 29F-29I are example illustrations of various channel structures and configurations;

FIG. 30 is an example illustration of a Look-Up-Table of 4 Inputs ("LUT-4") function implemented on a 3D NOR-P structure;

FIGS. 31A-31J are example illustrations of a 3D NOR-P 'punch and plug' process flow;

FIGS. 32A-32F are example illustrations of a 3D NOR-P dual 'punch and plug' process flow;

FIGS. 33A-33F are example illustrations of an alternative 3D NOR-P dual 'punch and plug' process flow;

FIG. 34A is an example illustration at the wordline level showing the chain of back to back channels and S/D pillars;

FIG. 34B is an example illustration of channels arranged by a tilted angle;

FIG. 34C is an example illustration of a top view showing an example use of the single hole punch process to construct the various elements which may be needed for a 3D NOR-P fabric;

FIGS. 35A-35H are example illustrations of a 3D NOR-C structure and formation thereof;

FIGS. 36A-36K are example illustrations of an alternative 3D NOR-C structure and formation thereof;

FIGS. 37A-37I are example illustrations of an additional alternative 3D NOR-C formation;

FIGS. 40A-40C are example illustrations of forming a 3D NOR-P structure with a single punch;

FIG. 41 is an example illustration of forming a 3D NOR-P structure with metal in the core of the S/D pillars;

FIG. 42 is an example illustration of a Ring or Donut channel;

FIGS. 43A-43F are example illustrations of the formation of a structure with a single hole punched;

FIGS. 44A-44F are example illustrations of a second gate for the 3D NOR-P formed and multiple alternatives and variations of the flow presented in respect to FIGS. 43A-43F;

FIGS. 44G-44I are example illustrations of an alternative flow and structure to FIGS. 44A-44F;

FIGS. 44J-44K are example illustrations of an second alternative flow and structure to FIGS. 44A-44F;

FIGS. 45A-45G are example illustrations of alternatives for the 3D NOR-P structure;

FIG. 46 is an example illustration of a re-crystallization TFT like 3D NOR-P structure utilizing a technique such as layer transfer; and FIGS. 47A-47D is an example illustration of alternative per layer access of a description of an alternative per layer contact programming access scheme.

FIG. 48A is an example illustration of holes/vias etched or punched together/simultaneously;

FIG. 48B is an example illustration of holes/vias etched or punched in two or more independent etch steps; and FIGS. 49A-49D are example illustrations of alternatives for the 3D NOR-P structure.

DETAILED DESCRIPTION

Figure 3A:
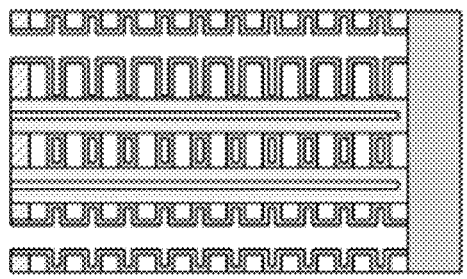
FIGS. 3A-3H are example illustrations of the formation and structure of an enhancement for the 3D NAND class of gate last.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying principles contained herein and that such embodiments fall within the scope of the invention which is not to be limited except by any appended claims, and that while elements of the embodiments are presented in some specific combination there are many other combination to mix and match these combination. Some of these alternative are detailed in here and other are possible by applying principles contained herein Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

Figure 1:
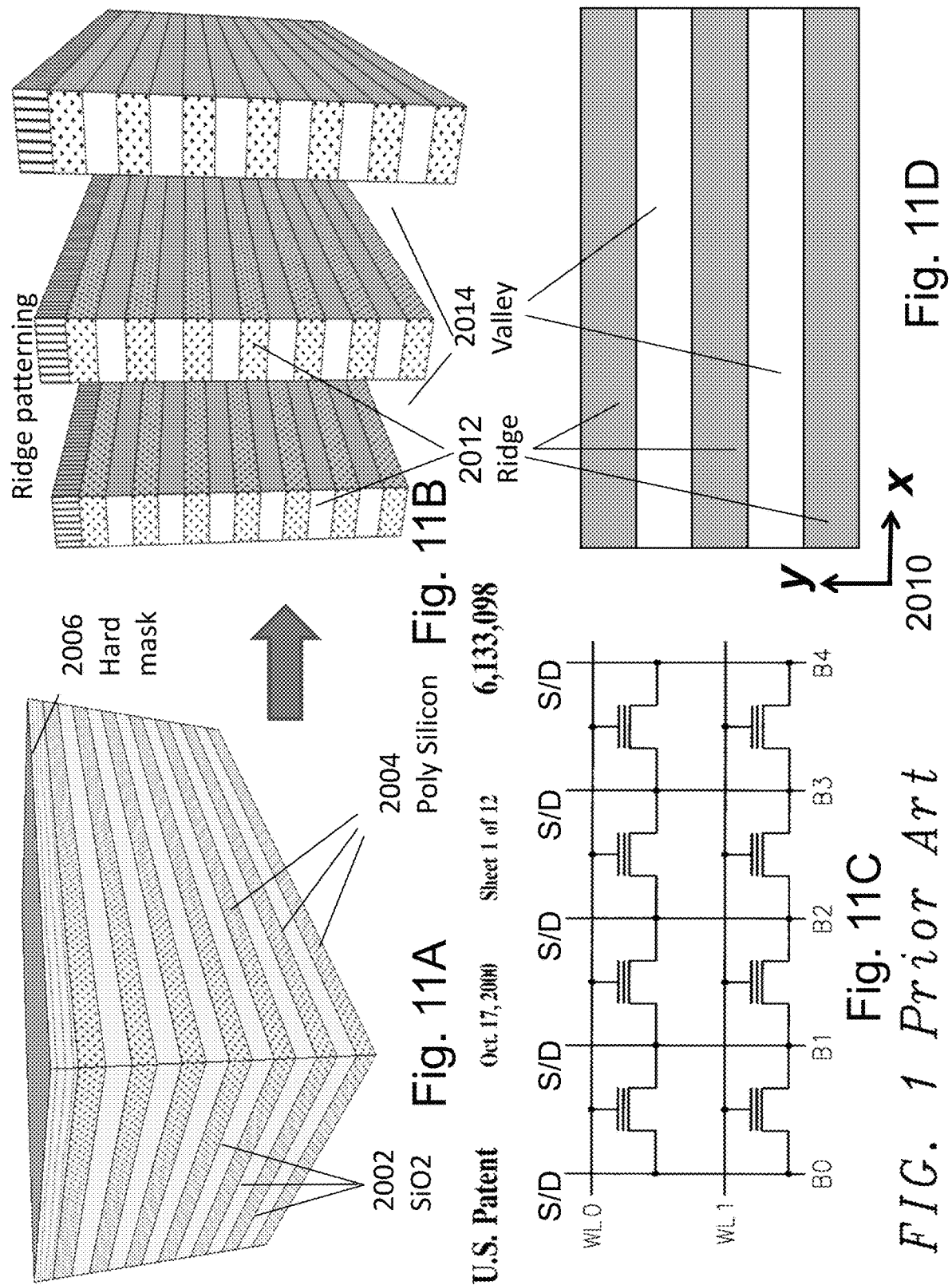
FIGS. 1A-1C are example illustrations of a prior art 3D NAND structure and a 3D NAND structure.

Most of the discussion in PCT/US2016/052726 and PCT/US2017/052359, incorporated herein by reference, is in respect to 3D NOR memory utilizing single crystal channel. Yet, these techniques could in many cases be used to improve other 3D memories such as 3D-NAND. FIG. 1A illustrates a prior art 3D NAND structure utilizing monotonic deposited macaroni shaped channel 1004 and monotonic deposited charge trap layer 1002 that is continuous along the structure. The charge trap layer could comprise tunneling oxide on the channel side, silicon nitride as a charge trapping layer, and control oxide or blocking oxide on the gate side, this structure is commonly called O/N/O. The tunneling oxide can be a simple silicon dioxide or barrier engineered oxide comprising, for example, a stack of silicon dioxide, silicon nitride, and another silicon dioxide. Alternatively, the silicon nitride of the charge trap layer or the tunneling oxide can be trap rich metal-oxide such as HfO, or other such as $Hf_xO_y$. The control oxide can alternatively be a metal oxide material such as a high-k dielectric or stack of different types of oxides. FIG. 1B illustrates an alternative presented here in which the electron mobility of polysilicon channel 1014 is being enhanced by adding a physical doping in the polysilicon channel region between cells and the charge trapping layer 1012. This could also used to reduce migration and spreading of trapped charges, particularly at elevated temperature, toward neighboring cells. These enhancements could be integrated with the well known in the art process flow and architecture of 3D NAND also called V-NAND which evolved from the introduction of BiCS technology in papers by H. Tanaka et al. titled "Bit Cost Scalable Technology with Punch and Plug Process for Ultra High Density Flash Memory" published at 2007 Symposium on VLSI Technology, and by Yoshiaki Fukuzum et al. titled "Optimal Integration and Characteristics of Vertical Array Devices for Ultra-High Density, Bit-Cost Scalable Flash Memory", published at IEDM 2007. Many improvements and derivatives are covered in a book by Betty Prince titled "Vertical 3D Memory Technologies" published by 2014 John Wiley and Sons Ltd, all of which are incorporated herein by reference. These enhancements could be integrated into many 3D Memories process and architecture. The following figures use a macaroni-shaped channel as exemplary art, it should be understood that the same process can be integrated with other form of memory channel such as fully filled vertical pillar channel or even 3D NAND with horizontal channel. Also, the same process integration may be applied to "CMOS under array" architecture presented in paper by Krishna Part et al., titled "A floating gate based 3D NAND technology with CMOS under array" published at 2015 IEDM. Alternatively, the same process integration may be applied to "Pipe-shaped BiCS" architecture presented in paper by Ryota Katsumata et al., titled "Pipe-shaped BiCS flash memory with 16 stacked layers and multi-level-cell operation for ultra high density storage devices" published in 2009 Symposium on VLSI Technology, all of which are incorporated herein by reference.

FIG. 1C illustrates an additional alternative. After the channel holes' formation and before the O/N/O deposition an isotropic etch of the inter wordline oxide such as $SiO_2$ could be performed to extend the holes in the S/D regions as illustrated shaped S/D 1022. This leads increase in effective spacing length between adjacent cells without sacrificing the stack thickness. In addition, t helps reduce the interference effect of charge trap in one channel with respect to its adjacent ones above or underneath.

FIGS. 2A-2H illustrates such enhancement for the 3D NAND class of gate first, using a side view angle illustrations. FIG. 2A illustrates the starting multilayer substrate of silicon oxide over polysilicon, where the silicon oxide works as sacrificial layer or isolation between polysilicon and the polysilicon ultimately becomes wordlines of the 3D NAND. In this figure or forthcoming explanation, it should be understood that the polysilicon could be replaced with metal when desired. FIG. 2B illustrates the structure after a vertical holes formation for the memory channel. FIG. 2C illustrates the structure after formation of O/N/O stack and polysilicon channels, substantially filling the vertical holes formed in FIG. 2B. The O/N/O stacks are formed in order of: blocking oxide, charge trapping nitride, and tunneling oxide. The polysilicon channel may be tube form like macaroni channel. In such case, the oxide deposition follows to fill out the core void within macaroni. The polysilicon channel may be substantially intrinsic or lightly doped p-type. FIG. 2D illustrates the structure after opening access for 'source contact' 1102, these openings are often called slits as unlike the channel holes 1104 these opening are often made as long slits. In some of the embodiments presented in here, the slits could be saved for improving memory density by saving the overhead associated with the area required for these slits. FIG. 2D illustrates the use of slits for every two channel holes which represent over 20% area overhead. In some 3D NAND designs the slits are made for every four six, or even eight channel holes reducing the overhead to less than 10%. FIG. 2E illustrates an enhancement step—selective removal of exposed regions of the inter wordline silicon oxide—$SiO_2$—through 'source contact' slits or holes until the surface of blocking oxide is exposed. FIG. 2F illustrates the structure after a second selective removal step—removing the now exposed regions of the O/N/O stack until the polysilicon channel is exposed. FIG. 2G illustrates the structure after selective n+ doping of the now exposed channel regions. The selective doping may be achieved by a gas diffusion process. Now the n+ regions are formed between wordlines. FIG. 2H illustrates the structure after filling of the exposed regions with isolation materials such as silicon dioxide using deposition technique like ALD and finishing with forming the conventional source contacts. An enhancement step in inter wordline oxide replacement may be that the replaced an oxide has low dielectric constant to reduce WL coupling and/or an oxide with high breakdown voltage than the original sacrificial oxide. Such process flow enables the objective been described in respect to FIG. 1B. Alternatively, the step of selective n+ doping could be enhanced further or replaced by silicidation of the exposed polysilicon in the channel. At this step, the silicidation process can silicide for both the polysilicon channel as well as the polysilicon gate, which may be referred as self-aligned silicidation, i.e. salicidation. An added advantage of the salicidation is that this flow could be used to form Schottky Barrier S/D or dopant segregated Schottky barrier ("DSSB") based device which reduces the write energy and increases the write speed, as discussed in PCT/US2017/052359 such as in respect to its FIG. 14A-14B, the silicidation process could also reduce the resistance of the wordlines 1106, having their polysilicon silicided wordline. The use of DSSB to enhance performance of a polysilicon based memory (often called 'TFT') is presented in a paper by Choi, Sung-Jin, et al., "A novel TFT with a laterally engineered bandgap for of 3D logic and flash memory," VLSI Technology (VLSIT), 2010 Symposium on, IEEE, 2010, incorporated herein by reference.

Figure 3B:
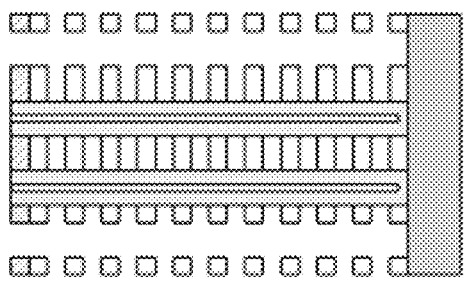
Figure 3C:
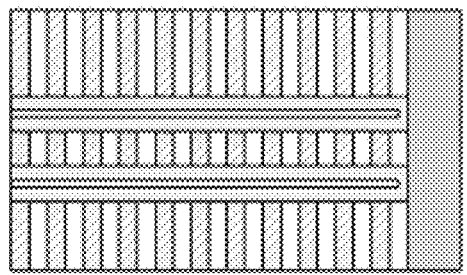
Figure 3D:
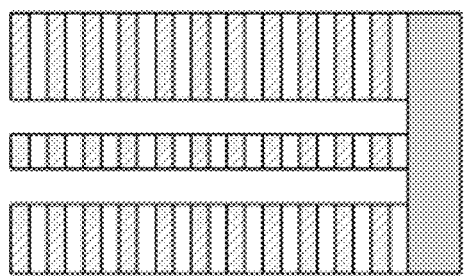
Figure 3E:
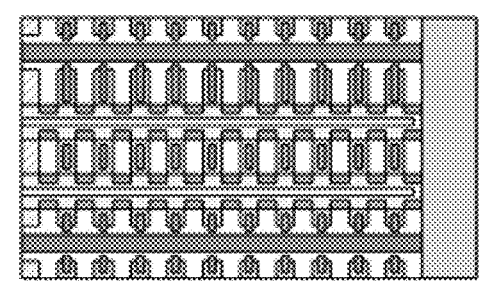
Figure 3F:
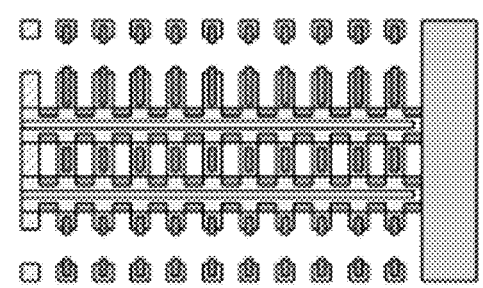
Figure 3G:
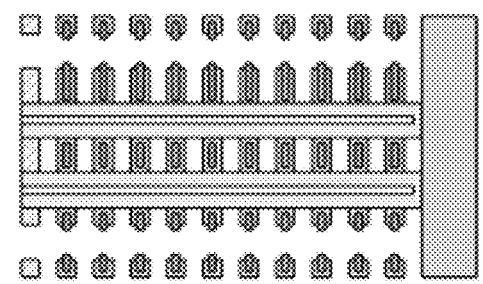
Figure 3H:
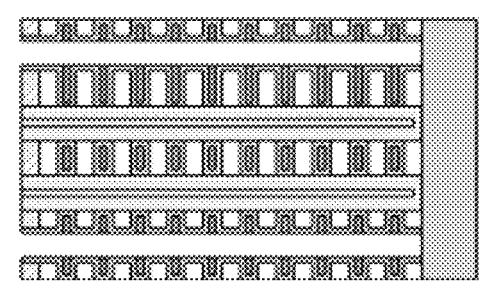

FIGS. 3A-3H illustrate enhancement for the 3D NAND class of gate last i.e., replacement metal gate process using a side view angle illustrations. FIG. 3A illustrates after vertical holes formation for the subsequent memory channel on the starting multilayer substrate of silicon oxide over nitride. The doping type polysilicon channel is substantially intrinsic or lightly doped p-type. FIG. 3B illustrates the structure after forming polysilicon channel by the similar way explained in FIG. 2. FIG. 3C illustrates the structure after opening holes or slits (valleys) for the gate replacement process; it also illustrates the nitride selective removal through the new opening until the polysilicon channel surface is exposed. These holes or slits results in area overhead as previously discussed in respect to FIG. 2D. FIG. 3D illustrates the structure after adding in the O/N/O stack using such ALD process. The O/N/O stacks are formed in order of tunneling oxide, charge trapping nitride, and blocking oxide. FIG. 3E illustrates the structure after deposition (such as ALD) of the gate material such as tungsten and subsequent anisotropic removal for the metal gate material on sidewalls so it is only sandwiched between the silicon oxide layers. FIG. 3F illustrates an enchantment step, a selective etch could be applied to remove the exposed inter wordline oxide and the O/N/O stack so as to expose the sidewall of polysilicon channel. FIG. 3G illustrates the structure after selective n+ diffusion doping of the now exposed channel regions. Alternatively, the step of selective n+ doping could be enhanced further or replaced by silicidation of the exposed polysilicon in the channel. FIG. 3H illustrates the structure after filling of the exposed regions with isolation materials using deposition technique like ALD and finishing with forming the conventional source and drain contacts. Such process flow enables the objective been described in respect to FIG. 1B.

FIGS. 4A-4H illustrates an alternative enhancement for the 3D NAND class of gate last using a side view angle illustration. The effects explained in FIG. 4 is similar to the enhancement explained in FIG. 3 yet implemented in a simpler process. FIG. 4A illustrates the starting multilayer substrate in which the silicon oxide has been replaced with phosphorous (P) doped silicate over nitride. The phosphorous-doped silicate should have a substantial concentration of n-type dopant in order to be used as the subsequent in-situ doping source for the source and drain region of the polysilicon channel. Vertical holes 1311 may be formed for the eventual channels. FIG. 4B illustrates the structure after forming polysilicon channels. FIG. 4C illustrates the completion of the enhancement by adding a thermal annealing step to cause doping via diffusion from the P-doped silicate to the in-contact channel regions. Alternatively, the diffusion doping may be performed by subsequent thermal processes due to the baseline process without any extra thermal step dedicated for the diffusion doping. In this case, the overall process flow should be substantially identical to a wafer fab's existing process. FIG. 13D-FIG. 4H illustrates the conventional completing of the memory structure, including forming vertical holes for the gate replacement, nitride removal and replacing with O/N/O and then gates, and then depositing isolation and forming source line contacts.

FIGS. 5A-5D illustrate a staircase etch flow as an alternative to those in PCT/US2017/052359 in respect to its FIG. 10A-10J, which could be adapted to multilayer structure utilized in the staircase wordline in a vertical 3D NAND such as been discussed herein in reference to FIG. 1A-FIG. 4H. It utilizes successive etch steps alternating between an anisotropic etch and an isotropic etch.

FIG. 5A illustrates a starting point of multilayer designated for staircase of alternating isolation layers, such as SiO2, and wordline material such as polysilicon or sacrificial material for wordline replacement such as silicon nitride. The concept could be adapted to other materials used as a conductor needed to have pair layer access such as tungsten. An opening 1402 may be formed through a masked layer of hard-mask 1404.

FIG. 5B illustrates after first step of anisotropic etch (arrows). This step may have two sub-steps; first etching the oxide 1406, and then etching of the polysilicon 1408.

FIG. 5C illustrates the structure after additional etch step which may use an isotropic etch. This step could have two sub-steps; first etching the oxide 1406, and then etching of the polysilicon 1408.

FIG. 5D illustrates after repeating these steps multiple times corresponding to the number of layers in the multilayer structure, thus forming a staircase for the overall structure. The hard mask and/or masking layer 1422 could be trimmed or etched as the staircase is being opened to just keep protecting the un-etched top layer 1424 and allow increased etchant access and the staircase deepens.

FIG. 6A-6D illustrates prior art of 3D NAND. FIG. 6A is a perspective 3D illustration with directional naming arrows X-Y-Z 1502, while FIG. 6B is a section cut in the XY direction, FIG. 6C is an YZ cut of the section, direction indicated by 1501, and FIG. 6D is an XZ cut, direction indicated by 1503. As illustrated, the wordline ("WL") access 1504 and 1505 is extending in the X direction along the wordline 1506 direction, thus extending the overall structure and consuming significant portion of the area.

Figure 7:
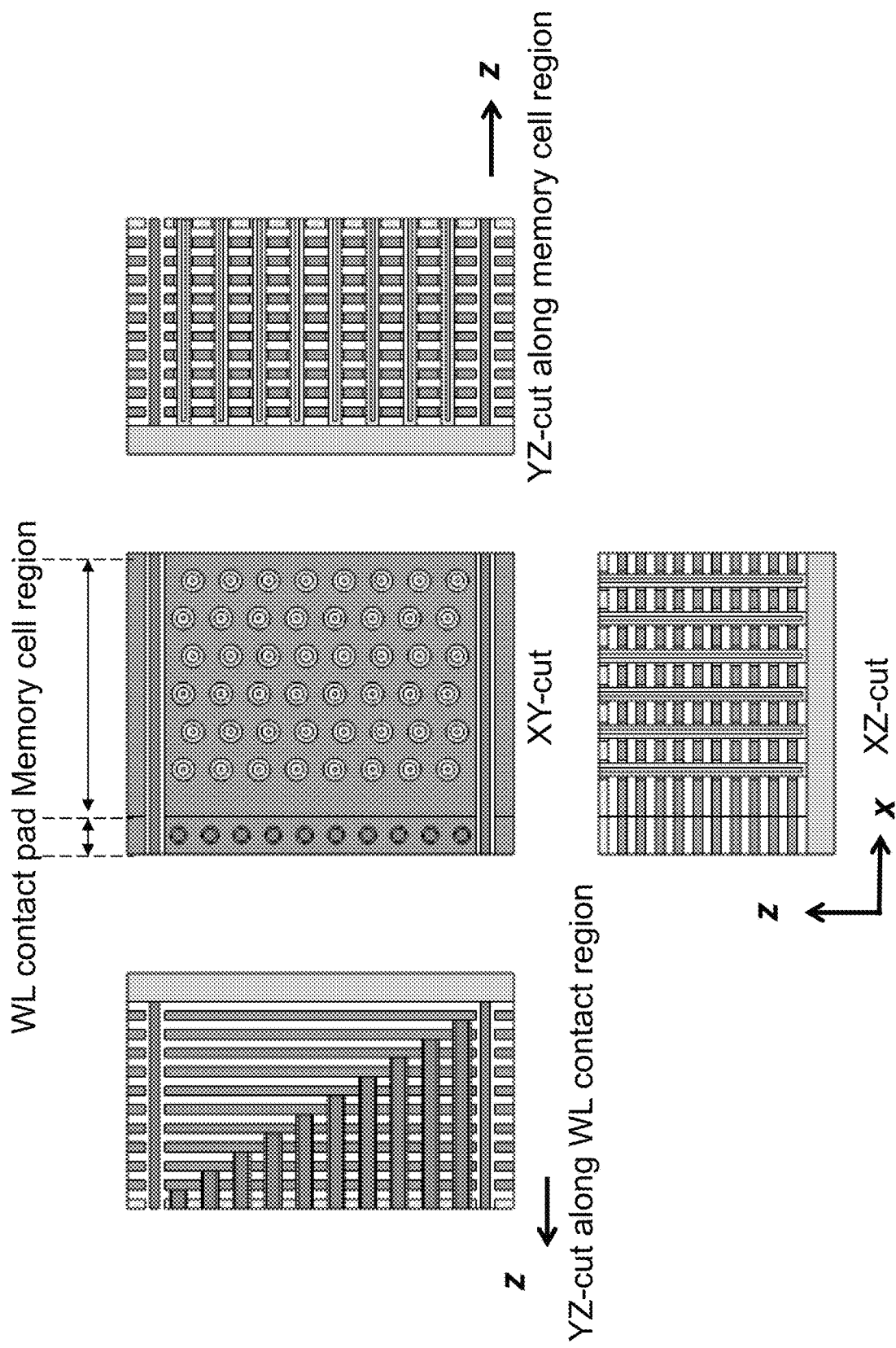
FIG. 7 is an example illustration of various cut views of a 3D NAND staircase formed and orientated in the Y-direction.

FIG. 7 illustrates an embodiment in which the 3D NAND stair-case is formed in the Y direction, vertical to the wordline orientation, and accordingly reducing the staircase extension.

Figure 8:
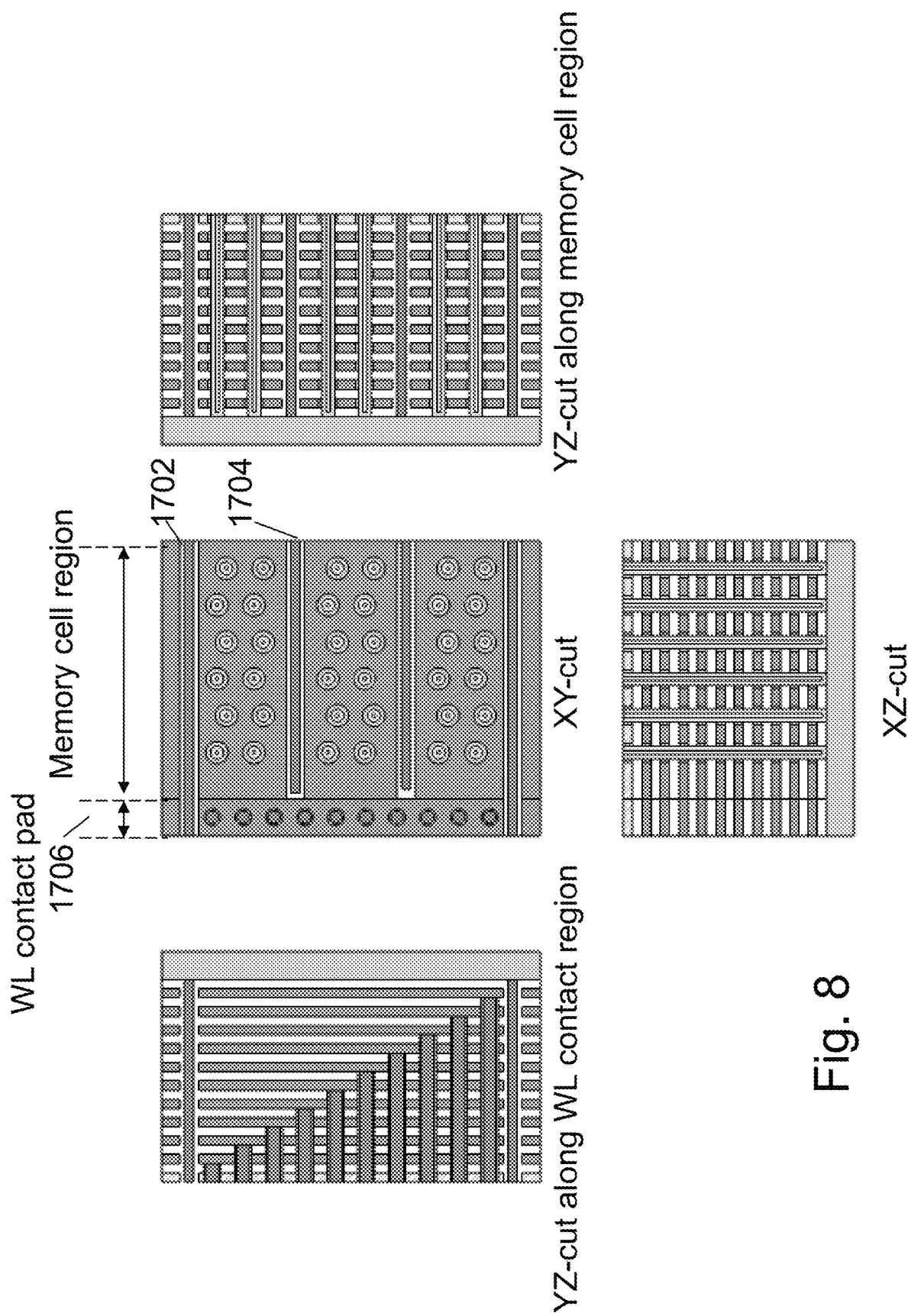
FIG. 8 is an example illustration of optional modification to support effective use of a Y direction staircase.

FIG. 8 illustrates an optional modification to support effective use of a Y direction staircase. In some 3D NAND architectures the wordlines are rather narrow in the Y direction to support holes for source line contacts which are placed more frequently in order to reduce the source side parasitic resistance and provide process margin for a replacement metal wordline process, particularly for embodiments explained in FIG. 3 and FIG. 3. As an embodiment, these holes could extend to fully isolate adjacent wordlines 1702 and 1704 and enable Y oriented staircase contact structure 1706. Despite one WL contact per layer is drawn in FIG. 7 and FIG. 8, two or more contacts maybe allocated per each WL layer.

FIGS. 9A-9H illustrate use of monolithic 3D integration for vertical channel 3D NAND. The concept of this embodiment can be applied to both vertical channel as well as horizontal channel 3D NANDs. Though the drawing adapts the conventional X-directional staircase contact, the concept can also be applied to the Y-directional WL contacts shown in FIG. 7 and FIG. 8. As presented in PCT/US2017/052359, monolithic 3D technology could be used to build the 3D NAND as an array of units each with its own memory control circuits, also called peripherals circuits, on top of the memory and underneath allowing for far better silicon area utilization (array efficiency) and far shorter memory control lines—bitlines and wordlines (from ~5 mm to 200μ). Additional enhancement could be achieved by using monolithic 3D to save the area and process for source lines access (holes or slits). This concept could be applied to any memory technology presented herein including 3D NAND, 3D NOR, 3D NOR-P, 3D NOR-C, 3D NOR-C4 and 3D NOR-P/C. The memory unit are far smaller than the 3D memory device and accordingly the device could structure of array of units such as: 16×16, 32×32, 64×64, . . . .

FIG. 9A illustrates a section of a 3D NAND formed over cut-able substrate 1802, where there is no logic fabrication process for periphery circuit but only the core memory cell process is conducted. FIG. 9B illustrates the structure after flipping the second cut-able substrate and bonding it to a first cut-able substrate and cutting off the second handling substrate 1803 out from the second cut-able substrate, wherein the top periphery logic circuit is to be formed. The second cut-able substrate may be an unprocessed wafer to yield the silicon film to be monolithically processed if desired. Alternatively, the second cut-able substrate may be a periphery logic pre-processed wafer before the transfer if desired. FIG. 9C illustrates the structure after some additional steps such as surface cleaning, polishing, and interconnection process on the overlaying layer 1804. FIG. 9D illustrates the structure after forming periphery logic circuit by either monolithic process or processed layer transfer, and subsequently forming connections of the bitlines and wordlines, bitline select gate across the top periphery logic and that of the memory cell substrate underneath. FIG. 9E-9F illustrates the structure after flipping it bonding it to a third carrier substrate and cutting off the first handing substrate out from the first cut-able substrate where the memory cells are formed. FIG. 9G illustrates the structure after flipping the fourth cut-able substrate bonding it to FIG. 9F and cutting off the fourth handling substrate out from the fourth cut-able substrate, wherein the bottom periphery logic circuit to be formed. The fourth cut-able substrate may be an unprocessed wafer to yield the silicon film to be monolithically processed if desired. Alternatively, the fourth cut-able substrate may be a periphery logic processed wafer if desired. FIG. 9H illustrates the structure after processing the connections to source line and source select gates, therefore reducing the needs for the holes or slits process in the related area overhead.

FIG. 10A-10H illustrates additional alternative of replacing the SiO2 layer of the memory stack formation structure with a second gate to increase memory density.

FIG. 10A illustrates a section of a polysilicon/SiO2 multilayer stack substrate to be first set of wordlines and isolation oxide multilayer structure for 3D NAND.

FIG. 10B illustrates the structure after forming vertical holes for the channels.

FIG. 10C illustrates the structure after filling the holes with O/N/O and channels FIG. 10D illustrates the structure after formation of the holes for source contacts.

FIG. 10E illustrates the structure after selectively etching away the SiO2 layers.

FIG. 10F illustrates the structure after selectively etching away the now exposed O/N/O regions.

FIG. 10G illustrates the structure after forming second O/N/O and second gates to be a second set of wordlines.

FIG. 10H illustrates the structure after metal or poly filling in the source line contacts following isolation layer to avoid shorts between source line and WLs.

Additional alternative is to construct a 3D NOR with horizontal polysilicon channels, horizontal wordlines, and vertical source/drain lines. The transistor schematic of the architecture is illustrated in FIG. 11C. The architecture is similar with 90 degrees' rotation of the one presented in PCT application PCT/US2016/052726 with enhancements in PCT/US2017/052359, with polysilicon channel.

FIG. 11A illustrates a section of a multilayer substrate for 3D NOR with polysilicon channel. In here 3D memory structure utilizing NOR architecture with polysilicon channel could be called 3D NOR-P. The multilayer could be form by successive depositions of polysilicon layer 2004 and then either oxidizing the top surface or deposition of isolation layer such as silicon oxide 2002. The polysilicon layer 2004 may be substantially doped to be conductive WL. In general, it is desired that the materials used for such multilayer structure could be selectively etched in respect to one another, and accordingly other material combinations could also be used to form the multilayer structure of FIG. 11A. Such multilayer substrate could be used to form various 3D NAND and other 3D memories or other electronic functions.

FIG. 11B illustrates the structure after etching valleys 2014 leaving ridges 2012 of multilayer strips. These valleys 2014 are sometimes called slits.

FIG. 11C illustrates a prior art transistor schematic of flash technology NOR architecture which is also called AND architecture as described in PCT/US2016/052726.

FIG. 11D illustrates the X-Y cut view of the same (FIG. 11B) structure. The X, Y direction is indicated 2010.

Figure 12B:
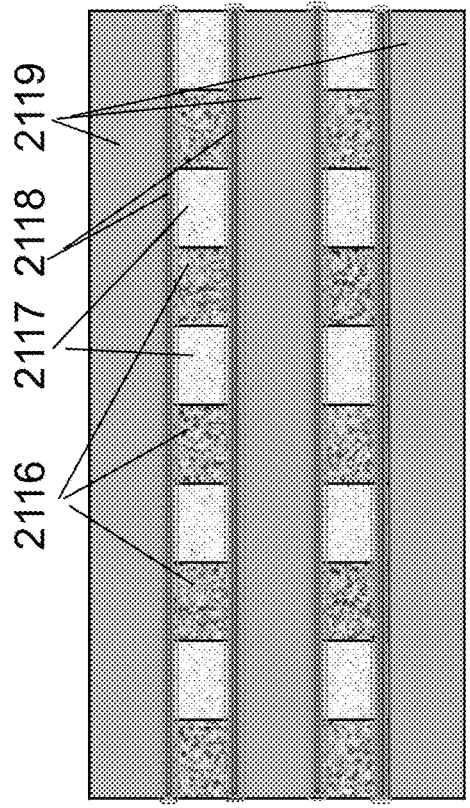
FIGS. 12A-12B are example illustrations of some additional steps of formation of a polysilicon channel 3D NOR structure (3D NOR-P)
Figure 12D:
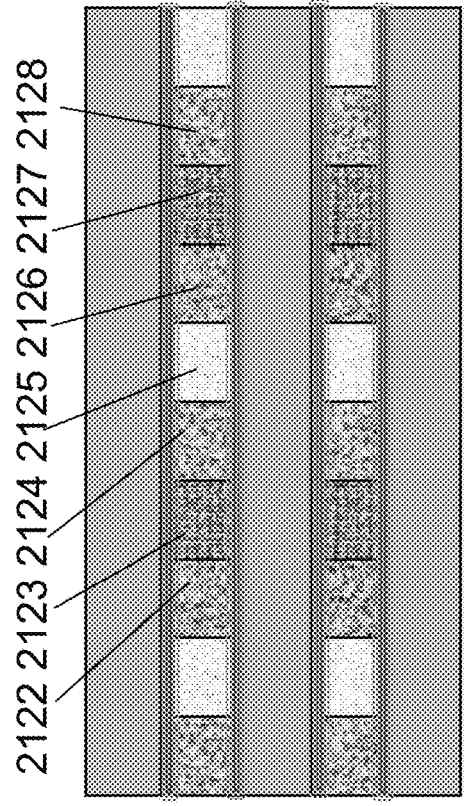
FIG. 12D is example illustration of a symmetric DSSB 3D NOR structure.
Figure 12A:
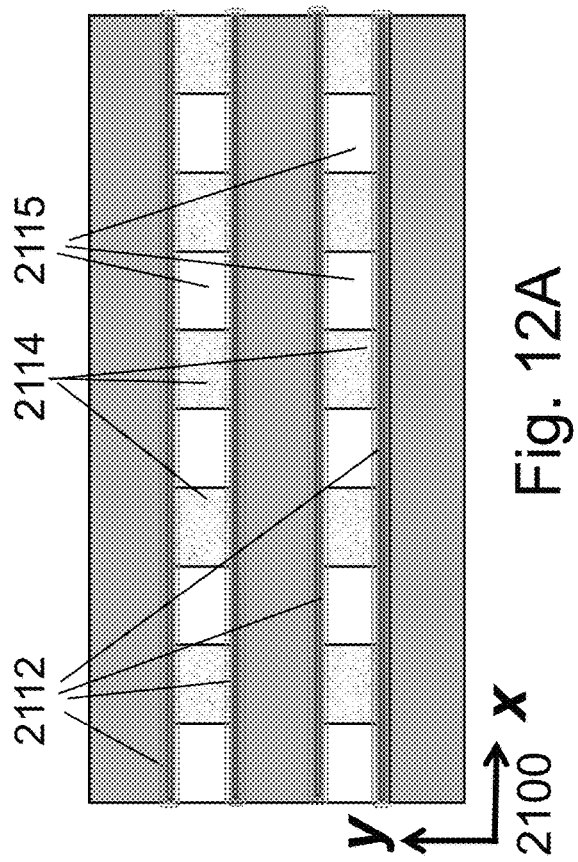

FIG. 12A illustrates the X-Y cut view of the structure after depositing O/N/O layers 2112 on the ridges 2012 sidewalls. Atomic Layer Deposition (ALD) and Low Pressure Chemical Vapor Deposition (LPCVD) could be used for such O/N/O deposition. Following the O/N/O deposition, formation of channels pillars 2114 could take place. This could be done by depositing p-type polysilicon in the valleys 2014, and then etching it out of the S/D designated regions 2115. Or filling oxide in the valley and forming a first blocking material in the S/D designated regions 2115, and then filling in the channel polysilicon, and then removes the blocking material in preparation for the subsequent S/D fill in. The polysilicon channel may be substantially intrinsic or lightly doped p-type.

FIG. 12B illustrates the structure after forming the S/D regions 2115 with n+ polysilicon 2116 pillars. The S/D may be formed by in-situ doping during deposition. The structure illustrated in FIG. 12B is the basic 3D NOR-P memory. It includes S/D 2116 of n+ columns with p-type channels 2117 in between, O/N/O on it sides and horizontal gates 2119 in X direction—the polysilicon strips in the corresponding ridge structures. These gates are the 3D NOR-P wordlines ("WL") for which staircase access could be constructed at the ridge side edges. Bitlines ("BL") could be constructed at the top forming lines in Y direction in contact with the S/D 2116 columns. Accordingly, the structure of FIG. 12B is compatible with the NOR schematic of FIG. 11C. A similar 3D NOR structure is presented in U.S. Pat. Nos. 8,203,187 and 8,426,294, both incorporated herein by reference. A 3D NOR structure similar to the one illustrated in FIG. 11C is presented in U.S. Pat. Nos. 8,203,187, 8,426,294, 8,437,192, 9,589,982 and U.S. applications 2017/0092370, 2017/0092371, and Ser. No. 15/343,332, and also published as WO2017091338, all of which are incorporated herein by reference.

An alternative for the above could be formed by replacing of the n+ polysilicon with silicidable metal. The silicidation process could be done to reduce the S/D resistivity or as part of the process with additional annealing for forming Schottky Barrier (SB) for the S/D 2116 to improve the memory performance of the memory cell.

Alternatively, Dopant Segregated Schottky Barrier (DSSB) could be implemented. The silicide process may be accomplished by chain deposition of the polysilicon and followed by the metal filling.

Figure 12C:
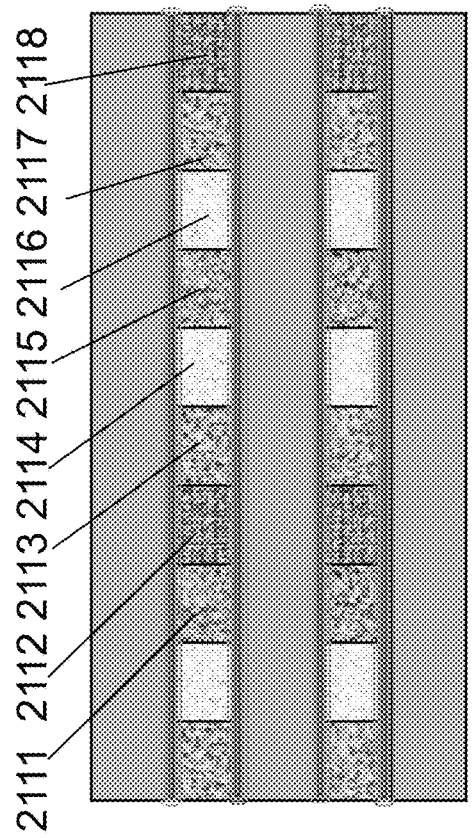
FIG. 12C is example illustration of an asymmetric DSSB 3D NOR structure.

FIG. 12C illustrates an asymmetric cell in which for each cell only one of its S/Ds is silicided to form SB or DSSB. For this a column space is left clear or open by etch and later filled with silicide material 2112, 2118. Then the structure is annealed forming DSSB in the adjacent S/D column 2111, 2113, 2117. Accordingly, channel 2114 could have one of his S/D as DSSB 2113 and the other 2115 as n+. It adjacent cell could have channel 2116, common S/D of n+ 2115 and the other S/D 2117 as SB or DSSB. For one side silicide NOR-P, the silicide region may be connected to the source region and the non-silicide region maybe connected to the bitline region. This leads the memory operation by source side injection for writing yet alleviates the ambipolar transport characteristics for read.

FIG. 12D illustrates an alternative structure in which both S/D are DSSB. It is constructed by allocating every second channel column of FIG. 12B for silicide metal to be added in after the deposition of the n+ polysilicon, 2123, 2127. After short annealing, all the S/D 2122, 2124, 2126, 2128 becomes SB or DSSB. The channel of the cell 2125 now has both S/D as SB or DSSB with the enhancement in write efficiency associated with SB or DSSB memory cells. The process flow could start with a structure similar to the one in FIG. 12B in which the S/D regions 2116 are made wider in X direction in order to secure the space for metal fill, then at the center of the wider S/D a hole is etched and filled with silicidation materials such as Co, Ti, Ni or other metals as desired. The deposition could be done using ALD for precise control or by other techniques such as sputtering and evaporation. For the all silicide NOR-P, the multi-bit operation maybe desired by the art known as minor-bit technology. The ambipolar characteristics maybe compensated by low bitline read voltage such as 0.8V, 0.6V or less.

These are a few of the effective variations and enhancement which be applied for these 3D NOR-P structure. These could be applied to each of the alternatives referenced in FIG. 12B, FIG. 12C and FIG. 12D. For simplicity, these alternatives are presented in respect to the structure of FIG. 12B and an artisan in semiconductor flash memory technology could adapt them to the similar alternative structures. These alternatives and enhancements could be combined as mix and match even of those that are presented herein each one by itself. Additionally other variation could be applied for the flow presented in respect to FIG. 12A-FIG. 12D, including filling periodic column with isolation material to reduce risks of read or write disturb, and various mix of n+ S/D, and metallic S/D including mix of SB and DSSB.

FIG. 13A illustrates ridge splitting by a deep etch slit formation, thus splitting one valley into two new valleys 2202. Splitting the ridges could be used to replace the polysilicon gate material such as by tungsten. This process could be applied with silicon oxide/silicon nitride as a starting multilayer stack so having layers 2004 of FIG. 11A being nitride instead of polysilicon. Additional use of ridge splitting could be to have two independent gate lines for each channel which are not shared with the adjacent ridge. These allow simpler addressing of the independent storage on each of the channel two facets at one channel and reduce the risk of read or write disturb.

Additional enhancement for the 3D NOR-P could be achieved by extending the charge trap surface to better support minor-bit. A known advantage with charge-trap NOR architecture, utilizing hot electron programming technology, is minor-bit doubling the storage sites (source side and drain side) per facet. FIG. 13B illustrates such surface extension that could be achieved by the proper setting of the mask structure for the ridge formation, or by a step of isotropic etch to extend the S/D regions after the ridge formation. Then O/N/O is deposited as illustrated having the S/D regions 2206 extend outside while the channel regions 2208 pulled inside. An artisan in the semiconductor art understands that while FIG. 13B illustration show sharp corners the structure as processed would have round corner forming wave like structure extending the charge trap surface. Such extension could result in more than 10% longer effective channel length and charge-trap surface 2206 distance in X direction 2200 at fixed physical channel length compared to the distance between the corresponding S/D.

FIG. 13C is a 3D illustration of the 3D NOR-P structure with an alternative to ridge splitting illustrated in FIGS. 13A and 13B, such as valleys 2202. Using 3D reference ordinals X-Y-Z 2210, FIG. 13C illustrates trench 2212 along the Y direction which could be considered as an S/D separation. Through such a trench, a selective etch of the oxide in-between the Wordlines may be performed, and then etch of the silicon of the channel pillar could be performed. The relative density of these trenches could be designed for a specific structure in consideration of the etch process selectivity, etch chemistry starvation, and the physical sizes of the relevant pattern. Such a Y-oriented trench could be used as alternative to ridge splitting for many of the processes in which reference is made to ridge splitting. Valley access processing could also be utilized in other processing schemes described herein, such as, for example, the wordline staircase related processing.

Some of the enhancements presented herein for the 3D NAND could be incorporated into the 3D NOR-P. For example, in FIG. 1C herein a vertical effective channel length extension is illustrated to vertically extend the charge trap surface. This could be used for the 3D NOR by utilizing a short isotropic and selective etch of the SiO2 regions exposed in the valleys prior to the O/N/O depositions, or alternatively by a short isotropic and selective etch of the wordline regions exposed in the valleys prior to the O/N/O depositions. Such could form a curve like 1022 instead of the straight vertical walls. The 3D NOR-P presented in here is a generic technology which could be engineered in many ways to many products architecture. It could have just few layers such as four having its starting substrate 4 pairs and one more on top or hundreds of layers. It could have a layer pair at 100 nm thickness so for 10 memory layers the multilayer structure could have a height of about 1,050 nm and so forth. It could have thinner layers so a pair could be about 40 nm or thick layers having the pair at about 200 nm. The multilayer height plays an important role for the memory cell size due to etch and deposition process limitation and with consideration of the aspect ratio required. The valley or the slits 2014, 2202 could be narrow of few tens of nm or wide more than 100 nm or even 200 nm. The channel pillars could be round or square or truncated square, or ellipsoid with minimum X-Y cut few tens of nm or more then 50 nm or more then 100 nm and S/D could have similar X-Y cut size. The layers forming the multilayer could have similar thickness or very different such 20 nm for the oxide and 80 nm for the polysilicon. These size options and variation are relevant to the various architecture and multilayer composition in here.

Additional alternative enhancement is to extend the number of memory storage site area within a facet, by extended electrical field control from the adjacent gate above or below in a similar way to what has been presented in PCT/US2016/052726 in respect to FIG. 10B and in respect to FIG. 16 to FIG. 35B in U.S. application Ser. No. 15/333,138, incorporated herein by reference. This could be implemented by modifying the multilayer of FIG. 11A so that every second polysilicon layer is changed to a nitride layer. For such flow the multilayer substrate could now comprise unit of three layers stack materials having etch selectivity between them. FIG. 14A is a cut along Y-Z axis 2300 illustrating a section of one valley with two ridge portions on its side of such the unit of three layers stacks. The first layer 2311 could be oxide the second layer 2312 could be first set of polysilicon, the third layer 2313 could be oxide, the fourth layer 2314 could be nitride replacing the second set of polysilicon, the fifth layer 2315 could be oxide, the sixth layer 2316 could be polysilicon, the seventh layer 2317 could be oxide, the eighth layer 2318 nitride and the top layer 2319 oxide. This could be cycle multiple times to the desired number of memory sites in the Z direction. The cycle is been represent by the layers 2311 to 2314. The process to form channel indentation could be as follows.

FIG. 14B illustrates the structure after selective isotropic etch of the n+ polysilicon layers 2312, 2316 to form indentation structure, and filling in with protection oxide 2322, followed by anisotropic etch to clean the valley sidewalls off the protective oxide. FIG. 14C illustrates the structure after complete removal of the nitride layers 2314, 2318 by selective isotropic etch. FIG. 14D illustrates the structure after extremely conformal atomic layer deposition of second set of n+ polysilicon as replacement of the etched nitride, and cleaning the valley using anisotropic etch from excess of polysilicon from the valley. FIG. 14E illustrates the structure after selective isotropic etch of the unprotected second set of n+ polysilicon 2326 forming the indentation. FIG. 14F illustrates the structure after selective isotropic etch of the initial polysilicon oxide protection and preparing the valley for O/N/O deposition. FIG. 14G illustrates the structure after O/N/O deposition 2330. The structure could now be processed with channel and S/D deposition similar to flow illustrated in respect to FIG. 12A-12D.

A variation of such flow could be used to form floating gate as an alternative to charge trap by replacing the nitride with polysilicon.

FIGS. 15A-15C illustrate another enhancement of the 3D memory structures having per S/D pillar select gate integrated directly on top of each S/D n+ pillars. In conventional 3D NAND, the select gate is formed in part of the channel string that is a part from the S/D. In this enhancement, the select gate is directly formed on top of the S/D. FIG. 15A illustrates a top view of 3D NOR-P structure. The structure illustrates an alternative to have the staircase along Y direction in orthogonal orientation to the ridge direction similar FIG. 7 and FIG. 8. The Wordlines (WL) could be grouped in two groups 'Odd-Group' 2410 and 'Even Group' 2402. This may support independent control of the two channel facets at a single ridge pitch for increase storage density. The valleys illustrated in FIG. 15A hold two channels 2406, 2408, and three S/D 2405, 2407, 2409.

FIG. 15B illustrates the top view showing the staircase per layer contacts 2412, 2410, and per pillar select transistor 2413 sitting on the very top or the very bottom of each of vertical S/D column. These per pillar select transistors could be integrated on both sides of the pillars Similar to some of these structures, a step of opening access to bottom select transistor could be used after the deposition of the O/N/O layers and before the filling of the S/D pillars.

FIG. 15C illustrates the structure with the select transistors to the S/D pillar gated by X direction select lines SL1-SL7 in parallel to WL, and bitlines BL1-BL3 along the Y direction to enable selecting single channel without having per ridge control on the wordlines.

In many of the 3D NOR structures herein a metallic S/D using SB or DSSB for high speed operation is suggested. In those cases and wherein the channel body is non-floating, there is potential disturb when the adjacent cell is being written. To reduce such a disturb, a few options could be considered, for example, such as the use of controlled channel access to disable the unselected adjacent cell by applying positive or negative voltage biases according to the write or erase disturb cases while the selected transistor's channel is grounded.

Many other memory control lines architecture could be used including adding a transistor selector per S/D pillar and use of both sides of the array as presented herein such as in respect to FIG. 9A-18H.

Additional enhancement alternative is forming per-layer access through electrical pathway programming rather than through physical stair-case etching and contacting, such as presented in PCT application PCT/US2016/052726 in respect to its FIG. 43, incorporated herein by reference such per layer access could be called in here—'programmable per layer'. To integrate per-layer contact programming into the 3D NOR-P we could add in ridge-select per wordline transistor. In this embodiment, the ridge refers to the wordlines unlike the ridges of PCT/US2016/052726 being used for S/D lines. Such ridge select transistor could be made within the highly-doped polysilicon wordline being polysilicon channel of junction-less transistor mechanism as presented in Chen, Hung-Bin, et al. "Characteristics of gate-all-around junctionless poly-Si TFTs with an ultrathin channel." IEEE Electron Device Letters 34.7 (2013): 897-899. If the wordline are to be replaced with metal such as tungsten is discussed in reference to FIG. 13A, then the region for the ridge select transistor could be processed to be semiconductor such as by having them left as polysilicon or replaced with polysilicon (lightly doped or undoped).

FIG. 16A is a top X-Y 2500 cut of 3D NOR-P structure as alternative to the one in reference to FIG. 15A. In here, the ridge section at the edge 2505, 2508 is extended to give room for the gate line of the Ridge Select ("RS") transistor integrated into the wordline. The per layer connections (staircase) could be formed in the Y direction segments 2502, 2510, and multiple memory cells could be formed in the main part of the structure 2506. While FIG. 16A illustrates two channels for the memory cell regions, many more cells could be made to provide better array efficiency having the main part of the memory 2506 extended much farther in the X and Y direction. FIG. 16A illustrates a Ridge Select ("RS") transistor on each wordline (WL) as illustrated for RS2 having gates 2512 controlling the ridge select transistor RS2 having channel 2514 and source and drain 2516, 2518 within the wordline. The ridge select transistor could be formed in a similar way to the ridge select formation in PCT application PCT/US2016/052726 in which it also referred as JLT. Accordingly it could be made as a junction-less transistor (JLT) by having its width or height at the channel region less than about 20 nm or less than about 10 nm or less than about 5 nm. The polysilicon at the channel region could be replaced from n++ to N− or even to P+ for which it could function as inversion mode transistor. Other option could be Schottky Barrier transistor. These variations could be engineered by person in the art and could be designed to reduce cost and complexity including proper integration with the other processing steps of the 3D NOR-P including use of the O/N/O deposition (ALD) for the gate oxide.

Having a ridge-select reduce the need for per pillar select 2413 of FIG. 15B. Yet to allow independent access to each of the channel facets, the bitlines oriented in the Y direction could be split to odd and even as illustrated in FIG. 16B. So there could be two bitlines for each column in the Y direction of pillar contacts 2530. So the 'odd' bitlines BL1-BL5 may be designed with strips to connect with the 'odd' pillar contacts while the 'even' bitlines BL2-BL4 may be striped to connect to the 'even' pillar contacts.

Additional structure that could be added in, to support 'programmable per layer' access, is programmable vertical transistors as is presented herein in reference to FIG. 17A-17F. FIG. 17A illustrates a cut view along X-Y direction 2600 of a small section of 3D NOR-P. It shows the memory array region 2608 and the added vertical transistors region 2606 in which the vertical transistor gate 2614 controls vertical channel connecting between overlaying wordlines 2612, the horizontal ridge select region 2605 and per layer access region 2602 having strips along Y direction providing per layer contacts to the even wordlines. Also shown are direct contacts to only the upper most wordline 2616.

A vertical transistor formation process is presented in respect to FIG. 17B-17F, which illustrates cut-view along Y-Z direction 2620 of one pillar of vertical transistors as marked by the dash line 2621.

FIG. 17B illustrates the region following the ridge formation process showing multilayer of inter-WL dioxide 2621, 2623, 2625, 2627 to be replaced with the polysilicon for channel portion of vertical transistor, and polysilicon 2622, 2624 and 2626 which is the original portion of highly doped wordlines. FIG. 17C illustrates the first step of inter-WL oxide replacement using lithography to expose the sidewall and selectively remove the inter-WL oxides in the designated regions for the channel of the vertical transistors. FIG. 17D illustrates the structure after filling in with boron doped polysilicon for the vertical transistors channel, assuming WLs are n+ doped. Anisotropic etch could then be used to clean excess deposited polysilicon leaving it only in the regions between wordlines. FIG. 17E illustrates the structure of the vertical pillar of n+/p/n+/p/n+/p/n+ after O/N/O 2632 deposition on the ridges sidewalls. FIG. 17F illustrates the structure after deposition of the vertical transistors gates 2634, which could be represented in FIG. 17A by 2614. Now the formation of the elements for constructing 'programmable per layer' access has been presented FIG. 18 could be used to present it.

Figure 18:
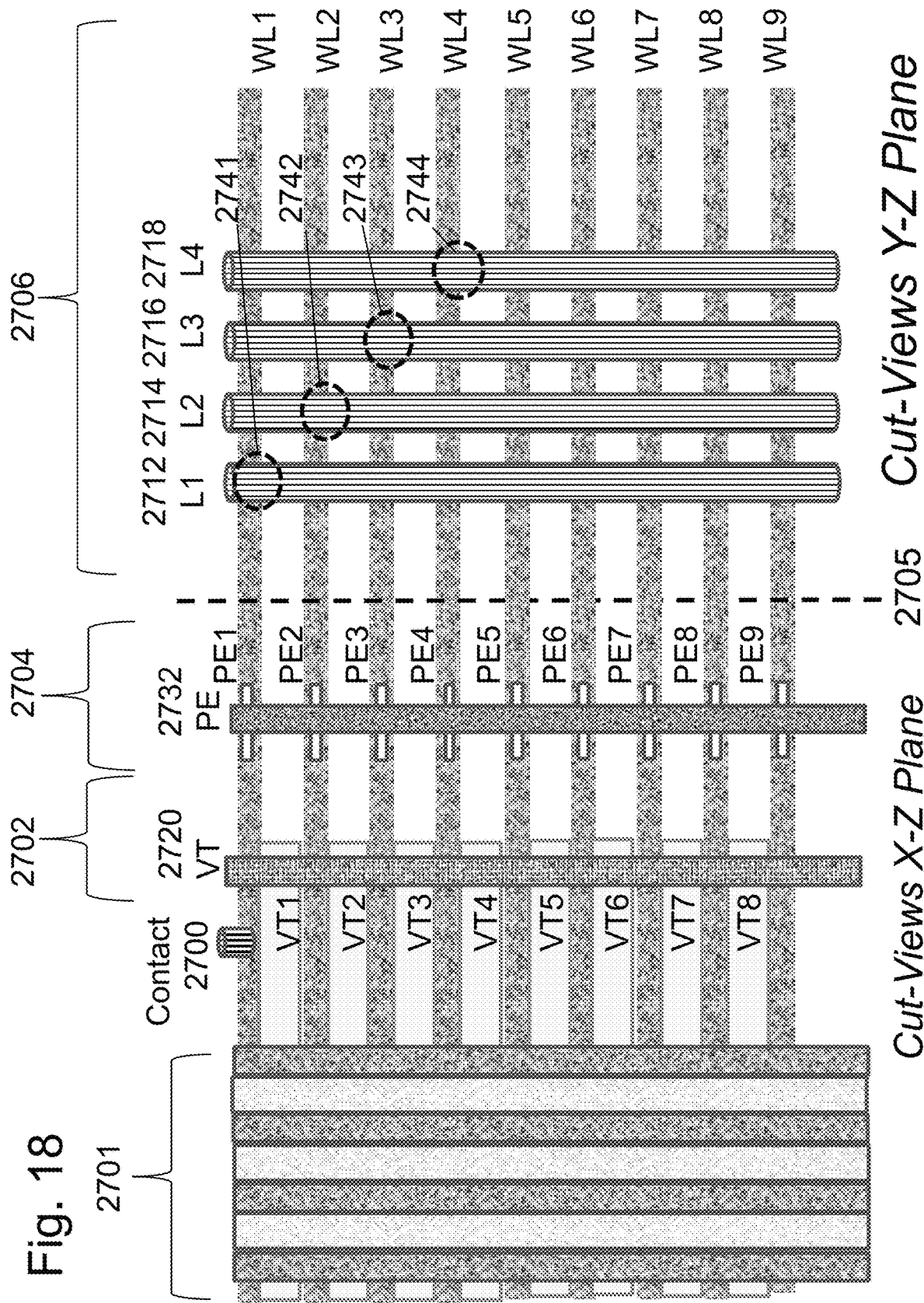
FIG. 18 is an example illustration of a description of per layer contact programming, 'ripple method'.

FIG. 18 is adapted from FIG. 43 of PCT/US2016/052726 to be reference for the description of the per layer contact programming which could be used as alternative to staircase known in the art for per layer access for 3D NAND and other 3D memories. The programming is performed in ripple method according to the number of wordline layer in the memory structure so as to form individual contact access to each layer. FIG. 18 combines two cut view one cut view in X-Z direction is along the ridge direction showing the memory array portion 2701, the contact to the upper most wordline 2700, pillar of vertical channel transistors (VT1-VT8) 2702 region, and Programming Enable horizontal transistors 2704 (PE1-PE9) region. These Programming Enable transistors are similar to the ridge select transistor assigned for the function to support per layer contacts by programming. These transistors do have O/N/O so they could be individually programmed to be always 'on' or always 'off'. The second portion separated by dash line 2705 is cut view along Y-Z direction showing the Y oriented strips of the wordline 2706 region, with per layer connection to metal pillars 2712, 2714, 2716, 2718 which are the physically similar tall metal pillars to be respectively fused one pillar to one WL to provide connect to each WL.

The ripple programming 'RP' concept could utilize programming transistors using FN type programming Programming using Fowler-Nordheim ("FN") tunneling into the charge trap could allow programming transistors to be always 'off' under zero or high gate voltage or always 'on' under zero gate voltage or un-programmed. It could allow controlled rippling from one transistor then to the one underneath him, using the one already programmed, into the depth of the device from the top layer all the way to the bottom layer. The vertical per layer contact could be made using one time programmable (OTP) memory or RRAM technology in which electrical signal can form a conductive link between two electrodes. One of these electrodes could be the wordline WL1-WL9 and the other could be the contact pillars L1-L4. The total number of the contact pillar could be according to the number of the WLs layers in the 3D structure.

When forming anti-fuses for OTP or resistive switching film for RRAM, the electrode structure may contain sharp corners. For example, in order to introduce a sharp corner, the inter-WL layer oxide may be indented by, for example, an isotropic oxide etch after punching holes and before filling vertical contact pillars (L1-L4). Then, each WL could include a top and bottom sharp corner on its sidewall. When programming, the electric field is intensified at the corner region, which can localize the fuse forming region. The result of having sharp corners leads to reduced programming voltage, and a reduction in the resistance tail in the distribution.

The connection from a layer's wordline to a vertical electrode can be made as desired. As one embodiment of the ripple programming, a single metal contact with a single wordline may be utilized. For example, L1 contacts with WL1, L2 contacts with WL2 and so forth through ripple programming the OTP or RRAM formed between respective pair of Ln and WLn. The sequence of ripple programming is described using the symbols of FIG. 18 and status table as follows:

1. Prior to start, all programmable transistors are un-programmed and accordingly function as gate controlled transistors. Use VT gates 2720 to set the ridge vertical transistor to an ON state. Thus, the same voltage is applied to all WL lines with the voltage applied to WL1 by WL1 contact 2700. Using VT gate 2720, all the Ripple Transistors (VT1-VT8) are programmed to an always OFF state ('X'), overdrive could be used at this phase to guarantee that all the vertical transistors in the VT pillar are program to always off. The VT dual facet of the vertical transistors could be controlled independently to farther support this always off programming.

2. Use the WL1 contact 2700 through PE1, and the metal vertical electrode 2712 L1 to activate the OTP/RRAM 2741 connecting L1 to WL1.

The status table is now—

| Ripple Transistors | | | Programming Enable Transistors | | | | OTP/RRAM | | | |
|---|---|---|---|---|---|---|---|---|---|---|
| VT1 | VT2 | VT3 | PE1 | PE2 | PE3 | PE4 | WL1-L1 | WL2-L2 | WL3-L3 | WL4-L4 |
| X | X | X | | | | | ON | | | |

3. Use L1 and PE to program PE1 to always OFF.
The status table is now—

| Ripple Transistors | | | Programming Enable Transistors | | | | OTP/RRAM | | | |
|---|---|---|---|---|---|---|---|---|---|---|
| VT1 | VT2R | VT3 | PE1 | PE2 | PE3 | PE4 | WL1-L1 | WL2-L2 | WL3-L3 | WL4-L4 |
| X | X | X | OFF | | | | ON | | | |

4. Use WL1 contact 2700 and VT 2720 to 'ripple' program VT1 to always ON.
The status table is now—

| Ripple Transistors | | | Programming Enable Transistors | | | | OTP/RRAM | | | |
|---|---|---|---|---|---|---|---|---|---|---|
| VT1 | VT2R | VT3 | PE1 | PE2 | PE3 | PE4 | WL1-L1 | WL2-L2 | WL3-L3 | WL4-L4 |
| ON | X | X | OFF | | | | ON | | | |

5. Use WL1 contact through VT1 and PE2, and L2 to activate the OTP/RRAM 2742 of WL2 to L2.
The status table is now—

| Ripple Transistors | | | Programming Enable Transistors | | | | OTP/RRAM | | | |
|---|---|---|---|---|---|---|---|---|---|---|
| VT1 | VT2R | VT3 | PE1 | PE2 | PE3 | PE4 | WL1-L1 | WL2-L2 | WL3-L3 | WL4-L4 |
| ON | X | X | OFF | | | | ON | ON | | |

6. Use L2 and PE to program PE2 to always OFF. The status table is now—

| Ripple Transistors | | | Programming Enable Transistors | | | | OTP/RRAM | | | |
|---|---|---|---|---|---|---|---|---|---|---|
| VT1 | VT2R | VT3 | PE1 | PE2 | PE3 | PE4 | WL1-L1 | WL2-L2 | WL3-L3 | WL4-L4 |
| ON | X | X | OFF | OFF | | | ON | ON | | |

7. Use WL1 contact and VT to program VT2 to always ON.
The status table is now—

| Ripple Transistors | | | Programming Enable Transistors | | | | OTP/RRAM | | | |
|---|---|---|---|---|---|---|---|---|---|---|
| VT1 | VT2R | VT3 | PE1 | PE2 | PE3 | PE4 | WL1-L1 | WL2-L2 | WL3-L3 | WL4-L4 |
| ON | ON | X | OFF | OFF | | | ON | ON | | |

8. Use WL1 contact through VT1, VT2 and PE3, and L3 to activate the OTP/RRAM 2743 of WL3 to L3.

The status table is now—

| Ripple Transistors | | | Programming Enable Transistors | | | | OTP/RRAM | | | |
|---|---|---|---|---|---|---|---|---|---|---|
| VT1 | VT2R | VT3 | PE1 | PE2 | PE3 | PE4 | WL1-L1 | WL2-L2 | WL3-L3 | WL4-L4 |
| ON | ON | X | OFF | OFF | | | ON | ON | ON | |

6. Use L3 and PE to program PE3 to always OFF.

The status table is now—

| Ripple Transistors | | | Programming Enable Transistors | | | | OTP/RRAM | | | |
|---|---|---|---|---|---|---|---|---|---|---|
| VT1 | VT2R | VT3 | PE1 | PE2 | PE3 | PE4 | WL1-L1 | WL2-L2 | WL3-L3 | WL4-L4 |
| ON | ON | X | OFF | OFF | OFF | | ON | ON | ON | |

And the ripple flow could be continued to form the per-layer connection, activating the OTP/RRAM 2744 of WL4 to L4 and so forth.

Techniques known with OTP could be used to reduce the OTP connection resistance. These may include use of multiple vertical electrodes programmed independently and used in parallel to provide good per layer connection using such ripple programming Various programming techniques may also be utilized; for example, bipolar programming with soak cycles, mono-polar with soak cycles, etc. Alternatively, RRAM could be used instead of OTP.

Such programmable techniques for forming memory control line per layer connections could also be used as part of yield improvement redundancy and repair techniques generally used for memory products. Additionally the techniques presented herein in respect to FIG. 18 for a programmable per layer access could be adapted to the 3D NAND memories by an artisan in 3D NAND memories.

Having the per layer connection (physical staircase or electrically programmable) along the Y direction orthogonally aligned to the ridge direction reduces the area overhead associated with per layer access. Combined with a 3D integration of memory control circuits transferred and added on top and/or under the memory matrix, supports having the array built from many micro-arrays, each micro-array now with its own memory control circuits. Such micro array or unit could have X direction and Y direction sizes of a few tens of microns, or few hundreds of microns. Reducing the parasitic capacitance and series resistance of the memory control lines provides lower power dissipation and higher speed for the memory device.

An additional embodiment is to add $2^{nd}$ gates to the 3D NOR-P. FIG. 19 illustrates a X-Y 2800 cut view of a multilayer region that have gone through ridge formation and having its designated channel regions 2816 protected (from a later process), for example, by resist or hard mask or a combination of them. Then the sidewalls of the designated S/D regions 2814 are coated with protective material which could comprise nitride and/or tunneling oxide, which may be used for the future O/N/O or a sacrificial oxide may be used, or other protective material. The protective material could be placed along the full ridge walls at the S/D regions, or just for the layers designated for the $2^{nd}$ gate as will be presented in respect to FIG. 20A-20C.

FIG. 20A is a Y-Z 2900 cut view along a designated S/D region marked by 2815 in FIG. 19. Layers 2912, 2914, 2916, and 2918 are designated for the $1^{st}$ gates and could be made from doped (n+) poly-silicon or nitride to be later replaced. Layers 2911, 2913, 2915, 2917, 2919 are designated for the $2^{nd}$ gates and could be made from sacrificial oxide replacement. In this Figures, the inter-gate oxide is not drawn but it is assumed that there is proper isolation layer between $1^{st}$ and $2^{nd}$ gates.

FIG. 20B illustrates the structure after isotropic short etch of the exposed regions of the designated $2^{nd}$ gates forming indentations 2922 to be filled by the protective material 2924 as illustrated in FIG. 20C. This flow is similar to the one presented in respect to FIG. 14B.

FIG. 20D is an X-Y 2800 cut view along a designated $2^{nd}$ gate 2925. It illustrates the structure after cleaning the excess protective material and the channel regions protection 2816 and depositing the desired O/N/O layers 2936. The structure has now protection for the S/D regions 2934 and no protection for the channel regions 2935.

FIG. 21A is an X-Y 3000 cut view illustrating the structure of FIG. 20D after deposition of p-type channels poly-silicon 3014, and the S/D n+ type polysilicon 3016. It also illustrates the protections 3015 for the S/D regions.

FIG. 21B is an X-Y 3000 cut view illustrating the structure of FIG. 21A after ridge split etching 3024.

FIG. 22A is an Y-Z 3100 cut view along channel region as indicated 3026 in FIG. 21B.

FIG. 22B is an Y-Z 3100 cut view illustrating the structure of FIG. 22A after selective isotropic etch 3122 of the oxide layer designated for $2^{nd}$ gates. The etch access is through the ridge splitting opening.

FIG. 22C is an Y-Z 3100 cut view illustrating the structure of FIG. 22B after successive isotropic selective etch. Etching the O/N/O in the opening 3124 and then the channels 3126 through the opening. This etch being isotropic would form an undercut—not shown—into the active channel, that should be made thick enough to support such undercut. This undercut could function as a channel extension just as presented elsewhere herein via an indentation etch process.

FIG. 22D is an Y-Z 3100 cut view illustrating the structure after adding of $2^{nd}$ gates isolation or O/N/O 3136 and second gates 3134. These gates could comprise conventional gate material such as polysilicon and/or tungsten. The first gates materials 3138 could be replaced or silicided through the ridge splitting opening to enhance the gates' conductivity. At the completion of the gate deposition processing the ridge splitting opening could be cleaned by short etch process to avoid any leakage between these gates. The slit could then be sealed with isolation material.

The resulting structure could have 4 active facets per channel. The structure resembles the structure described in U.S. application Ser. No. 15/333,138, incorporated herein by reference, rotated 90 degrees along the Y axis. A 3D NOR fabric with up to 4 facets per channel and multiple storage locations per facet by active storage location manipulation of $1^{st}$ and $2^{nd}$ gates is described in the U.S. application Ser. No. 15/333,138 in respect to FIG. 14A-FIG. 35B, and is applicable for this 3D NOR-P fabric.

An additional embodiment is a memory structure which utilizes vertical S/D pillars such as in the 3D NOR-P structure, yet it also utilizes single crystal channels. Accordingly, we will call these structures 3D NOR-C4 hereinafter. The starting substrates for these structures could be a multilayer of single crystal materials, such as presented in PCT/US2016/052726 in respect to its FIG. 3A and FIG. 3C which resemble FIG. 11A herein just that the multilayer is formed by epitaxial growth from single crystal seeding substrate. Such could be cycling silicon over silicon-germanium (SiGe) in which the SiGe layer could function as a sacrifice layer to be selectively etched (vs. silicon). FIG. 31E-22G illustrates cut views of a small region of 3D NOR-C4 being processed. The top is X-Y 3141 cut-view and the bottom is Y-Z 3140 cut-view. The multilayer crystals could be undoped with an optional light boron doped being designated channel layers.

FIG. 22E is a 2D illustration; of the multilayer after the first step of deep vertical etch through the multilayer substrate of crystalline Silicon 3156-SiGe 3158. The upper portion 3142 is a top view Y-Z 3141 direction of a small region illustrating slice of valleys 3144 and punch holes 3147 designated for S/D. It resembles the structure of FIG. 21B. It should be noted that in this case the pillar designated for the channel region is left un-etched so the channel could be formed from the crystalline regions of the multilayer substrate. The upper section 3142 of FIG. 22E shows a cut line 3149 for which a cut-view Y-Z direction 3140 is illustrated in the lower part of FIG. 22E. FIG. 22E lower part illustrates a small region with two layers of SiGe 3158 and silicon layer 3156. It also illustrates the slit 3154, and the formation of S/D hole 3147 having nitride liner 3146. Following the formation of the S/D holes 3147, isotropic selective indent-etch of the SiGe layers 3158 could be performed through the S/D punch hole 3147, to be followed by deposition of a sacrificial layer, such as nitride, deposited in the holes 3147 on sidewalls 3146. This nitride sacrificial layer could help keep the channel regions in place during the following steps and substantially protect the S/D holes from the following etch steps.

After forming the S/D holes with their sidewalls protection, the slit holes 3154 in FIG. 22E may be formed. Then through the slits using isotropic selective etch the SiGe layers could be fully etched. Then through the slit, an O/N/O layer 3166, 3176 could be deposited to be followed by a $2^{nd}$ gate material 3168, 3179 deposition. The sidewalls of the slit could be cleaned to keep the slit open for future steps. This would resemble the $2^{nd}$ gate of FIG. 22D. FIG. 22F illustrates the structure after the replacement of SiGe with O/N/O and the $2^{nd}$ gate. The upper portion 3162 of FIG. 22F illustrates an X-Y 3141 cut in a SiGe region showing the slits regions 3164 the O/N/O 3166 the protected S/D holes 3167 and the $2^{nd}$ gate 3168. The bottom portion of FIG. 22F illustrates the same region of FIG. 22E with the O/N/O 3176 on top and underneath the remained silicon 3178, with the filled in $2^{nd}$ gate 3179.

The following step could be an isotropic, time-controlled, selective etch of the silicon regions 3156, 3178 through the slits 3184 forming horizontal grooves along X direction. The etch step could be timed to reach the S/D protective silicon nitride sidewall 3187, a small over etch could be acceptable. FIG. 22G upper portion 3182 illustrates an X-Y cut view in the respective silicon regions in between the region illustrated in 3162 which is of the same pillar of 3142 top view. Following the groove formation in the silicon regions, an O/N/O 3186, 3195 could be deposited, followed by a $1^{st}$ gate 3189, 3197 deposition, thus leaving a single crystal channel 3188, 3198 with $1^{st}$ gates and $1^{st}$ O/N/O on its side facet and $2^{nd}$ O/N/O and $2^{nd}$ gate on its bottom and upper facet similar to the structure formed in FIG. 22D. The lower part of FIG. 22G illustrates the cut view of 3152 after these steps. Showing the slits after their sidewalls were cleaned 3194, the channel 3198, the $1^{st}$ gate 3197, the $1^{st}$ O/N/O 3195, the $2^{nd}$ gate 3193 and the $2^{nd}$ O/N/O 3196.

The sidewall protection 3146 could now be removed through the holes 3147 and S/D materials could be deposited. The S/D could be formed using any of the options presented herein for the S/D of 3D NOR-P, for example, such as, n+ polysilicon, silicided polysilicon, DSSB, SB with metalized S/D, and metalized with thin oxide barrier ("MIS") for Fermi level de-pinning, and their combinations. It might be desired to use metalized materials to the $1^{st}$ and/or the $2^{nd}$ gates, which also function as wordlines. This could be in the form of metalized gate materials such as Tungsten or silicided polysilicon. The choice of S/D material could be considered in respect to the material used for $1^{st}$ and/or the $2^{nd}$ gates and the related processing temperatures. An artisan in semiconductor art could engineer the flow to support the desired end materials for the S/D and $1^{st}$ and/or the $2^{nd}$ gates which could include silicide through the slit of the wordline or fully replace them with metal such as tungsten, after the formation of the S/D.

Additional alternative is to reduce the need for the S/D protection 3015 formation by using S/D materials that could allow selective etch of the channel material as related to FIG. 22C without etching the S/D regions. Such could be in the case of metalized S/D such as MIS. Another option is to deposit a sacrificial layer, such as silicon nitride, first; form second gate/wordlines 3136, then remove the sacrificial layer from the S/D holes wall and deposit the S/D pillars.

Further improvement may be to dope the silicon channel edges through the S/D holes 3147 by a method such as, for example, Molecular Doping, solid-state diffusion doping, ion shower, plasma doping, or any other doping method known to provide highly conformal doping. Following the doping, a silicide and metal may be processed such that it forms the desired dopant segregated n+ junction along with Schottky barrier within the previously intrinsic crystal Si. By doing so, a substantially fully crystalline transistor may be realized, consisting both crystalline channel and junction.

An additional option is to add process steps so that the slit/valleys could be used for additional storage regions. For example: first depositing O/N/O into the slit now functions as a valley following steps presented in respect to FIG. 12A-12D. This could be done together with wordline replacement by first forming the channel pillars such as 2114, then etching through the designated slit based S/D the O/N/O, than through these openings replace the wordline with metalized material and then form metalized S/D. These and many other mix and match steps could be engineered by an artisan in the semiconductor flash memory technologies.

The aforementioned scheme includes isolated floating channel regions. To operate properly, all nodes (gates) surrounding the channel, S/D, $1^{st}$ gate and $2^{nd}$ gate should be properly biased.

FIG. 23A and FIG. 23B illustrate a memory cell of the 3D NOR-P and/or 3D NOR-C4 with $1^{st}$ and $2^{nd}$ gates. These illustration resemble FIG. 14A and FIG. 14B of Ser. No. 15/333,138 rotated and their indices renamed for the formation of the FIG. 23A and FIG. 23B herein. It illustrates in a 3D perspective a single cell with indication of X-Y-Z direction 3200. The S/D pillars: S/D left 3230 and S/D right 3232 are in contact to the left and right facet of a memory cell channel 3240. The first gates $1^{st}$ gate front 3241 and first back gate 3243 are in contact with the front and the back facets of the channel 3240. FIG. 23B is and illustrates a broken up single cell structure illustrated in FIG. 23A. The bottom and top second gates $2^{nd}$ gate bottom 3242 and $2^{nd}$ gate top 3244 are in contact with the bottom and top facets of the channel 3240. In some configuration it could be advised to have the selected channel four facet with active gate control (avoid having floating gate). Additional alternative is to form a common body by punching a hole through the center of the channel pillar.

In many of the memory structures herein the writing technique could include reduced gate voltages in conjunction with the use of negative voltages on the S/D to decrease the overall power of the device. Such techniques could take advantages of the monolithic 3D integration technology with the heterogeneous integration of memory control circuit transferred over the memory matrix. An artisan in the technology could adapt the techniques presented in Ser. No. 15/333,138 for a 3D NOR fabric to the 3D NOR-P and 3D NOR-C4 fabric herein.

The floating body channel 3240 of FIG. 23B or of other 3D memory structures herein could function also as is often called 'floating body DRAM', and also with dual function, such as, for example, as presented in a paper by Choi, Sung-Jin, et al., "High speed flash memory and 1T-DRAM on dopant segregated Schottky barrier (DSSB) FinFET SONOS device for multi-functional SoC applications," IEEE International Electron Devices Meeting, 2008, incorporated herein by reference. The DRAM functionality of such a floating body could be enhanced by utilizing 'self-refresh' or 'auto-refresh'. In a common DRAM refresh, a refresh cycle means that each cell is being read and re-written individually. In 'self-refresh' many or even all cells could be refreshed together by driving current through them. The cell holding 'zero' will keep its zero state and the cell holding 'one' will get recharged to recover their loss of floating body charge due to leakage. This technique had been detailed in a paper by Takashi Ohsawa et. al. titled: "Autonomous Refresh of Floating Body Cell (FBC)," published in IEDM 2008, and in a follow-up paper titled: "Autonomous Refresh of Floating-Body Cell due to Current Anomaly of Impact Ionization," published by IEEE TRANSACTIONS ON ELECTRON DEVICES, VOL. 56, NO. 10, OCTOBER 2009, and in U.S. Pat. Nos. 8,194,487 and 8,446,794, all of the foregoing are incorporated herein by reference. Such 'self-refresh' techniques are most applicable for a single crystal channel such as presented in reference to FIG. 22E-22G.

An additional embodiment is to add functionality to the ridge split alleys 3024 after the completion of the processes of layer replacements through it. Such added functionality could be under thermal budget constraints to limit degradation of structures already formed. Some RRAM or Phase Change Memory (PCM) structures are designed to work well in a cross-bar type memory and could be processed at low temperatures. These structures incorporate the cell select device in the RRAM cell so they could be formed in the Ridge Split Valleys—'RSV' 3024 leveraging the $1^{st}$ and $2^{nd}$ gates as the $1^{st}$ and $2^{nd}$ wordlines for the RRAM formed in the RSV. Cross-bar RRAM arrays are discussed in paper such as by Mohammed Zackriya et al. titled "Impact of Current Distribution on RRAM Array with High and Low ION/IOFF Devices" presented at EDTM 2017; Shimeng Yu et al. titled "Emerging Memory Technologies: Recent Trends and Prospects" published at IEEE Solid-State Circuits Magazine 8.2 (2016): 43-56; by A. Bricalli et al. titled SiOx-based resistive switching memory (RRAM) for cross-bar storage/select elements with high on/off ratio" published at IEDM 2016; Chung-Wei Hsu et al. titled "3DVertical TaOx/TiO2 RRAM with over $10^3$ Self-Rectifying Ratio and Sub-µA Operating Current" published at IEDM 2013; all of the forgoing are incorporated herein by reference. Such memory is often referred to as incorporating a 'two terminal select device'. Such memory choice could be selected to be compatible for ALD deposition which would be a good fit to be processed in the RSV 3024. The memory material and the select device could be first deposited in the RSV 3024. Then using a patterning process, for example, such as is discussed in reference to FIG. 12A herein, vertical electrodes could be patterned. The electrodes could be part of the memory structure or a conductive material like tungsten. Finally bitlines could be formed in Y direction to complete this additional RSV enhancement memory.

An additional embodiment is to configure the 3D NOR-P device as asymmetric DSSB (compatible with FIG. 12C) or even symmetric DSSB (compatible with FIG. 12D) with a reduced cell size penalty in X direction. This variation could start following the step illustrated in FIG. 12A or after adding in channel material following the step illustrated in FIG. 12B. In this variation the two exposed sidewalls of the channels 2114, 3014 are doped to a moderate n-type doping concentration such as order of $10^{16}/cm3$ or higher n+ concentration such as higher than $10^{20}/cm^3$ using techniques such as solid phase or gas based diffusion, which could be used to dope the vertically arranged multiple layers though the exposed S/D regions. An example of these types of doping techniques are presented in papers by Ajay Kumar Kambham et al. titled "Three dimensional doping and diffusion in nano scaled devices as studied by atom probe tomography" published in Nanotechnology 24 (2013) 275705 (7pp); by Thomas E. Seidel titled "Atomic Layer Deposition of Dopants for Recoil Implantation in finFET Sidewalls" published at; by U.S. Pat. No. 5,891,776; by D. Raj titled "Plasma Doping of High Aspect Ratio Structures" published at Ion Implantation Technology (IIT), 2014 20th International Conference; all of the forgoing incorporated herein by reference. A similar technique is also called Monolayer doping (MLD) as presented by Ye, Liang, et al., "Doping of semiconductors by molecular monolayers: monolayer formation, dopant diffusion and applications," Materials science in semiconductor processing 57 (2017): 166-172, incorporated herein by reference. These techniques could be used with other 3D memory presented herein. MLD could also be used on dedicated regions designated for S/D or on the outer side of a region designated as a channel. MLD could also be used for DSSB formation. In such a sidewall doping process, the doping depth may be substantially shallower than that achieved by filling S/D column 2111, 2113, 2117. Whereas the two additional lithographical pitch might be required for the space being filled by S/D column, the sidewall diffusion doping might not require much additional space. And then later add in the S/D metallic silicidation material in the space designated for the S/D pillars in between the channel pillars, resulting in a structure similar to the one illustrated in FIG. 12B in which 2116 are metallic or the one illustrated in FIG. 21A in which 3016 is metallic. Adding the metallic material to the designated S/D pillar could be sequenced after the completion of higher temperature processing such as the O/N/O formation, to reduce the thermal budget effects on the metallic regions.

Adding the metallic material for the silicidation could be done by the known in the art deposition techniques such as ALD. Such as is presented in a paper by Hyungjun Kim, titled "Atomic layer deposition of transition metals for silicide contact formation: Growth characteristics and silicidation" published in Microelectronic Engineering 106 (2013) 69-75; in a paper by Viljami Pore et al. titled: "Nickel Silicide for Source-Drain Contacts from ALD NiO Films" published at Interconnect Technology Conference and 2015 IEEE Materials for Advanced Metallization Conference (IITC/MAM), 2015 IEEE International; and by Jinho Kim et al. titled "Characteristics of Nickel Thin Film and Formation of Nickel Silicide by Remote Plasma Atomic Layer Deposition using Ni(iPr-DAD)2": published in Journal of the Korean Physical Society, March 2015, Volume 66, Issue 5, pp 821-827; and by Kinoshita, A., et al. "Solution for high-performance Schottky-source/drain MOSFETs: Schottky barrier height engineering with dopant segregation technique," published in VLSI Technology, 2004. Digest of Technical Papers. 2004 Symposium on. IEEE, 2004; all of the forgoing are incorporated herein by reference.

An additional embodiment is to form metallic source & drain with or without dopant segregation, which could fit the higher density structure of FIG. 12B for which the S/D lines are shared by adjacent cells. Optionally, such could include tuning the Schottky Barrier by, for example, a very thin deposition of isolation such as oxide prior to the deposition of metal. Thus, the metal source/drain is indirectly contacting with the semiconductor channel via a very thin dielectric layer with, for example, a thickness of less than about 0.5 nm, or less than about 0.3 nm, or less than about 0.7 nm there between. Alternatively, the thin oxide maybe formed by a single or two of ALD cycles. The insertion of a very thin dielectric in between the metal source/drain and the semiconductor is chosen not to decrease the tunneling efficiency but to decouple the Fermi level pinning phenomenon. As so, the Schottky barrier height may become more controllable. Such techniques are known in the art as Metal Isolation Silicon ("MIS"). Such has been presented by Connelly, Daniel, et al. in a paper titled "A new route to zero-barrier metal source/drain MOSFETs," published in IEEE transactions on nanotechnology 3.1 (2004): 98-104; by Demaurex, Bénédicte in a dissertation titled "Passivating contacts for homojunction solar cells using a-Si: H/c-Si hetero-interfaces" at ÉCOLE POLYTECHNIQUE FÉDÉRALE DE LAUSANNE, 2014; by Chiu, Fu-Chien titled "A review on conduction mechanisms in dielectric films," published in Advances in Materials Science and Engineering 2014 (2014); and B. E. Cossa, et al. in a paper titled "CMOS band-edge schottky barrier heights using dielectric-dipole mitigated (DDM) metal/Si for source/drain contact resistance reduction" VLSI Technology 2009, pp. 104-105; all of the forgoing are incorporated herein by reference. Additionally, if desired, the metal source/drain to channel junction can be formed on one or more well-defined crystallographic orientation surfaces of the semiconductor channel as referenced in U.S. patent application publication 2010/0065887 incorporated herein by reference. Such approaches may be used to control the effective Schottky barrier height. The metal source/drain may include a single type of metal such as tungsten, cobalt, platinum, nickel, or their silicide. Alternatively, the metal source/drain may include a stack of multiple metals in order to form a desired metal workfunction and thereby effectively the Schottky barrier height. Alternatively, the stack of multiple metals may be used where the first metal contacts to the semiconductor channel is thin but predominately defines the effective schottky barrier height and the subsequent metal may be chosen for process convenience. For example, such as disclosed in U.S. patent application publication 2011/0008953 incorporated herein by reference.

The memory structure herein was presented as a charge trap memory. Recently good progress has been made in respect to ferroelectric type memories, especially in respect to utilizing Hafnium Oxide and Zirconium Oxide, based materials (HfO, ZrO, HfZrO, ZrSio, . . . ). These memories are referenced as FRAM and could provide higher speeds compared to charge trap based memories. At the current time, a development effort is being pursued by the industry to develop such FRAM technology to be commercially viable. The technologies in development for such FRAM include advanced deposition techniques such as ALD. Adapting FRAM to the 3D-NOR fabrics presented herein could be a good option. These could include also a mix, in which some of the regions are processed with O/N/O and some with FRAM materials, for example, such as $HfO_2$ and silicon or zirconium or aluminum doped HfO2 (Si,Zr,Al: HfO2) based materials. For example, the locations where the O/N/O layer was to be formed can be replaced with a stack of dielectrics to function as a ferroelectric memory transistor. Alternatively, such locations may include a stack of a charge trapping layer and a ferroelectric layer. Such a mix could be attractive for many systems as it provides universial memory technologies (relatively fast writing volatile memory or relatively slow writing non-volatile memory), low power, and time for transferring data between these memory technologies as was discussed elsewhere herein. Using FRAM within the 3D-NOR P memory could include many of the variations referred herein in respect to charge trap memories. These could include multi-level cells in which multi-bits are coded in by different writing voltages or different times of writing. These could also include multi-bit locations such as minor bit and multi-gates steering of bit location, for example, such as discussed in respect to FIG. 23A-32B herein Similar to charge trap, FRAM is an electric field base memory and is an isolative material, and accordingly could support these multi bit coding techniques to enable a higher memory density. The use and methods of constructing an FRAM memory is covered in many recent papers and their teaching could be applied to incorporate such ferroelectric dielectric for the 3D NOR-P. Such papers as by J. Muller et al. titled "Ferroelectric Hafnium Oxide Based Materials and Devices: Assessment of Current Status and Future Prospects" published in ECS Journal of Solid State Science and Technology, 4(5) N30-N35 (2015); by Patrick D. Lomenzo et al. titled "Annealing behavior of ferroelectric Si-doped HfO2 thin films" published in Thin Solid Films 615 (2016) 139-144; by Uwe Schroeder et al. titled "Chapter 3, Nonvolatile Field-Effect Transistors Using Ferroelectric Doped HfO2 Films" published by Springer Science & Business Media Dordrecht 2016; B.-E. Park et al. (eds.), Ferroelectric-Gate Field Effect Transistor Memories, Topics in Applied Physics; by U. Schroeder et al. titled "Impact of field cycling on HfO2 based non-volatile memory devices" presented at ESSDERC16; by Shinji Migita titled "Thickness-Independent Behavior of Coercive Field in HfO2-based Ferroelectrics" presented at EDTM 2017; by Cheng, Chun-Hu, et al. titled "Low-leakage-current DRAM-like memory using a one-transistor ferroelectric MOSFET with a Hf-based gate dielectric" published in IEEE Electron Device Letters 35.1 (2014): 138-140; and by Zhen Fan titled "Ferroelectric HfO2-based materials for next-generation ferroelectric memories" published in JOURNAL OF ADVANCED DIELECTRICS Vol. 6, No. 2 (2016); all of the forgoing are incorporated herein by reference. Additional work on Ferroelectric shows that tungsten could be used effectively as a capping layer and accordingly could be used for the 3D NOR-P structure, this and another enhancement for ferroelectric based memories are presented in paper by Karbasian, Golnaz, et al. "Stabilization of ferroelectric phase in tungsten capped HfO. 8ZrO. 2O2." *Applied Physics Letters* 111.2 (2017): 022907; by George, Sumitha, et al. "Nonvolatile memory design based on ferroelectric FETs." *Proceedings of the 53rd Annual Design Automation Conference*. ACM, 2016; by Karbasian, Golnaz, et al. "Ferroelectricity in HfO2 thin films as a function of Zr doping." *VLSI Technology, Systems and Application (VLSI-TSA)*, 2017 International Symposium on. IEEE, 2017; and by Lu, Zhongyuan, et al. "Electrically Induced, Non-Volatile, Metal Insulator Transition in a Ferroelectric Gated MoS $ _2 $ Transistor." *arXiv preprint arXiv:* 1705.06375 (2017), all of the foregoing are incorporated herein by reference.

Some of the ferroelectric materials could act also as a charge trapping materials. These two could impair each other as discussed in a paper by Yurchuk, Ekaterina, et al. titled "Charge-Trapping Phenomena in HfO 2-Based FeFET-Type Nonvolatile Memories," published in IEEE Transactions on Electron Devices 63.9 (2016): 3501-3507, incorporated herein by reference. On the other hand the memory cell could be engineered to have these two enhancing each other, so the ferroelectric and charge trap could be combined for enhanced memory functionality such as presented by Yu-Chien Chiu et al. titled "Low Power 1T DRAM/NVM Versatile Memory Featuring Steep Sub-60-mV/decade Operation, Fast 20-ns Speed, and Robust 85oC-Extrapolated 1016 Endurance" presented at the 2015 Symposium on VLSI Technology; Chiu, Yu-Chien, et al. "On the variability of threshold voltage window in gate-injection versatile memories with Sub-60 mV/dec subthreshold swing and $10^{12}$-cycling endurance," Reliability Physics Symposium (IRPS), 2016 IEEE International. IEEE, 2016; and by Chia-Chi Fan et al. titled "Impact of Ferroelectric Domain Switching in Nonvolatile Charge-Trapping Memory" presented at EDTM 2017; and in U.S. patent application 2016/0308070; all of the forgoing are incorporated herein by reference.

Writing a ferroelectric memory cell could resemble writing a charge trap memory cell using Fowler-Nordheim ("FN") tunneling. Such writing techniques are provided in U.S. Pat. No. 6,667,244 incorporated herein by reference. The following ferroelectric writing example for the 3D-NOR-P structure could be also be adapted to charge trap programming using FN by adapting voltage level and to the above structure for which ferroelectric cell are designed to be enhance by charge trapping. Alternatively, it may be implemented for SB hot carrier injection.

FIG. 24A illustrates a single bit schematic written to a '0' logic state. FIG. 24B illustrates such single cell structure.

FIG. 24C illustrates a single bit schematic written to a '1' logic state. FIG. 24D illustrates such single cell structure.

The specific voltages of these structures are for illustration only and are to be defined specifically for a specific memory cell as part of such memory cell engineering. In a case where the wordline (the gate) is shared with other cells in the array the unselected cells could have their bitlines (Source-lines and Drain-lines—S/D lines) at ground (zero volts—0V) or in some alternatives floating to inhibit writing disturb.

FIG. 25A-25D illustrates an alternative in which two bits are stored in one facet of the memory cell by directing the electric field only to the source side of the memory transistor, or alternatively (not illustrated) to the drain side. This could resemble the mirror-bit concept in charge trap flash. This writing method could be adapted for the 3D NOR-P fabric.

FIG. 26A illustrates a transistor schematic of small section of a ridge of the 3D-NOR-P fabric. These writing techniques are driven by the electric field between the S/D lines and the wordlines. For 3D NOR-P related to FIG. 12C and FIG. 12D the S/D lines are not shared between adjacent cells. For the higher density option of FIG. 12B every other memory pillar could be ignored by floating so the odd pillar could be used while the even channel could be ignored by floating. Particularly, such ignored by floating can be accomplished by switching off of the series select transistor or physically left uncontacted with any other interconnection line. For example, every other memory pillar may be constructed but left unused. Alternatively, the every other memory pillar may be physically removed during the fabrication process, or otherwise disabled during the fabrication process. FIG. 26A illustrates writing 'zero' to a memory cell. FIG. 26B illustrates writing 'one' to a half of a memory cell. FIG. 26C illustrates writing 'zero' to a group memory cell sharing the same bitlines. FIG. 26D illustrates writing 'one' to a group of memory cell having a common wordline. These write modes illustrations are indicative of the options available for writing of a ferroelectric memory option within a 3D NOR structure. These could be combined with multilevel techniques to increase storage capacity. Such multilevel storage is presented in a paper by Mulaosmanovic, Halid, et al. titled "Switching kinetics in nano-scale hafnium oxide based ferroelectric field effect transistors," published in ACS Applied Materials & Interfaces (2017), incorporated herein by reference.

Ferroelectric memory could be useful for computer cache applications as it has inherently high programming speed. Yet in these applications it is important to have high endurance as well. In a paper by Muller, J., et al. "High endurance strategies for hafnium oxide based ferroelectric field effect transistor," Non-Volatile Memory Technology Symposium (NVMTS), 2016 16th. IEEE, 2016, incorporated herein by reference, such extending endurance techniques are suggested. One such approach is named: metal-ferroelectric-semiconductor-FET (MFS-FET). Engineering the 3D NOR-P structure for such technique could be achieved by adapting the O/N/O formation 2112 related to FIG. 12A accordingly. In some memory structures the O/N/O formation is done after the channel formation and deposited over the channel, in the 3D NOR it done over the ridge forming the multilayer wordline structure, with the silicon channel formed afterwards. So, for such ferroelectric based memory, the O/N/O layers could be replaced with first deposition (ALD) of the ferroelectric (such as lightly doped HfO2) layer, then high temperature annealing for activation could be performed. Then, high-k material such as HfO2 could be deposited to function as dielectric between the ferroelectric layer and the channel. Additional modification that could be included is forming a capping layer using material such as TiN. For such a process, resembling the one in reference to FIG. 14B could be performed. First indenting of the channel material, through the valleys, by an isotropic selective etch step, then deposit a capping layer such as TiN, and then remove the access TiN by anisotropic etch of the valleys.

Additional technique suggested in the above paper by Muller, J., et al is "maximization of the area ratio AlF/AHfO2". One way suggested and illustrated in FIG. 9 (b) of the paper could be implemented with 3D NOR structure in a similar technique as other variations presented herein. Such could include replacing in the multilayer of FIG. 11A the SiO2 layers 2002 with a sandwich layers of SiN, SiO2, SiN. FIG. 26E illustrates such alternative, with regions of a ridge 3512 facing the valley on its right side 3514. A region of a ridge including SiO2 layer 3522, SiN layer 3523, Poly (wordline/gate) layer 3524, SiN layer 3525 and SiO2 layer 3526. FIG. 26F illustrates the structure after isotropic selective etch 3516 of the SiN layers (3523, 3525) from the valleys opening and shorter isotropic etch of the polysilicon layers (3524). FIG. 26G illustrates the structure after deposition (ALD) of the ferroelectric material (doped HfO2) filling these etched regions 3517. This could be followed by anisotropic etch cleaning the valleys from excess HfO2 material. FIG. 26H illustrates the structure after isotropic etch of a region of the exposed ferroelectric material and replacing it with floating gate material 3518 (per FIG. 9(b) of Muller paper).

These could also include multi-bit locations similar to mirror bit and multi-gates steering of bit location such as discussed in respect to FIG. 10E of PCT/US2016/052726 and FIG. 15A to FIG. 23 of U.S. Ser. No. 15/333,138 for a further increase in memory capacity. The multi storage locations writing is similar to that of charge trap: the side gates could be used to modify the electric field, directing the effect of the major gate to the selected location of the related facet. Also the techniques presented for transferring memory, from and to high speed cells and high density cells, could be used in respect to ferroelectric base memory cells.

FIG. 27A illustrates an X-Z 3600 cut view of a 3D NOR-P structure. It illustrates a section of a ridge with four wordlines WL1, WL2, WL3 and WL4. These wordlines are part of the gates controlling the O/N/O of one of the facets of the channel formed in the valley as detailed in respect to FIG. 12A-12D herein. The relevant transistor schematic is illustrated in FIG. 11C. FIG. 27A also illustrates seven channels having 'body' contact B1-B7 in between S/D lines S/D1-S/D8. The Source/Drain S/D1 3611 is marked as S/D1, the other source drain S/D2 3612 is marked S/D2. In between S/D1 3611 and S/D2 3612 is disposed the channel B1 3621 with body contact is marked B1. The following source drain S/D3 3613 is marked S/D3 with the channel in between as channel B2 3622 having body contact B2, and the following channel B3 3623 is named body contact B3, and so forth.

FIG. 27B illustrates an X-Y 3601 cut view of a small section indicated by 3642 over FIG. 27A. It illustrates the wordline/Gate 3651, the O/N/O 3652, the pillars forming the memory transistors 3653 and the other facet O/N/O 3654. It also indicates the two S/D pillars 3661, 3665 and the respective channels 3662.

A known concern with memory arrays is various types of disturbs. Some of those are related to parasitic capacitance and similar forms of signal coupling due to the relatively long and close proximity layouts and often parallel select lines such as bitlines and wordlines. These concerns are part of the engineering of a memory device and could be countermeasured in the engineering of a 3D NOR-P memory structure. Some of the alternative techniques could be considered in the following.

A body contact as discussed in respect to FIG. 27A could be engineered to be placed either at the top or the bottom of the channel pillar. This body contact could be connected to constant ground, or to a dynamic voltage control namely 'body control' which could be connected to a specific voltage as part of the memory control circuit. Such 'body control' could be set to a positive voltage for the selected pillar to assist the memory erase step. In some embodiments, a positive body voltage erase may be used to eliminating the need of a negative voltage for all operations saving the need for a negative voltage generator. In some applications the channel engineering could be combined with higher doping in the center of the channel 3663 as indicated in FIG. 27B, to improve the body vertical conductivity. As discussed before the channel is lithographically defined in the 'valleys' by having silicon deposition forming first the channel wall 3662 in contact with the ridge walls, pre-prepared with O/N/O layers, and the designated S/D walls. The deposition process could include p-type doping with a gradually increasing doping concentration toward the center as the channel pillar is being deposited toward the center of the channel 3663. In some cases, the center of the channel may contain a void formation. In such case, the very center of the channel filler 3668 could be left as a hole or sealed with oxide in a similar way commonly used in 3D NAND.

An additional embodiment is to have within the selected ridge all the unselected S/D pillars, which are left floating, be connected together through a multiplexer in periphery circuit. By connecting together all the unselected S/D lines they will form a much larger capacitive load to significantly reduce the capacitive coupling to the two active S/D lines. For example, if the memory related to WL1 and S/D3 and S/D4 3640 is to be written, then the unselected S/D1, S/D2, S/D5, S/D6, S/D7, S/D8, . . . , may be connected together, for example, via a multiplexor in the periphery circuitry, and left floating.

An additional embodiment is to sequence the writing sequence to reduce cross talk by first activating the selected Source and Drain S/D3 and S/D4 in our example, and then assert the selected wordline to form conduction in the selected transistor (~1-2 volts). Then after the cross talk ripple has subsided, move the wordline high enough (>4 volts) in order for the writing process to be effective only in the selected memory cell (3640). Such a sequence is typical of FN tunneling programming while for Channel hot electron, one may first assert the selected WL and only then, increase the BL voltage in gradually increasing voltage at each pulse. Further, if using SB memory devices, gate-source bias should be realized using positive WL and negative BL with grounded channel body line while the adjacent channel body line, sharing the same BL as the selected line should be at inhibit negative bias. Similarly to standard channel hot electron mechanisms, junction bias is the most dominant factor in charge injection mechanisms; hence the S/D line is asserted last.

An additional embodiment is a writing technique for the 3D NOR-P, which could be achieved by using one wordline for example, such as WL1, and one body-line of a selected ridge, such as B3, to select a specific cell 3640. By doing so, without controlling S/D lines, bit-specific selection can be achieved at WL and body-line cross point. FN tunneling may be utilized by having a large enough voltage difference between B3 and WL1 to tunnel charges into the related trapping region. The S/D lines could be left floating or alternatively be grounded provided that body bias is negative enough to keep the WL1 writing voltage low enough to avoid any disturb writing to other cells from charges coming from the grounded S/D lines. As an example, −8 volts may be placed on the selected body-line and +8 volts on the selected wordline.

An additional embodiment in respect to such a FN writing method is to steer the charges to be close to one of the neighboring S/D lines so two charge locations could be distinctively formed, increasing the memory density, bit1 3643 and bit2 3644. Such could be done, for example, by having S/D3 at ground while all other S/D lines are floating, preferably shorted together thus pulling the electrons toward the S/D3 side of the facet 3640. The electric field between the negative body B3 and the grounded S/D3 could pull the electrons toward the S/D3 side for writing on that side of the charge trap region 3643 and for the other side replace role with S/D4 3644. Accordingly, programming a storage location per facet could be made effective with such a writing technique. An additional embodiment includes a blend by combining FN type writing with some level of hot electron, by proper voltage control of S/D3 and S/D4. An additional embodiment includes combining multiple storage sites (also called here location) at a facet and multiple charge level at a site.

An additional embodiment for such charge steering could include modulating the steering S/D line by a wavelet function similar to what has been presented in U.S. application Ser. No. 15/333,138 with respect to FIG. 27 to FIG. 32.

In some application, it might be desired to form a body connection to the channel pillars not just at the pillar end sides but also in between the layers of wordlines. To do so, a similar technique to what have been presented herein could be adapted. For example, the multilayer substrate (FIG. 11A) could incorporate selectively etch-able layers, such as silicon nitride. Then at a later processing step, that layer could be etched followed by etch of the O/N/O through the opening and filling it with material such as polysilicon to form a middle of a pillar 'body contact' to the channels through horizontal sidewall tapping contact.

The writing techniques presented in respect to FIG. 27A-27B, could be also used for ferroelectric based memory or any of the charge-trap/ferroelectric combination structures presented herein. In such case one of the channel facets O/N/O 3652 could incorporate ferroelectric material, such as HfO$_2$ based dielectric, as presented herein before. The writing techniques presented in respect to FIG. 26A-26D could be adapted accordingly, so that the writing and erasing electric field is formed between the selected wordline and the selected 'body' while the S/D lines are left floating, or used for electric field steering as has been described herein.

FIG. 27C illustrates an additional embodiment in respect to FIG. 27B. Following the deposition of the p-type polysilicon for the channel region 3662 (FIG. 27B), 3675 (FIG. 27C), an isolation 3672 may be deposited, using a technique, for example, such as ALD. Driven by device and process engineering choices, this isolation may include materials such as SiO$_2$ or silicon nitride, and the isolation thickness could be engineered to be extremely thin, for example, at about 0.5 nm such as used for MIS type metal silicon interface. The isolation could also be formed thicker, for example, at about 2-10 nm. Then pillar 3673 may be formed (fill-in) with materials such as metals (W, Ta, Ti, TaN, etc.) or n+ doped polysilicon, which could function as the body for electric field programming or erase, similar to what had been presented herein with respect to the n+ 3663 of FIG. 27B. Center hole 3668 could be filled with oxide like before. This alternative could allow the use of the 'body' to form a reverse field for erase as the isolation 3672 will protect against leakage to the S/D 3661 when metal fill is in use.

The 'body' isolation of FIG. 27C provides multiple 3D NOR-P additional embodiments. The channel could be made with n-type silicon to form alternative memory transistors such as P—N—P. Metal-N—P, Metal-N-Metal with or without dopant segregation. In some of these transistor structures, the positive voltage used at the gate for the FN trapping would not open the transistor allowing steering the FN charge trapping location using the S/D on each side of the selected channel without undesired high transistor current. Additional use of such memory transistor engineering is to extend charge trapped retention for high speed write application (such as a DRAM alternative) using thin tunneling oxide or even without tunneling oxide, as was detailed in PCT/US2016/052726, incorporated herein by reference. For such a structure, a positive bias on the Wordlines for unselected cells could be applied.

Additional alternative in respect to the use of Ferroelectric technology in 3D NOR, and 3D NOR-P structure could include the use of techniques called subloop cycling to improve endurance and retention.

An additional embodiment is to have a negative bias during standby mode on the 'body' regions (3663, 3673) of the unselected cells, to extend retention for such thin tunneling structures.

An additional embodiment is to provide the tunneling source from the wordlines and accordingly have the tunnel oxide between the gate and the charge trap layer. In other word, the oxide between channel and the charge trap layer is thickner and the oxide between the channel and the gate is thinner so that the electron trapping and de-trapping occurs through the latter oxide while no electron trapping and de-trapping occurs at the first oxide. By doing so, the oxide that directly contacting the channel preserves good oxide interface quality and associated device performance such as parameter drift and mobility degradation.

As additional embodiments, some of the above embodiments could be engineered in a 3D NOR-P device body bias of FIG. 27B.

An additional embodiment includes modifications of the process flow and the construction of the 3D NOR-P structures. As illustrated in FIGS. 28A-28E, the 'Valleys' 2014 may be replaced with overlapped holes 3702. It should be understood that, despite the corner is drawn sharp, the real practice would have rounded corners. FIG. 28A is a top view 3700 of such holes 3702 formed in the multilayer substrate 3701 like that of FIG. 11A (alternating oxide and polysilicon). The overlapping holes being 'punch' into the multilayer substrate may also form gaps 3703. Hereinafter, the term 'punch' maybe understood the same as through multilayer vertical hole etching process. FIG. 28B illustrates the structure after depositing O/N/O over the sidewall of the holes 3702. The process may start by first depositing (for example, via ALD) the gate oxide 3704 (also called sometimes top oxide). The gate oxide 3704 could be about 3-10 nm thick and may be deposited conformal to the hole walls, and may also close the gap 3703 of the overlapping holes 3702. Then the charge trap 3706 may be deposited. The charge trap material may include, for example, such as silicon nitride, which may or may not be stoichiometric. The charge trap layer thickness could be 3-10 nm. The tunneling oxide 3708 could be then deposited. As discussed before, the tunneling oxide thickness could be set according to the desired memory attributes. For long term retention, it could be 3-6 nm while for high speed write it could be less than 1 nm or even skipped all together. Then as is illustrated in FIG. 28B the channel material and the optional 'body' layer could be added in the center 3710. After forming the O/N/O and the channel, then S/D holes could be etched and be filled with S/D materials 3712, 3714. This flow leverages the O/N/O at the sides of the S/D as a spacer and is marked by the dashed line 3716. An additional advantage of this flow is forming horizontal isolation of the charge trap layer between adjacent cells to inhibit charge migration.

FIG. 28D is a top view of an additional embodiment in which the holes 3732 formed in the multilayer substrate (alternating oxide and polysilicon) are rectangular in shape, or close to rectangular in shape. Following the hole formation, an isotropic etch step may be used to remove the polysilicon of the multilayer in the regions 3721 between the holes 3732. Then the hole's sidewalls could be covered with O/N/O which could includes gate oxide 3724, charge trapping layer (nitride) 3726, and tunneling oxide 3728. A second anisotropic etch could be used after the O/N/O layer has filled the space opened by the silicon isotropic etch, cleaning the sidewalls and then resume formation of the O/N/O layers. This thickness of these layers could be as common for the designated memory and could be between 10 nm to 30 nm in total. Then the channel material 3720 and the optional 'body' layer 3719 could be added in the center. After forming the O/N/O and the channel, S/D holes could be formed using a selective anisotropic etch, followed by deposition (ALD) of the S/D materials 3732, 3734. Since the designated space for the S/D are now filled with oxide and nitride materials this step could be self-aligned as the S/D hole etch process could be selective so to not etch the channel material.

In 3D NAND and in 3D NOR-P memory structures the memory cell utilizes a channel formed by polysilicon deposition which could also be treated by annealing techniques to improve its mobility, such as presented by Lisoni, J. G., et al. "Laser Thermal Anneal of polysilicon channel to boost 3D memory performance," VLSI Technology (VLSI-Technology): Digest of Technical Papers, 2014 Symposium on. IEEE, 2014, incorporated herein by reference. It is well known in the art that forming the channel with thin walls, often called 'Macaroni' channel, of about 5-10 nm or about 10-20 nm thickness, as is illustrated in FIG. 28G, improves threshold variation compared with a conventional full channel as is illustrated in FIG. 28F. Such has been presented by Fukuzumi, Yoshiaki, et al., "Optimal integration and characteristics of vertical array devices for ultra-high density, bit-cost scalable flash memory," Electron Devices Meeting, 2007. IEDM 2007. IEEE International. IEEE, 2007; and Congedo, Gabriele, et al., "Analysis of performance/variability trade-off in Macaroni-type 3-D NAND memory," Memory Workshop (IMW), 2014 IEEE 6th International. IEEE, 2014, both incorporated herein by reference. Furthermore, when the thickness of the vertical pillar type channel of FIG. 28F or the macaroni channel of FIG. 28G is substantially small, for example, such as below about 10 nm to 2 nm, the doping type of the channel may even be n-type so as to function as junctionless-like mode. Such an approach may further increase the current drivability of the memory cell compared to the p-type counterparts with the same thickness. An additional alternative to enhance such a channel is to form it with multiple thin walls, alternating polysilicon sub-films and silicon oxide films there between, for example, as is illustrated in FIG. 28H with ultra thin oxide layer 3746 in between. The oxide layer could be a monolayer or even less than a full monolayer or very few atomic layers. Such technique was proposed for single crystal channels such as presented in a paper by Mears, Robert J., et al., "Silicon Superlattice on SOI for High Mobility and Reduced Leakage," SOI Conference, 2007 IEEE International. IEEE, 2007; and by Xu, N., et al., "MOSFET performance and scalability enhancement by insertion of oxygen layers," Electron Devices Meeting (IEDM), 2012 IEEE International. IEEE, 2012; and Xu, Nuo, et al., "Electron mobility enhancement in (100) oxygen-inserted silicon channel," Applied Physics Letters 107.12 (2015): 123502; all of the forgoing are incorporated herein by reference. The process for such a channel formation is similar to the standard conformal silicon channel deposition with a short added step of oxide ALD in between periodically forming the channel illustrated in FIG. 28H.

These alternatives are illustrated in the following FIG. 28I-28S. FIG. 28I is a 3D X-Y-Z 3770 illustration of a full channel pillar between two S/D pillars. FIG. 28J is a 3D 3770 illustration of a Macaroni channel pillar between two S/D pillars. FIG. 28K is a 3D 3770 illustration of a Macaroni channel pillar with doped back-bias (body) at inner core of the Macaroni channel. In this case, the doped back-bias region can be in-situ doped a negative voltage free operation. Also, the back-bias application may allow a multiple cell erase at pillar level. FIG. 28L is a 3D 3770 illustration of a Macaroni channel pillar with insulated back-gate (body) between two S/D pillars. The insulated back-gate combined with the substantially thin macaroni channel may further support to suppress the cell leakage current for an unselected wordline. Another alternative is to have the channel in an ellipsoidal shape rather than a circle as is illustrated in the FIG. 28M 3D 3770 illustration, and FIG. 28N. Also, the macaroni channel, back-gated channel, insulated back-gated structure can be equivalently applied to the ellipsoidal channel (not drawn). FIG. 28P is a top view X-Y 3700 illustration of a macaroni channel between two S/D pillars fabricated as previously presented herein for 3D NOR-P structure in which the channel and the S/D pillars are deposited independently. Accordingly the physical junction 3752 interface between the channel and the S/D is highly affected by the formation process. Utilizing an annealing step the dopant from the n+ S/D could be diffused into the channel thus forming electrical junction 3754 within the channel which was deposited monolithically and avoiding the surface of the deposition boundaries as is illustrated in FIG. 28R. FIG. 28Q and FIG. 28S are the corresponding illustrations with a full channel configuration.

An additional alternative is to use the channel body potential utilization, using the back-gated structure illustrated in FIG. 28L, to help also for read operation. This technique is particularly advantageous for SB and DSSB devices to suppress ambipolar read characteristics. Such for example could utilize a back bias as a second gate resembling the concept of reconfigurable nanowire by use of two gates as presented by Weber, Walter M., et al., "Reconfigurable nanowire electronics-enabling a single CMOS circuit technology," IEEE Transactions on Nanotechnology 13.6 (2014): 1020-1028, incorporated herein by reference. Such an approach may be desirable for a memory cell with Schottky source/drains that used to improve the write speed and energy efficiency. So for memory cell structure that could have an ambipolarity behavior, the back-bias could be a positive voltage to pull up the body potential to suppress band-to-band leakage current through unselected cells of a selected S/D (drain) pillar. This scheme should be considered with caution as at the second S/D (source) pillar, it will increase leakage, especially if program conditions involve positive voltage on gate (WL) and negative voltage on the source (S/D pillar).

An additional alternative it to design the channel FIG. 28F-28H to have a relatively small radius so that the field formed by the gate around it is further enhanced to improve the writing speed and/or voltage using FN. In some applications, reducing the channel radius could require limiting the structure height in the Z direction due to the conflict in respect to the holes etching aspect ratio. Such field enhanced techniques are well known in 3D NAND structures and is also discussed in a paper by Hsu, Tzu-Hsuan, et al., "Physical model of field enhancement and edge effects of FinFET charge-trapping NAND flash devices," IEEE Transactions on Electron Devices 56.6 (2009): 1235-1242, incorporated herein by reference.

Additional alternative is to use these memory structures or a portion of such for Synapse-like functions. Such use of memory has been suggested in the art for RRAM and PCM cross bar but could be applied to charge trap or other memory types presented herein. Published work for RRAM and PCM cross bar has been by Chen, C-Y M et al. titled "A solid-state electronic linear adaptive neuron with electrically alterable synapses" published at Neural Networks, 1991. 1991 IEEE International Joint Conference on. IEEE, 1991; by Lee, Myoung-Sun, et al. titled "Implementation of Short-Term Plasticity and Long-Term Potentiation in a Synapse Using Si-Based Type of Charge-Trap Memory" published at IEEE Transactions on Electron Devices 62.2 (2015): 569-573; and by Kornijcuk, Vladimir, et al. titled "Leaky integrate-and-fire neuron circuit based on floating-gate integrator" published at Frontiers in neuroscience 10 (2016); all of the forgoing are incorporated herein by reference.

Other memory enhancement techniques presented for 3D NOR in PCT/US2016/052726 could be adapted and used with the 3D NOR-P presented herein.

An additional alternative is use the 3D NOR-P to construct a Floating Body RAM ("FB-RAM") as well as a two stable state FB-RAM using the back-bias concept as detailed in U.S. Pat. Nos. 8,379,458 and 8,902,663, and U.S. application Ser. No. 15/494,525, all of the forgoing are incorporated herein by reference. For such a memory alternative, the channel process could be modified so after the deposition of the channel material P silicon; an isolation layer such as nitride is deposited similar to isolation 3672 of FIG. 27C.

FIG. 29A is a Y-Z 3800 cut view of a center of a channel and the multilayer forming the gate lines 3802. FIG. 29A illustrates the multilayer with O/N/O 3804 on the ridge side-wall and the channel of p-type silicon 3808 with a center hole 3806. Then the process could include channel isolation by an etch step similar to the one illustrated in reference to FIG. 22C, only that this time the core of the body now has in inner structure of nitride 3814, as is illustrated in FIG. 29B and which could be kept un-etched during the silicon channel etch step as is illustrated in FIG. 29C. Then the etched region could be replaced with oxide or full O/N/O 3816 and second gates as detailed in reference to FIG. 22D. Then, optionally, the nitride 3814 in the center of the channel could be replaced with back bias material such as n+ type silicon 3818 as is illustrated in FIG. 29D. Accordingly the channel pillar could now have layers of isolated donut like channel 3820 one on top of each other with center core of n+ back-bias extending vertically so each layer could use an independent FB-RAM cell having two stable states. In order word, whereas the macaroni channel is continuous along z-direction, the ring channel has its own isolated and dedicated channel per every layers.

An alternative technique to form floating body or isolated channel is to utilize a similar technique presented for floating gate type 3D NAND such as presented in a paper by Parat, Krishna, and Chuck Dennison, "A floating gate based 3D NAND technology with CMOS under array," Electron Devices Meeting (IEDM), 2015 IEEE International. IEEE, 2015, incorporated herein by reference, and illustrated in FIG. 29E. FIG. 29E illustrates the flow for 3D NAND's floating gate process formation which resembles the isolated channel flow. So for example, following the formation of the channel holes such as discussed in reference to FIG. 28D or illustrated in (a) of FIG. 29E, an anisotropic selective etch could be applied, through the designated channel holes, to recess the gate regions 3832. Then the O/N/O layers could be deposited (ALD) 3834. Then the channel material (p-type or undoped polysilicon) could be deposited 3836. Then using etch step, the sidewalls of the channel material could be etched off 3838. And, optionally, then for 3D NAND-P, the body 3840 could be deposited. This could be p+ silicon or oxide and metal as was discussed in reference to FIG. 27B-27C, or for the Floating Body RAM ("FB-RAM") application it could be n+ polysilicon. This process could form donut-like channels and could be used in many of the memory structures presented herein. The channel itself could be made to include an ultra-thin oxide layer as discussed in reference to FIG. 28G-28H. Such techniques support isolating the channel without the need for trench 2202, also called slit. Inhere there are few 3D memory structure that could work well without the need of such slit (also called her valley or trench). Such 3D memory accordingly be constructed with areas having arrays of channel filled holes such 10×10, 16×16, 32×32, . . . without having a slit.

FIG. 29F is a 3D X-Y-Z 3870 illustration of a conventional macaroni channel between two S/D pillars, and FIG. 29G illustrates the structure with regions of the multilayer isolation not showing the gate portion for visual simplification. FIG. 29H and FIG. 29I are the corresponding 3D 3870 illustration of the 'donut' channel which could also be called a ring channel structure. Two enhancements may be found in such a donut channel: 1) there is no silicon channel in between the inter wordline region so no leakage path through an ungated region and 2) the combined with n-type back-bias region enables a floating-body DRAM or SRAM application.

An additional alternative for a donut channel or other form of very thin channel, such as below about 10 nm or even thinner than about 6 nm, is to have the channel made of n+ polysilicon and have the gate (wordline) control function as a junction less transistor. Such variation could provide the benefit of higher channel mobility and optional sharing of the polysilicon deposition for both of n+ silicon for the S/D pillar together with the deposition for the channel pillar.

In PCT/US2016/052726, incorporated herein by reference, techniques are presented to integrate programmable logic functions in the 3D NOR fabric. These techniques are presented in respect to FIG. 20 to FIG. 39B of PCT/US2016/052726 ("PCT"), and could be adapted to the 3D NOR-P fabric as presented in the following herein.

FIG. 20 of the PCT could be applicable to the 3D NOR-P in respect to the use of charge trap for programming And since in both cases the memory cell could have two independent facets those could be allocated so the same facet is used both for programming and active function or one facet could be used for the programming and the other for the active function.

FIG. 21 of the PCT detailed a horizontal channel transistor on the S/D lines of the 3D NOR, this could be replaced for the 3D NOR-P as a horizontal transistor on the wordlines as is presented in respect to FIG. 16A herein for formation of the Ridge Select (RS) transistors. Adapting the similar fashion of the RS transistors, FIG. 30 concerns the programmable logic function wherein the wordlines are segmented to horizontal gated strips segmented using transistors which could be called Gate Select ("GS"). Each gated strip could have a vertical RRAM strip connected to it to allow use of such gated strip as an independent gate for the selected group of the transistors being controlled by that gate strip for the programmable function. The vertical RRAM strip could be constructed in the ridge splitting region in a similar way to the vertical strips L1, L2, L3, L4 of FIG. 18. FIG. 30 herein illustrates a Look-Up-Table of 4 Inputs ("LUT-4") function implemented on 3D NOR-P resembling the 4 LUT-2 section 3604 of FIG. 36A of the PCT. FIG. 30 is an X-Z 3900 cut view of a section of a 3D NOR-P structure. It illustrates four wordlines 3902, 3904, 3906, 3908 each having a horizontal transistor controlled by vertically arranged GS signal 3910. Four vertical (RRAM electrodes) strips allow the connection of the A and B inputs and their inversion AN and BN connected to the gate strips by RRAM or OTP connection 3912. For the simplicity of the illustration, the gate contacts 3920 are illustrated at the side of the LUTs region 3930, while it could be also be constructed in the ridge split region in between the LUT regions. The illustrated section of the LUT-4 is of four LUT-2s sharing the same 4 control gate signals (A, AN, B, BN). LUT-0 has an output $O_0$ 3914, and two set of four programmable transistors 3916 control the conductivity to the S/D grounded pillar 3918. And so forth for LUT2-1 with output $O_1$, for LUT2-2 with output $O_2$ and for LUT2-3 with output $O_3$. These 4 outputs could be decoded by the two other LUT-4 inputs C, D (and their complement CN, DN) by a circuit similar to the one in FIG. 26 of the PCT. Alternatively the C.D decoding could be implemented in the 3D NOR-P fabric in a similar way to the one illustrated in the section 3606 of FIG. 36A of the PCT. The LUT output could have two complementing LUT function and sense amplifier circuits similar to those in reference to FIG. 23, FIG. 24, FIG. 25 of the PCT. The wordlines (3902, . . . ) could extend through multiple logic function such as is illustrated in FIG. 30 herein and then, at the edge, be part of a staircase access such as presented in reference to FIG. 18 or FIG. 6D herein. The staircase access could be used for programming phase.

The connectivity structure in the 3D NOR-P could be also differential signaling as presented in the PCT in respect to FIG. 24 for sensing, in FIG. 19 for Z direction connectivity in addition to the use of S/D lines, FIG. 32A-32B and FIG. 38A-38I for Y direction connectivity, and wordlines not used for functional gates for X direction connectivity. This programmable connectivity could be adapted as the structures and related processes from the one presented in the PCT for 3D NOR to the 3D NOR-P by technicians in the art.

Similarly, other aspects presented in the PCT could be adapted to the 3D NOR-P structure such as segmenting the vertical pillar as presented in the PCT in respect to FIG. 27A-27E. Also, system level integration presented in the PCT in respect to FIG. 34A-35D, and FIG. 39A-39B. In turn, the 3D fabric can eventually be arbitrarily segmentized into smaller 3D sub-fabric in X-, Y-, and Z-directions.

Using the 3D memory for programmable structures and other concepts presented in the PCT (PCT/US2016/052726) could also be applied to the single crystal alternative called 3D NOR-C4 herein as presented in respect to FIGS. 22E-22G.

An alternative processing option for the 3D NOR-P is presented in reference to FIGS. 31A-31G. This processing option utilized is similar to the process used for 3D NAND, often called "Punch and plug process". FIG. 31A-31G are arranged as a series of figures each have three illustrations at the top 4012—top view along X-Y 4002 direction, at the middle 4011-X-Y 4001 cut-view at the middle of the channel region, and at the bottom 4010—X-Z 4000 side cut-view at the middle of the channel.

FIG. 31A top illustrates a designated channel region 4020 and designated S/D region 4022. The middle cut-view illustration of the same pillars along X-Y 4001 direction at the middle of the channel region, and at the bottom a cut-view 4010 a region of the center of the channel and the S/D pillars. The X-Z cut view illustrates the multilayer structure having two layers of designated wordline of polysilicon 4026 in between isolation layer 4024 such as silicon oxide. Herein, the term "punch" represents a deep etch process to make a through hole across a stack of multiple layers while "plug" denotes a deposition process that either substantially fills out the punch hole or partially deposits on the inner sidewall of the punch hole. FIG. 31A illustrates the region after holes for channel and S/D are etched all the way through the multilayer substrate.

FIG. 31B illustrate the structure after selective isotropic etch through the holes to etch the polysilicon region to form the indentation 4030 similar to 3832 of FIG. 29E. The distance 4021 between the channel holes 4020 and the S/D holes 4022 is set so in this indent step the polysilicon between the holes along the x-direction is completely etched out off the in-between holes gap 4031. However, the hole spacing along y-direction is relatively lager so the polysilicon will remain after completely removing the holes along the x-direction, which in turn supports the structure. Then O/N/O stacked 4032 is deposited (ALD), illustrated in FIG. 31C. Then channel material such as boron doped or un-doped polysilicon 4042 is conformally deposited, illustrated in FIG. 31D. Then, the channel material could be etched away from the holes sidewalls 4044 forming donut like channels 4048 as discussed before 3838. Then, the designated channel holes are sealed 4052 using process such presented in a U.S. patent application 2012/0161255, incorporated herein by reference, using lithography, illustrated in FIG. 31F. Then the S/D could be deposited 4054 into the designated S/D holes—'plug' process, illustrated in FIG. 31G. And then the sealing 4052 could be removed and the back bias or body-line including options such as back-gate oxide and/or metal gate could be deposited into the channel holes. Such selective sealing process is often used the in-situ sealing process to create a vacuum cavity in MEMS technology by using very low step coverage deposition process or very non-conformal deposition process, causing a void. In order to protect the multilayer structure by some residual sidewall deposition of the sealing material, a dummy mask pattern on very top of the multilayer structure may be incorporated. In this approach, the holes to be sealed first have a substantially smaller diameter than the holes to be plugged first. Many variations could be apply to such "Punch and Plug process" 3D NOR-P formation process, including different sizes to the channel holes vs. the S/D holes, various alternatives to fill in the channel pillars such as those previously discussed herein and for the S/D pillars, and additional steps to further reduce the capacitive coupling between the wordlines and the S/D pillars. The high density punch holes 'valleys' forming technique could be adapted to incorporate variations presented herein with respect to slit etch valley formation presented in FIG. 11B, including siliciding the wordline prior to O/N/O deposition, and various indenting concepts.

The single holes punch concept illustrated in FIG. 34A-34C could also be adapted for 3D NAND. Accordingly, all the holes could have an O/N/O deposition followed by a polysilicon deposition forming the vertical channel pillar of the 3D NAND. A select transistor at the bottom of the vertical channel could be formed just like it is done with 3D NAND or by leveraging the layer transfer techniques presented herein and reducing the need for a slit access to the source select. An additional advantage of this alternative is doubling the storage capacity of a cell by having two facets instead of one gate-all-around of 3D NAND.

Figures 31H, 31I, 31J:
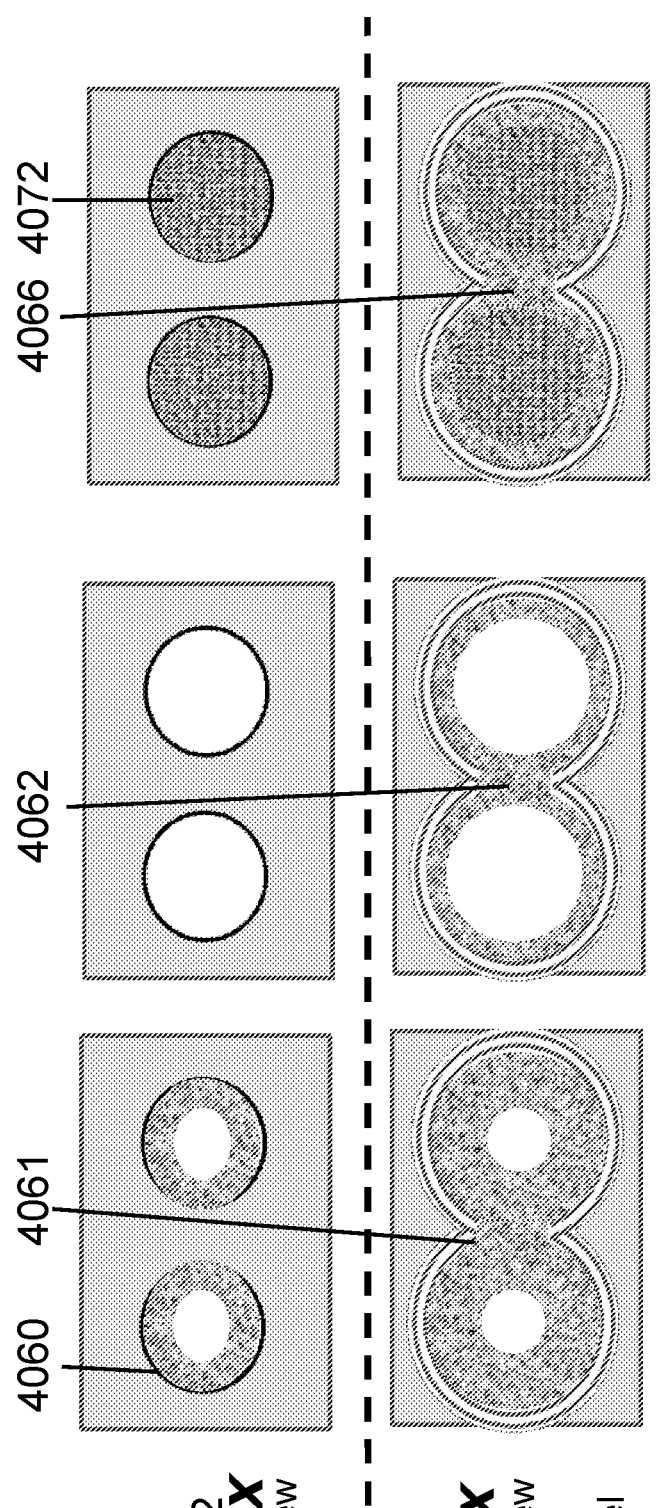

Additional alternative could be presented in reference to FIG. 31H-31J. This alternative share similar step to what have been presented in reference to FIG. 31A-31C.

FIG. 31H illustrates the structure of FIG. 31C after conformal deposition of the designated channel material such as lightly doped or undoped polysilicon 4060, 4061, 4064.

FIG. 31I illustrate the structure after anisotropic etch of the channel material leaving it only it the indent grooves resulted from the indent etch illustrated in FIG. 31B and partially filled by O/N/O as illustrated in FIG. 31C. The channel regions are now the filled polysilicon 4062, 4065 between the punched holes.

FIG. 31I illustrates the structure after plugging in the S/D pillars 4071, 4072. The S/D could be as previously presented n+ poly, metal, metal with oxide barrier (MIS) and so forth. Such flow could support the various memory cell options presented in respect to 3D NOR-P such as SB, DSSB and so forth.

Additional aspect of many 3D memories including those presented herein that deep etch and deposition process could result in memory cell variation between the lowest layer and the top layers. The memory controller could be train to compensate some of those variation especially those that are structural and could be compensated base on the memory layer height.

Additional alternative is to use round holes for the S/D for the flow presented in respect to FIG. 22E-22F. Such could be a variation for 3D NOR-C4. Such could be effective with $1^{st}$ and $2^{nd}$ gates or with just $1^{st}$ gates. Similar flow could utilize multilayer of oxide-poly resulted with polysilicon channel.

FIG. 32A-32F is a 3D X-Y-Z 4100 illustration of an alternative dual punch and plug process featuring the gate replacement process. FIG. 32A illustrates the multilayer substrate consisting of an oxide and nitride stack after first punch of holes designated for S/D pillars. This flow includes wordline replacement to the nitride layer later. FIG. 32B illustrates the structure after lining the holes with sufficient oxide and then plugs the holes with n+ doped polysilicon forming the S/D pillars. The sufficient oxide liner such as ranging from 10 nm to 20 nm is designed to provide a substantial separation for capacitive decoupling between bitline (S/D) and wordline. FIG. 32C illustrates the structure after a second punch of the holes for the channels. FIG. 32D illustrates the structure after plugging the channels with un-doped (or p-doped) polysilicon. FIG. 32E illustrates the structure after forming slits 4102. These slits could be used to replace the nitride with O/N/O and metal gate. In some embodiment, the splits are formed in every four, eight, or sixteen punch hole period along y-direction. Enhancements presented herein such as channel doping or silicidation could be applied prior to the O/N/O deposition. Another alternative is to use a ferroelectric as an alternative to charge trap or in addition to charge trap as also discussed herein. FIG. 32F illustrates the structure after the gate replacement process.

FIG. 33A-33F is a 3D X-Y-Z 4200 illustration of an alternative dual punch and plug process featuring the gate first process. FIG. 33A illustrates the multilayer substrate after first punch of holes designated for the channel pillars. This flow does not include wordline replacement and accordingly the multilayer substrates could be oxide over polysilicon. The holes are then filled with O/N/O or ferroelectric or combination and then with the channel polysilicon. FIG. 33B illustrates the structure after punching holes for the S/D pillars. The holes could be made close enough to the channel but not to expose the channel. FIG. 33C illustrates the structure after selectively indenting the poly with an isotropic etch. The indentation depth toward the channel is limited by the O/N/O layers, and the indentation is greater towards the other direction. FIG. 33D illustrates the structure after filling the indent regions with oxide. FIG. 33E illustrates the structure after partially removing the fill oxide until the O/N/O sidewall is exposed but not exposing the polysilicon gate on the other side to prevent a short between gate and the S/D, and then remove the O/N/O layers through window to expose the polysilicon channel. FIG. 33F illustrates the structure after plugging the S/D holes which could have direct contact with the channel through the exposure made as illustrated in FIG. 33E. Such dual punch and plug process further allows to form a Schottky source/drain that may be used to improve the write speed and energy efficiency. Then some of the ridges could be sliced forming a slits segmenting the wordlines to reduce the wordline's capacitive load. Alternatively, an additional channel could be punch and filled in between adjacent S/D pillars 4266 as indicated in FIG. 33A-33B.

FIG. 34A is X-Y 4001 cut view at the wordline level showing the chain of back to back channels and S/D pillars 4302 forming isolation for the ridges 4304 of the wordline strips without the need for additional lithography and deep etch to separate the wordline. FIG. 34B illustrates an additional alternative for the 3D NOR-P structure using tilted cells packing with 'ellipsoidal' channels. Particularly, FIG. 34B illustrates that the channel is arranged by tilted angle, which makes the effective channel length longer than the source/drain pitch keeping high memory density. The longer effective channel length improves short channel effects and the memory window for minor bit applications.

FIG. 34C is a top view X-Y illustration to show the use of the single hole punch process to construct the various elements which may be needed for the 3D NOR-P fabric. The region cut is illustrated by the dash line 4330 and the in picture cut 4332 is to indicate that the structure could include many more memory cells in X direction. The structure resembles the structure of FIG. 16A. The ledger could be read as follows, the un-punched multilayer structure 4310 forming the wordlines (gates) 4312 in poly; (wordline) ridge select transistor. In-polysilicon layer transistor 4314 used as part of the per layer programming (2732 or RS1-9 as shown in FIG. 18), channel pillar 4316, S/D pillar 4318, control gate 4320 of the in-wordline transistor, vertical pillar for ground 4322 or other programming signal for all layers (5600 of FIG. 47), programmable gate 4324 for the ridge select transistors 4314, isolation pillars 4326, contact pillars 4328 for per layer contacts (L1-L4, 2712-2718, or 5612-5618), optional feed-through pillars 4339 which could be used to transfer signals from the upper side of the fabric to the bottom side. The processing of these holes could be done for a function while the other holes are sealed (4052) or by other alternative techniques presented herein.

An additional embodiment is a memory structure which utilizes vertical S/D pillars such as in the 3D NOR-P structure, yet it also utilizes single crystal channels. Accordingly we will call these structures 3D NOR-C herein. The starting substrates for these structures is a multilayer of single crystal materials, for example, such as repeating silicon and silicon-germanium, which may be formed by epitaxial processing such as presented in PCT/US2016/052726 in reference to its FIG. 3A.

FIG. 35A-35H are 3D X-Y-Z directions 4400 illustrations of an exemplary 3D NOR-C structure. FIG. 35A illustrates an epitaxially formed base substrate, for example, such as described in the previous paragraph. FIG. 35B illustrates the structure of FIG. 35A after a deep etch processing, thus forming ridge 4412 and valleys 4414. FIG. 35C illustrates the structure of FIG. 35B after selective isotropic etching, etching the SiGe layers, and filling in with oxide; such a process is often referred to as a layer replacement. The un-etched single crystal silicon strips are being supported and thereby suspended during the layer replacement process, by periodic side pillars (not shown in FIG. 35C). The sidewalls of the ridges may be cleaned of the excess refill oxide and thereby exposing the sidewall of the single crystal Si layers in the multi layer. FIG. 35D illustrates the structure after indenting the silicon layers leaving silicon oxide strips overhang 4416. The silicon indentation is made on its both sides, but leaving silicon in the center of the ridge. The silicon indentation space is reserved for the O/N/O and polysilicon wordline. The remained silicon then becomes the horizontal channel. FIG. 35E illustrates the structure of FIG. 35D after substantially conformal deposition of O/N/O layers or ferroelectric layer, and gate materials in the horizontal grooves. FIG. 35F illustrates the structure of FIG. 35E after cleaning again the ridge's sidewalls. FIG. 35G illustrates the structure of FIG. 35F after filling the valleys with isolating material 4420 and punching holes for future S/D pillars in the ridge centers 4422. FIG. 35H illustrates the structure of FIG. 35G after filling the holes 4422 with S/D material, for example, such as n+ doped polysilicon or metal or a stack of Fermi level de-pinning ultra-thin oxide and metal similar to previously presented herein (MIS). Accordingly, a 3D NOR-C structure could be fabricated having vertical pillars similar to the 3D NOR-P structures described in herein, yet having a single crystal channel. An additional alternative is to have an additional hole in the center of the channel filled with p-type polysilicon to provide 'body' control to the channel.

In some of the 3D NOR-P or 3D NOR-C, 3D NOR-C4 structures herein the valley between ridges could be used to form storage sites using O/N/O or ferroelectric material or resistive switching dielectric. Such as in FIG. 35F-35G the valley 4421 which is later filled by oxide 4423. These valleys could be made additional storage sites by depositing a charge storage layer and then forming channel and S/D pillars similar to what have been presented in respect to FIG. 11D-12D herein. In this case, the group of device formed later would have a NOR-P structure with a polysilicon channel. Thereby, the single crystalline channel NOR-C and the polycrystalline channel NOR-P sharing the wordline are co-existing.

FIGS. 36A-36K are 3D X-Y-Z directions 4500 illustration of an alternative 3D NOR-C structure. FIG. 36A illustrating epitaxial base multilayer substrate of single crystal silicon thin layers of light boron doped or undoped 4502 and relatively thicker sacrifice layer such as SiGe 4504 in between. FIG. 36B illustrates the structure of FIG. 36A after deep etching, thus forming ridges 4512 and valleys 4514. FIG. 36C illustrates the structure of FIG. 36B after selective etching of the SiGe layers leaving spine 4505 to keep holding the structure similar to FIG. 35D. FIG. 36D illustrates the structure after substantially conformal deposition (ALD) of storage layers, for example, such as O/N/O 4522, gate layer 4524, and oxide fill 4526, the process of deposition could include of sidewalls cleaning etch to keep the valleys open for the following deposition step. FIG. 36E illustrates the structure of FIG. 36D after a substantially directional etch of new valleys 4530, removing the SiGe spines 4505 and the sidewalls 4528. As a result, the original one ridge is divided into two ridges. FIG. 36F illustrates the structure of FIG. 36E after a selective gate material etch to indent the gates from the valleys 4530, and filling in with a decoupling oxide to separate the gates from the subsequent S/D pillars. FIG. 36G illustrates the structure of FIG. 36F after substantially filling the new valleys 4530 with isolation material 4532 and punching holes 4534 for S/D pillars. The S/D holes 4534 should expose the sidewalls of the silicon layers and the process could include a selective silicon etch to indent the silicon to allow the S/D better contact into the channel being formed by the silicon layer. Alternatively, without a selective silicon indentation etch, the highly doped n+ dopants from subsequent S/D pillars could be made to diffuse and penetrate from the sidewall of silicon channel along the y-direction by controlling thermal process such as annealing. FIG. 36H illustrates the structure of FIG. 36G after substantially filling in the S/D pillars 4536. The S/D could be n+ doped polysilicon, metal or metal with thin oxide barrier as previously discussed. FIG. 36I provides a cut view of the resulting structure having a silicon strip 4540 having a top surface to function as the top channel facet with top storage O/N/O and top gate function as the top wordline WLt and bottom channel facet with bottom O/N/O and gate being the bottom wordline WLb. Between the gates and the S/D pillars there is decoupling oxide 4542. FIG. 36J illustrates the repeating memory cell having four S/D pillars to support four or even eight channel current direction as is indicated in FIG. 36K. This structure allow multi storage site on one channel facet driven by one gate and combination of four S/Ds. Using a technique such as mirror-bit the memory cell could support 12 bit sites on each facet for 24 locations per channel with a potential multilevel per storage site. So selecting two out of the four S/D pillars of FIG. 36K and one wordline, such as WLt, will select a current path such as 4546 for selecting S/Dee and S/Deo.

FIG. 36K illustrates an X-Y 4550 cut of a repeating element of 3D NOR-C which could be used to reference memory control lines. The wordline 4552 is oriented along the X direction and could be selected by an appropriate per level staircase, and could have a per ridge select transistor formed in, or split to odd and even group as discussed in respect to 3D NOR-P such as in reference to FIG. 15A-FIG. 18. The global bitlines could be oriented along the Y direction and could be arranged to have four independently selected bitlines per the four pillars associated with each memory cell such as illustrated in FIG. 36K. These bitlines can connect together the odd and even S/D pillars forming four S/D pillars group: such to Odd-Odd, Odd-Even, Even-Odd, Even-Even. Choosing two adjacent bitlines and one wordline will define a specific storage site for read or write.

The dimension for such structure could be set base on the capabilities of the fabrication line, number of layers in the 3D NOR-C fabric and similar consideration to be engineered by memory engineer. Such could be to have the width of the channel (in Y direction) more than 20 nm or about 30 nm or 40 to 60 nm or even larger. The thickness of the Silicon layer 4502 could be more than 10 nm or about 20 nm or even higher. The thickness of the SiGe layer 4504 could be more than 40 nm or 50-60 nm or even 80-100 nm. The holes for the S/D pillars 4534 could be more than 20 nm or 30-40 nm or even more than 50 nm. The distance between these holes 4532 could be more than 10 nm or 30-40 nm or even more than 50 nm.

An alternative process to form similar structure (as illustrated in FIG. 36H) of 3D NOR-C, is illustrated with FIG. 37A-37I, this alternative require fewer deep vertical etch steps through the 3D multilayer structure, which could help reduce the processing cost. FIG. 37A-37I are constructed each figure includes three view cuts, at the top XY 4600 top view, at the middle ZY 4621 cut view along the first designated etch holes 4620 and at the bottom an ZY 4641 cut view along the second designated etch holes 4640. The second etch holes drawn smaller in size compared to the first designated etch holes are for forming the tentatively designated holding pillars 4642, and are designated for the eventual S/D pillars 4656. These cut figures are a small region of the repeating memory structure, which could be tiled many times over forming a 3D NOR-C memory chip structure. FIG. 37A illustrates the substrate having designated channel layer 4622 which could be single crystal silicon layer and sacrifice layer 4624 which could be single crystal SiGe formed by epitaxial growth if desired. FIG. 37B illustrates the structure after a deep anisotropic vertical etch through the designated channel layer 4622 and sacrificial layer 4624. The first etch hole 4620 and the second etch hole 4640 may have different diameters, and could processed together in the same lithography and the same deep vertical etch processes. FIG. 37C illustrates the structure after forming first sealing 4601, sealing the 'first etch holes'. Such sealing could use processes similar to the ones discussed in respect to FIG. 31F herein. After the sealing step, a conformal deposition of oxide 4602 could be used forming supporting structure for holding pillars 4642 through the unsealed second holes. FIG. 37D illustrates the structure after removing the first sealing 4601 off on the first etch holes and forming second sealing 4611 sealing the second etch holes designated for S/D pillars. And etching out the sacrificial SiGe layer through the 'first etch holes'. FIG. 37E illustrates the structure after a conformal (ALD) deposition of a storage layer, such as O/N/O, through the first etch holes 4606 surrounding the channel strips with O/N/O 4626, the conformal deposition will result in the storage layer also being deposited on the holding pillars 4646. FIG. 37F illustrates the structure after a following conformal (ALD) deposition of the gate material 4608 surrounding the O/N/O covered channel strips with gate material 4628; the conformal deposition will result with the gate layer also being deposited on the holding pillars 4648. An etch step could be used to clean the sidewalls of the 'first etch holes', during these sequences of deposition through the 'first etch holes' to keep them open. FIG. 37G illustrates the structure after first etching and cleaning the sidewalls from gate material and then may be followed by filling in oxide 4609, which could also fill the space between the gate material 4629. FIG. 37H illustrates the structure after removing the second sealing 4611 from the 'second holes' and sealing again the 'first etch' 4612. Then through the second holes, a sequence of isotropic etches may be performed thus removing the oxide holding pillar, then with a short selective etch remove the access storage material and the gate material previously deposited on the holding pillars.

FIG. 37I illustrates the structure after first filling with oxide isolation material 4655 followed by a anisotropic etch and sidewall cleaning, which could include silicon channel indentation, followed by a S/D filling 4656 in the second holes. The S/D could be n+ polysilicon or metal or metal with thin isolation. The step of forming S/D could include a step of first indenting the exposed gates and sealing with oxide. Such indent could be designed to reduce the capacitive load of the S/D and the gates. Additional S/D could be formed on both set of holes (4620, 4640), to increase the memory density.

The 'first etch holes' seal 4611 could be removed, the holes could be cleaned and additional control pillars such as second S/D could be filled in to provide a better channel control for additional storage sites.

Additional holes could be formed in the center of the channel to fill in control gate to reduce leakage. These holes could be formed together with the 'etch holes' and S/D holes' and be sized so to be sealed by the O/N/O deposition, or could be formed at another step and engineered accordingly to support enhancements such as adding a center gate isolated from the first gate to function as second control gate.

Additional 3D NOR-C enhancements could aim to reduce capacitive coupling between gate lines 4631, 4632. Such could be achieved by the choice of inter-gate filling material 4629 related to FIG. 37G such as, for example, high porosity isolation or an air gap. An additional option is to deposit additional shielding material in the center. Additionally, the channel layer could be designed to be epitaxial grown as undoped or lightly boron doped first, then highly doped p+ in the center, and then undoped or lightly boron doped. The center of such channel formation could be used as 'body-line'.

An additional 3D NOR-C enhancement could aim to reduce capacitive coupling between gate lines and their disturbed channels. One such option could be a periodic step of the channel strips disconnects. This could be achieved with an additional step of lithography, thus opening vertical access through some of the 'first etch holes', and then a selective isotropic etch of the channel material, creating segmentation of the channel strips.

Such a 3D NOR-C could incorporate many of the alternatives and techniques presented in herein in respect to the 3D NOR-P structures, including combinations of Schottky Barrier and ferroelectric. As well, the control circuit such as staircase and per layer access as presented before in respect to FIG. 15A-FIG. 18.

An additional alternative is to form memory with architecture similar to 3D NOR-C using polysilicon channel.

An additional alternative is to form per channel-layer connection or body tapping and to use such per channel connection as a part of the storage site decoding/selection. Alternatively, per-channel body tapping may be used to actively write or erase the storage sites. Instead of using physical contact through a staircase structure, the 'per channel' contact may be accomplished through a transistor gate. Then, a single vertical signal feeding line is shared for a number of channels in a ridge. In such a 3D NOR-C structure, there is an option to use a single gate line in-between two layers of channels by using the channel access to inhibit one channel while accessing the other channel. In such case, the steps presented in respect to FIG. 37G-37H could be skipped and the thickness of the sacrificial layer could be reduced. Such alternative is further described as follows.

Figure 38B:
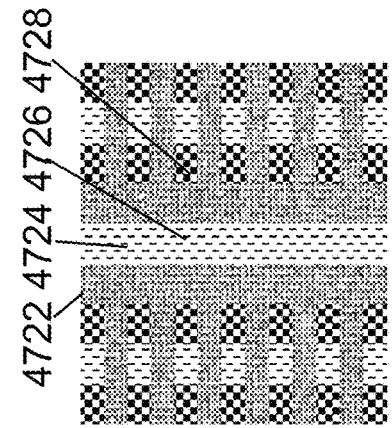
FIGS. 38A-38C are example illustrations of an additional alternative 3D NOR-C structure and formation thereof.
Figure 38A:
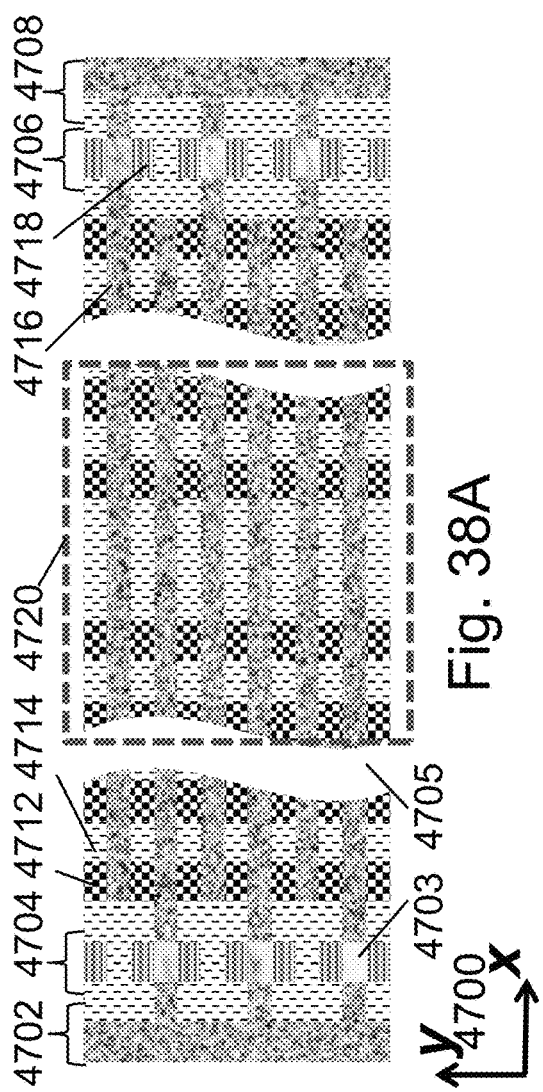

FIG. 38A illustrates an X-Y 4700 cut view at a gate level 4716 of a section of a 3D NOR-C unit (FIG. 36A-K or FIG. 37A-I). FIG. 38A illustrates Y oriented per layer connection 4702, 4708. FIG. 38A structure is similar to the structure presented in reference to FIG. 15A-15C. FIG. 38A also illustrates the ridge selects on both ends 4704, 4706. In this embodiment, the one side of the ridge select is dedicated in odd ridges while the another side of the ridge select is devoted for even ridges. Such staggering the ridge electric from one end to another end allows wider spacing between ridge select ridge region at the end of the ridge. Then, the widened spacing offer process window for placing two separate z-directional select transistor gates. In another embodiment, the ridge select portion is not staggered but one z-directional select transistor gates may control two adjacent side of facets. The ridge select transistor could be controlled by per-channel select gate 4718. The figure indicates the filled S/D pillars 4712 and the oxide fills 4714 of the first etch holes. The length of the memory unit in Y direction and in X direction could be engineered to support the desired product specification and could be a few micron, tens of microns, or even hundreds of microns. The gap 4705 illustrates a repeating structure at the design length in X direction. FIG. 38A also illustrates a periodic region 4720 in which channel disconnect could be performed to reduce the channel to gate capacitive loading effect. FIG. 38B illustrates an X-Y cut at the channel level of the 4720 region. The channel cut 4724 could be done by use of dedicated lithography and sealing of the other first etch holes. After completing replacing the SiGe process, a selective isotropic silicon etch may be used to disconnect the channels at these designated locations 4724. If the gates filled are polysilicon, then a prior step of indent and oxide protection could be used to avoid etching the gate lines. In consideration of the desire to form per channel level vertical connection, it could be useful to include some vertical Y direction bridges 4722. Such could enable the desired amount of channel vertical pillar connection without having too large of a channel overlap with the same gate line. The number of vertical pillars for per layer connection is compatible with the number of layers used for the 3D NOR-C structure which could be below 10, or over 20 or over 40 or even over 80. The Y direction channel bridges 4722 could be achieved by avoiding the first etch holes in these locations.

For the vertical per channel connection a programming such as anti-fuse as previously discussed herein could be used. These per channel programmable connection could leverage the previously formed a per layer gate connections. The structure could allocate unused 'first etch holes' 4609 (FIG. 37G) by proper forming RRAM structure by depositing programmable isolation between the channel regions and vertical electrodes in these selected 'first etch holes. The channel in these regions could be indented to fill in the programmable isolation, which could be RRAM material or thin oxide for OTP. To program a connection between a pillar CP-n, and channel at level 'n' the wordlines underneath the channel and on top of it: WLn and WLn+1 could be activated at positive voltage (1 v) the wordlines below and on top: WLn−1, WLn+2 could be deactivated with higher negative voltage (−3 v). Then a S/D pillar very close to the designated pillar/electrode CP-n could be activated with programming voltage Vp (3 v) and another S/D, and the designated pillar/electrode CP-n could be grounded to activate the RRAM or OTP forming connection between pillar/electrode CP-n and the channel at level 'n'. These could be performed one by one for all channel layers and segments.

Using the per channel 'body' connection a single gate WLn could be set to control channel 'n−1' while CP-n could be used to disable channel 'n'.

Figure 38C:
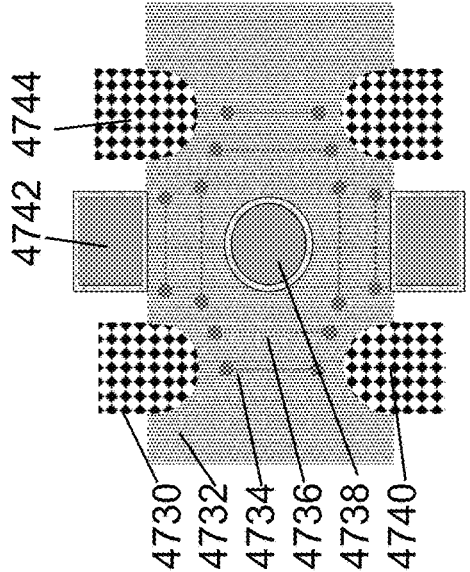

Other forms of per layer access including use of a physical staircase as known in 3D memory and as presented herein FIG. 38C is an X-Y 4700 illustration of a storage region 4732 (O/N/O) similar to the one illustrated in FIG. 36K. It illustrates an optional alternative to increase memory capacity by use of nearby pillars 4742, 4738 to deflect storage sites locations 4734, 4736 by selecting and using pair of S/D pillars 4730, 4740 and the related wordline and channel contact if needed. Storage location deflection has been presented in many memory structures herein including in reference to FIG. 23A. The center pillar 4738 could be formed together with other holes being punched and could then be sealed to the process phase for it to be processed, or could be formed afterwards. The side pillar 4742 could be formed leveraging the 'first etch holes' and could be also a dual function being used also as a channel access to a specific channel level region. The side pillar 4742 could be used to deflect storage location for the case in which the selected S/D 4730, 4744 are next to it.

Storage site deflection could be useful for a relatively larger storage cell which provides large storage surface. While in 2D devices, storage cell sizes are trending down with scaling. In some 3D devices, scaling up could be associated with a relatively larger storage cell size and thus site deflection could be effectively used to increase overall memory density.

An additional alternative when the memory structure includes body access, as presented in reference to FIG. 27A-27B and many of the other 3D NOR-P and 3D NOR-C structures in here, is to use programming method known as Channel Initiated Secondary Electrons injection ("CHISEL") which could allow lower writing voltages. For example, the Source line could be held at Vs=0 v the Drain at Vd=2 to 3 v and the 'body; at Vb=−2 to −3 v for programming Such programming techniques have been detailed in a paper by Mahapatra, Souvik, S. Shukuri, and Jeff Bude, "CHISEL flash EEPROM. I. Performance and scaling," IEEE Transactions on Electron Devices 49.7 (2002): 1296-1301; by Mahapatra, Souvik, S. Shukuri, and Jeff Bude. "CHISEL flash EEPROM. I. Performance and scaling." IEEE Transactions on Electron Devices 49.7 (2002): 1296-1301; by Driussi, Francesco, David Esseni, and Luca Selmi. "Performance, degradation monitors, and reliability of the CHISEL injection regime." IEEE Transactions on Device and Materials Reliability 4.3 (2004): 327-334; by Nair, Deleep R., et al. "Explanation of P/E cycling impact on drain disturb in flash EEPROMs under CHE and CHISEL programming operation." IEEE Transactions on Electron Devices 52.4 (2005): 534-540; and by Stefanutti, Walter, et al. "Monte Carlo simulation of substrate enhanced electron injection in split-gate memory cells." IEEE Transactions on Electron Devices 53.1 (2006): 89-96, all incorporated herein by reference. CHISEL techniques may be less effective for poly based structures and would need a channel and body thick enough to support hole acceleration away from the gate.

Figure 39:
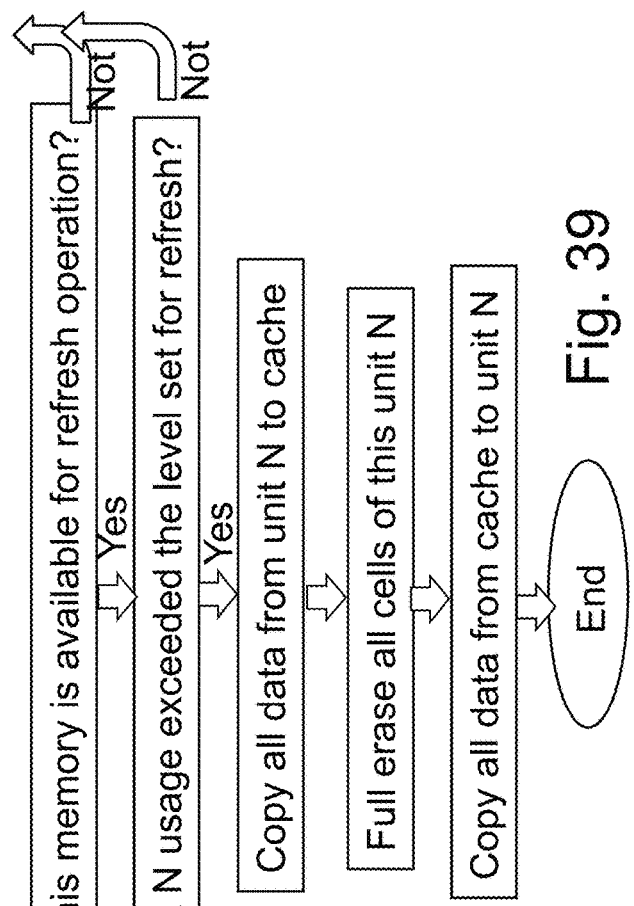
FIG. 39 is an example illustration of a block diagram for a refresh operation flow.

An additional alternative is to construct the 3D memory of arrays of relatively small memory units, with memory control circuits on top or under of such units as presented in here. And then perform per unit refresh and other techniques to extend memory effectiveness. These memory units could have an X direction and/or Y direction size of a few tens of microns, or a few hundreds of microns. For example, some of the concerns with memory structures relate to disturb and other forms of losing memory fidelity. Those could impact the level of memory density utilization. With 3D memory systems, for example, such as illustrated in FIG. 11A-11E, of PCT/US2017/052359 the control system could copy the contents of a memory unit to some cache storage, erase the unit and re-write the contents to restore memory fidelity. These refresh cycles could be performed based on time or activity of that memory unit, as well as temperature exposure. These refresh operations could be performed at a time there is no active use of the memory so auto-maintenance could be performed. FIG. 39 illustrates a block diagram for such refresh operation flow. Such refresh could extend the effectiveness of the memory by enabling increased bit sites within the memory cell and a greater number of levels within such storage sites. Having the staircase along the Y direction orthogonally aligned to the ridge direction reduces the area overhead associated with per layer access. Combined with 3D integration of memory control circuits transferred and added on top and/or under the memory matrix, supports having the memory device built from many micro-arrays each with its own memory control circuits. Such micro array or unit could have an X direction and/or Y direction size of a few tens of micron, or a few hundreds of micron. Reducing the capacity and resistance of the memory control lines allows lower power and higher speed for the memory device. Such memory architect also enables parallel access to many units for refresh as illustrated in FIG. 39.

An additional technique to improve charge trap storage retention, which resembles the 'self-refresh' of a floating body cell, is to pulse a positive voltage using the wordlines. The positive voltage should be less than the writing voltage to the wordline. Or alternatively to pulse a negative voltage less than the erasing voltage to the back gate or contacted body-line when it is available. Such could help to hold the data or increase the data retention time. Such techniques could be effective to increase the data retention time for the O/N/O based charge trap. It could be integrated into O/N/O base DRAM which could have a thin tunneling oxide, perhaps of less than about 1 nm. Such a technique could be adapted for use on ferroelectric based memory. In ferroelectric memory, a negative voltage pulse, which is less than the erasing voltage, could be applied to the wordline or a positive voltage less than the programming voltage could be applied to the back gate or contacted body when such as available.

Additional technique that could be applied to many of the 3D Memory structures presented herein, especially when the target application could be compromised between write speed and retention time is to tune the charge trap layer accordingly. As illustrated in IEEE ELECTRON DEVICE LETTERS, 16, 11, p. 491, 1995 by H. Clement Wann and Chenming Hu, "High-Endurance Ultra-Thin Tunnel Oxide in MONOS Device Structure for Dynamic Memory Application", while thinning down bottom-oxide (often called tunneling oxide herein) thickness improves program speed, retention time decreases significantly. An alternative approach may be considered wherein the bottom-oxide may be replaced with low-trapping nitride such as oxinitride as published in Masayuki Terai, Koji Watanabe, and Shinji Fujieda, "Effect of Nitrogen Profile and Fluorine Incorporation on Negative-Bias Temperature Instability of Ultrathin Plasma-Nitrided SiON MOSFETs", IEEE TRANSACTIONS ON ELECTRON DEVICES, VOL. 54, NO. 7, JULY 2007 or JVD nitride as published in IEEE ELECTRON DEVICE LETTERS, VOL. 21, NO. 11, pp. 540 2000, by Yee Chia Yeo, Qiang Lu, Wen Chin Lee, Tsu-Jae King, Chenming Hu, Xiewen Wang, Xin Guo, and T. P. Ma, "Direct Tunneling Gate Leakage Current in Transistors with Ultrathin Silicon Nitride Gate Dielectric", incorporated herein by reference. For a similar retention time, such a layer may provide better control of the O/N/O formation as the required thickness is significantly larger, directly related to the ratio of dielectric constants, 7/3.9. Such an advantage may be realized with a very thin nitride layer of about 1 nm which may be production worthy compared ~0.6 nm silicon-oxide. An additional advantage is a faster FN erase speed thanks to the significantly smaller offset in valence band with respect to the silicon. Such a method may therefore facilitate erase operation and limit erase voltages to lower or similar values as the program voltage. Program speed may also be improved significantly thanks to the smaller band offset if hot electron injection mechanism is utilized. Such a method may be Channel Hot Electron Injection (CHEI) or Channel Hot Injection Secondary Electrons (CHISEL) in doped np junction or alternatively in Schottky Barrier or DSSB transistors hot electrons are generated next to the source wherein injection also takes place. Further improvement in program and erase speed or voltages may be brought about by thinning down to 2 nm the tapping nitride layer which may be formed either by LPCVD or ALD methods with potentially significant program window of 1-2V as referred in IEEE ELECTRON DEVICE LETTERS, VOL. 32, No. 11, p. 1501, 2011 By G. Van den bosch, G. S. Kar, P. Blomme, A. Arreghini, A Cacciato, L. Breuil, A. De Keersgieter, V. Paraschiv, C. Vrancken, B. Douhard, O. Richard, S. Van Aerde, I. Debusschere, and J. Van Houdt, "Highly Scaled Vertical Cylindrical SONOS Cell With Bilayer Polysilicon Channel for 3-D NAND Flash Memory"; by Chiu, Yung-Yueh, et al. "Characterization of the charge trapping properties in p-channel silicon-oxide-nitride-oxide-silicon memory devices including SiO2/Si3N4 interfacial transition layer." Japanese Journal of Applied Physics54.10 (2015): 104201; Young, K. K., Chenming Hu, and William G Oldham. "Charge transport and trapping characteristics in thin nitride-oxide stacked films." IEEE electron device letters 9.11 (1988): 616-618, and U.S. Pat. Nos. 8,643,124 and 8,633,537, all of the foregoing are incorporated herein by reference. Alternatively the bottom-oxide of the O/N/O structure could be replaced by an oxinitride or JVD nitride. Other forms of such multilayer could be engineered to fit the specific design objective of retention vs. write time. Additionally, the deposition of the O/N/O layers in many applications could be done by alternative deposition processes such LPCVD, and the gate replacement process could utilize ALD technique called: low-fluorine tungsten (LFW) ALD process.

An additional alternative in forming 3D NOR-P structure supports a single punch-deep vertical (Z direction) etch-through the multilayer substrate, without the need for dedicated hole sealing such as 4611, 4052 but rather use auto-sealing. A substrate of multilayer of poly and oxide as illustrated in FIG. 11A could be processed with a deep vertical etch forming the structure illustrated in FIG. 40A, a 3D illustration with direction X-Y-Z 4900. It illustrates array of holes designated to form array of 3D NOR-P cell in which each channel designated slit 4902 having relatively narrow to be auto-sealed, is coupled to two holes designated for S/D 4904 being relatively wide to be left un-sealed. The channel region may be drawn box shaped, alternative shapes such as circle or ellipsoidal shaped channel are possible as long as the fundamental idea having two different holes sizes, one set of holes, would be fully filled while the others would be still open. In FIG. 40A, each S/D is coupled to a single channel while in another alternative illustrated in FIG. 40C each S/D (other than the first and the last in a row) is coupled to two channels. Both options represented are called herein NOR-P. The first one could be considered easier to control with less risk of disturb while the second one (FIG. 40C) offers higher density. Both could support two facets per channel/cell. The channel width in the Y direction could be designed to be wide enough to fill in O/N/O (about 10 to 30 nm per choice of material and functionality) on both sidewalls, and additional room for channel material. For this structure one option is to design the channel width small enough so that the channel could be filled with n++ polysilicon which is thin enough (~5-10 nm) to be controlled by the gate, thus being a junction less transistor. Accordingly a single deposition of n++ could be used to form both the channel and the S/D at the same time. FIG. 40B illustrates the structure after filling in the n++ polysilicon. FIG. 40C illustrates the alternative in which S/D pillars are dual function as they are coupled to two channels effectively forming ridge 4914 and valleys 4912, resembling many of the 3D NOR-P structures herein. Accordingly, many of the alternatives such as ridge select and so forth could be adapted for this structures. Two 'key ideas' are effective in this structure. First the channel material could be the same as the S/D material and function differently by properly engineering the relative sizes and shape. The second is that using one deposition process different amount of material is being deposit into the channel and into the S/D by properly engineering the relative sizes and shape so the channel, so the channel region could be fully filled while more material is keep on being deposited into the still open S/D holes. The second idea could be extended to allow adding additional materials into the S/D holes once the channel holes have been sealed off. This could include adding metal in the center of the S/D pillars 5004 as is illustrated in FIG. 41. The metal could be used for silicidation, SB and DSSB and similar variation presented herein. An additional alternative is to have the channel material be p-type and add n++ in the center of the S/D pillar supporting even more alternatives device structure options. The channel deposition could leave some thin region unfilled.

An additional alternative to the process presented in respect to FIG. 40A-FIG. 41, is to perform an isotropic selective etch to indent the polysilicon regions through the punched channels and S/D holes. The indent step and the polysilicon layer thickness could be engineered to encompass the storage layers, also referred to as the O/N/O layers and the channel material (see 3195, 3197 for example). This groove lie indentation could support that following anisotropic and isotropic etch and sidewalls cleaning, leaving vertically separated O/N/O and channel materials segments. The S/D materials could be then deposited in the S/D holes and to the channel holes, seal the channel holes. This could form a cell structure having isolated channel region per layer similar to what was referenced before as Ring or Donut channel, as is illustrated in FIG. 42.

An additional alternative structure could be formed using single hole punched without the need for dedicated hole sealing step such as 4611, 4052, using third 'key idea'. The third key idea relates to a huge difference in isotropic etch nano-meter (nm) level etch through open micro-meter (µm) vertical hole in the multilayer structure, versus such etch affecting sealed holes. This 'key idea' could be applied so the channel could be first fully processed including forming 'body' such as illustrated in FIG. 27B-27C and/or FIG. 28H. Once the channel holes are fully filled and accordingly sealed, any of the channel material that was also deposited into the S/D holes could now be selectively isotropically etched through the still open S/D holes. This concept is presented in the following in reference to FIG. 43A-43F, in respect to one of the 3D NOR-P previously suggested architecture and could be adapted by memory artisan to many of the other structures herein.

FIG. 43A is a 2D top view in X-Y 5200 direction of a multilayer substrate region in which a deep vertical etch was performed opening holes for the S/D pillars 5206 and for the channel 5208. The polysilicon layer 5202 is shown covered by oxide layer 5204. The polysilicon layer 5202 could be about 30 nm or 40-60 or 60-100 nm or thicker, and the oxide layer could be about 10 nm or 10-30 nm or even thicker. The number of layers could be less than 24 or 32-64 or 96-200 or even higher. According the deep hole in the vertical direction could be less than about 1 micron or 2-3 microns, 3-6 micron or even thicker. The channel hole 5208 could have a diameter of about 10 nm or 10-20 nm 20-40 nm or bigger. The S/D holes 5206 diameter could be about 1.5× larger than the channel holes diameter or 2× larger, or even a higher ratio. These dimension option are relevant to other 3D NOR-P, 3D NOR-C, and 3D NOR-C4 in here.

FIG. 43B illustrates the structure after a step of selective polysilicon isotropic etches through the holes indenting the polysilicon layers 5210 forming grooves. The groove size could be engineered to accommodate adding in storage layers and channels. The storage layer could be, for example, O/N/O, ferroelectric materials, their combination, or other storage materials. The channel could be any of channel previously suggested here such as undoped, p doped, or even n+ doped for the JLT case, with the appropriate size as previously discussed.

FIG. 43C illustrates the structure after deposition (usually ALD) of the storage layer (nominally O/N/O) 5214, and the channel material 5216. As illustrated these steps affect both the channel holes and the S/D holes. Following the deposition the sidewall of the holes could be cleaned, generally via an etch process. Note, the horizontal line seen crossing the center of holes is the gap formed following the indentation process between adjacent S/D and channel holes, not filled by the O/N/O and channel layers formation.

FIG. 43D illustrates the structure after deposition the channel core 'body line' which could include oxide 5232, metallic 5234 core, and sealing oxide 5236. This step could be engineered to seal the channel holes and could result with less desired materials been deposited into the S/D holes.

FIG. 43E illustrates the structure after an isotropic etch etching out 5242 the less desired materials from the S/D still open holes with minimal affect on the now sealed channel holes. As previously discussed the deep vertical holes could exceed 1 micron deep, and etch this holes extra deposits less desired material (1-20 nm thick) on these holes sidewalls would have minimal affect on the other part of the structure such as the now sealed channel holes.

FIG. 43F illustrates the structure after deposition of the desired S/D pillar 5244 (n++, silicide, DSSB, SB, . . . ).

An additional alternative is to add a second gate for the 3D NOR-P, using similar flow (FIG. 43A-43F). For this alternative, the multilayer formation could include 'triple oxide' layer such as oxide-sacrificial layer (nitride)-oxide instead of the simple oxide layer. A nominal thickness for the 'triple oxides' could be 10-20-10 nm each. Then following the completion of the steps associated with FIG. 43C, and before starting the steps associated with FIG. 43D, the sacrificial layer layers could be replaced with gate material (poly or metallic such as tungsten) forming $2^{nd}$ gate in each the gate layers of FIG. 43C, now called $1^{st}$ gates. The replacement step could include an isotropic selective etch of the sacrificial layer layers through the holes 5206, 5208. This may be followed by conformal (such as ALD) deposition of gate material in the formed grooves, with a sidewalls cleaning step. This could then be followed by a small indent of the newly formed $2^{nd}$ gate layer through the holes with filling the indent region with oxide to avoid shorts with the future channels body and S/D pillars. Proper use of specific layers of first and second gate could increase the storage capacity of the memory structure making use of the O/N/O layer on top and below the donut channel. FIG. 44A is a side cut view along Y-Z direction 5300 of a region indicated in FIG. 43C by 5213. It illustrates a 'triple oxide' layer—silicon oxide 5307, sacrificial layer 5308 and silicon oxide 5309, between two poly gate layers 5304, 5314. The replacement layer now called $2^{nd}$ gate could function as gate to the respective O/N/O 5307 and channel 5306 for the upper cell and O/N/O 5311 and channel 5312 for the lower cell. FIG. 44B illustrates the structure after replacing the sacrificial layer 5309 with gate material for the second gates 5310. It also illustrates the indenting of the 2nd gate and the added oxide 5318 for isolation it from future S/D and channel 'body', if used. It is preferred to use a sacrificial layer material which is not used in the storage layer (O/N/O) to simplify the selective etch. Additional processes could be used to protect the storage layer if needed.

An alternative to the concept related to FIG. 44A-44B is to have the 'triple dielectrics' be; sacrificial layer-silicon oxide-sacrificial layer. So 5307, 5309 would both be sacrificial layers, enabling selective replacing of both with gate material. In such a structure, the replacement step would not form $2^{nd}$ gate but could be used to strengthen the $1^{st}$ gate by allowing silicidation and/or gate around the three O/N/O facets (not shown in the illustrations). This could also be used for a channel made of n++ (JLT option). It could allow achieving good electrostatic control by keeping the channel thin in the vertical direction (below 10 nm or even below 6 nm) and wider horizontally for lower resistance.

An additional alternative is to have 'five dielectrics' instead of the 'triple-dielectrics' meaning: oxide-sacrificial layer-oxide-sacrificial layer-oxide. In such structure similar process (to FIG. 44A-44B) will form two $2^{nd}$ gates—lower-$2^{nd}$ gate and upper-$2^{nd}$ gate, so the selected channel could be controlled by three dedicated gates, reducing disturb to adjacent cells and simplifying the control function.

An additional option is to perform the layer replacements of sacrificial layers with secondary gates, presented in respect to FIG. 44A-44B, starting from the step in the flow represented by FIG. 43E. It might need some additional clean etching to expose the dielectric layer through the open S/D holes 5242. An advantage for this option is that the dielectric materials do not need to be selective against the inner portion of the storage layer, such as the nitride within the O/N/O, which would be protected in the sealed channel holes 5240. Additionally the filled channel holes could function as posts to support the $1^{st}$ gates wordlines during the layer replacement process. Once layer replacement has been completed, a step of isotropic etch could be used to distance the new gate material from the yet to be deposited S/D pillars. Once the structure is indented, an oxide could be filled in and then be removed from the sidewalls making the holes ready for the S/D pillar deposition as presented in reference to FIG. 43F.

An additional flow alternative to the structure formation presented in respect to FIGS. 44A-44B is presented in the following in respect to FIGS. 44C-44F. The starting multilayer substrate could use a single dielectric such as silicon nitride. FIG. 44C illustrates the structure after cleaning the S/D holes and before the polysilicon indent and O/N/O and channel formation of FIG. 44A. FIG. 44C illustrates the polysilicon layers 5340, the nitride layer in-between 5344, and additional protective layer 5342 that could be formed from the S/D and channel holes by a small indent of the nitride layer 5344, deposition of the protective layer 5342, and sidewalls cleanup. The protective layer should have etch selectivity with respect to the polysilicon layer, the storage layers—O/N/O and the channel layer. FIG. 44D illustrates the structure after forming the storage layer 5350 and the channel layer 5352. Now using the protective later 5342, the storage layer (O/N/O) could be indented and then protected by oxide 5356. Then the protective layer 5342 is removed followed by selective isotropic etch of the nitride layer 5344 leaving room 5354 for $2^{nd}$ gate formation as is illustrated in FIG. 44E. Care could be taken to form holding posts such as the posts 4642 presented in respect to FIG. 37C. Then $2^{nd}$ gate could be formed into the cleared space 5354. FIG. 44F illustrates forming lower-$2^{nd}$ gate 5353 and upper-$2^{nd}$ gate 5354 by first conformal deposition of oxide layer 5352, 5356, followed conformal deposition of the second gate material 5353, 5354, which could be metallic, for example, such as tungsten. Then the gap isolating the $2^{nd}$ gate 5356 may be sealed. Cleaning the sidewalls could be performed at the end and if needed during the conformal deposition to keep the holes open.

Additional option is to perform the layer replacements of sacrificial layers with secondary gates, presented in respect to FIG. 44C-44F, starting from the step in the flow similar to the one represented by FIG. 43E. It might need some additional clean etching to expose the dielectric layer with the open S/D holes 5242. An advantage for this option is that the steps related to the protection of the nitride within the O/N/O by forming 5342 and 5356 could be saved since the nitride of the O/N/O is now protected either by oxide or by the sealed channel holes 5240. Additionally the filled channel holes could function as posts to support the $1^{st}$ gate wordlines during the layer replacement process. An important variation for these alternatives is that the channel hole core is kept open while the sealing could be provided by top sealing such as 4052 presented in respect to FIG. 31F. Once layer replacement has been completed, the channel hole sealing could be removed and through the open cores of the channels holes, using a selective isotropic etch, the undesired deposits of the 2nd gates materials could be first etched to isolate the bottom 2nd gate 5353 and upper 2nd gate 5354. This step is similar to the one presented herein in respect to FIG. 37H. These $2^{nd}$ gate etches could also be used to distance the new gate material from the yet to be deposited S/D pillars. The indent groves of this $2^{nd}$ gate etch could be filled with oxide and then distanced from the sidewalls making the holes ready for the completion of the channel and S/D pillar formation similar to the process presented in reference to FIG. 43D-43F.

In some memory structures it could be desired to give up the extra storage sites which would have been enabled by the $1^{st}$ gates in order to reduce the leakage risk due to soft- or hard-breakdown between the $1^{st}$ gates and the $2^{nd}$ gates. For such structure, a dummy dielectric layer could be inserted in the multilayer substrate instead of the $1^{st}$ gates polysilicon layers 5340, 5346, with the corresponding changes for the fabrication flow.

Additional alternative is to use a relatively thinner layer for the polysilicon layer in the multilayer substrate. FIG. 44G illustrates such alternative in respect to FIG. 44A. The polysilicon layers 5362, 5364 are relatively thinner, for example, such as a thickness of less than about 30 nm or less than about 20 nm. FIG. 44H illustrates the structure after the corresponding polysilicon selective indenting etch 5363, 5365. Following the selective polysilicon indenting etch, a selective isotropic oxide etch could be used to expend the indentation in preparation for the O/N/O deposition. FIG. 44I illustrates the structure after the O/N/O deposition 5366, 5368 and channel deposition. This technique of indent extension could allow reducing the overall memory height or permit a larger vertical space between overlaying adjacent (in Z direction) gate lines.

FIG. 44J illustrates additional alternative in which the dielectric on top and below $1^{st}$ gate are indented without extending beyond the O/N/O leaving a space 5372, 5374 to form $2^{nd}$ gates which are displaced from the $1^{st}$ gates to thus reduce the risk of leakage. FIG. 44K illustrates the structure after the formation of the $2^{nd}$ gates—lower-$2^{nd}$ gate 5384 and upper-$2^{nd}$ gate 5376.

The 3D NOR-P structures relating to FIG. 44A could be constructed using a multilayer substrate of just two materials for the interchanging layers. And then using layer replacement as presented in respect to FIG. 44E and FIG. 44F processed to form the $2^{nd}$ gates similar to the structure illustrated in FIG. 44F and FIG. 44J.

In many of the structures herein the S/D holes are shown to be made larger than the channel holes. In some alternatives it could be preferred to reverse having the S/D holes smaller and adapt the process flow and device layout accordingly.

An additional alternative is to use a flow similar to the one in reference to FIG. 43A-43E, yet has a relatively far smaller poly indent vs. the one of FIG. 43C, and still perform per level channel isolation such as the donut like channel related to FIG. 43D. For such, following the steps related to FIG. 43E, an isotropic selective etch through the S/D holes, could be performed to etch the dielectric region of the multilayer and then the related O/N/O region and finally the corresponding channel pillar regions, etching and isolating the channel between cell levels, effectively forming donut like channels. Once done, the access grove could be filled with isolating materials; the S/D sidewalls could be than cleaned to be followed by completing the S/D pillars as presented in respect to FIG. 43F herein. This flow could include isotropic etch of the dielectric layer after the first poly indent as presented in reference to FIG. 44H-44I herein. Many other mix and match of these processes could be engineered by an artisan in the semiconductor 3D memory art to better tune the memory structure to the desired application.

An additional aspect that could be engineered relates to forming ridge selects for these new $2^{nd}$ gates-$2^{nd}$ wordlines. For the case in which the $2^{nd}$ gates material is to be metallic, the ridge select could be formed before the layer replacement, and be protected from the metal replacement.

The three gates per channel configuration presented respect to FIG. 44A-44K could extend storage sites by using the adjacent gate to steer storage on the active facet similar to techniques presented before such as in reference to FIG. 23A-23B. If the body formation includes a center gate (instead of body-line) it could be used also to assist such. For such use it could be desired to design the channel width in Y direction to be larger than about 10 nm, or about 20 nm, or about 40 nm or even larger. Such techniques could allow 4 or more storage sites for each of the $2^{nd}$ gates resulting with 20 or more storage sites per cell, and each site could support multi-levels, thus resulting in 40 or more bits per cell.

In many of the 3D NOR-P structure herein the channel could be formed like multiwall tube (or arc) with oxide in-between; each tube could be made with thickness of about 10 nm. The oxide barrier could help keep low Vt variation and higher mobility as discussed previously.

Additional alternative for the 3D NOR-P structure mixing some of the techniques in here is presented in reference to FIG. 45A-45G (X-Y 5400 top view). This alternative illustrates gate replacement performed through the S/D holes after the formation of the channels. For this flow the starting substrate is a multilayer of poly over oxide. FIG. 45A illustrates one designated channel punched hole 5408 and two designated S/D punched holes 5406 at top view X-Y direction 5400, with polysilicon layer 5402 covering (semi-transparent) layer of oxide 5404. The hole vertical anisotropic etch could be done together having them slightly spaced 5407. It should be noted that the hole punch step could include many or all of the other holes needed to complete the 3D NOR-P structures. FIG. 45B illustrate the structure after sealing (using technique similar to the one in reference to 4052 of FIG. 31F) the S/D holes 5410, in fully processing the channel holes 5412 forming O/N/O, channel and body-line. As an alternative to sealing 5410 larger S/D holes with cleaning process could be used. FIG. 45C illustrate the structure after removing the sealing 5410, and replacing the polysilicon, or any other sacrificial layer used such as nitride, with metal gate 5420, such as tungsten or silicidation of the poly strips through the open S/D holes 5406. The channel pillar could function as posts to hold the oxide layer during the gate replacement process. Then the gate layers could be selectively indented through the S/D holes 5414. FIG. 45D illustrates the structure after filling the indent grooves with isolative material 5422. The isolative material 5422 could be such that it supports the following selective etch of oxide and preferably nitride. The holes side-walls are then cleaned. At this point, if desired, optional steps could be taken to etch through the S/D holes oxide layer access to the channel regions to etch it at the in-between cells regions to form donut-like channels, and fill the region with oxide. FIG. 45E illustrates the structure after the gate isolation 5422 is selectively indented to expose the channel O/N/O 5424 to the S/D holes. FIG. 45F illustrates the structure after an access to the channel 5426 is formed by selectively etching the exposed O/N/O through the S/D holes. At this point if desired an n+ doping of the exposed regions of the channels could be performed, techniques such as previously discussed could be used for such n+ channel edge doping. FIG. 45G illustrates the structure after filling in the S/D pillars 5450. These could be using metal or MIS as presented herein to support SB or DSSB 3D NOR-P memory structures.

The use of polysilicon for Thin Film Transistor ("TFT") is common in the industry for many applications. Techniques to improve such transistor channel mobility by re-crystallization have been developed and used for many of these applications including for 3D NAND and similar memory structures. Yet in most 3D memory applications this is limited by the allowed thermal budget and the relatively large channel structured used. For the 3D NOR-P structure, the use of layer transfer could be leveraged to overcome the thermal budget challenge by first processing the channels built into the multilayer structure without peripheral circuits or even select transistors. Once done the select transistors and the memory control circuits could be transferred over or underneath to construct a 3D memory device. An additional advantage for such re-crystallization is the alternative of the 3D NOR-P application using donut-like channels and metal S/D. Some of these techniques are presented in a paper by Lee, Sangsoo, et al. "Advanced Si solid phase crystallization for vertical channel in vertical NANDs."*APL Materials* 2.7 (2014): 076106, by Kar, G. S., et al. "Novel bi-layer polysilicon channel vertical Flash cell for ultrahigh density 3D SO/N/OS NAND technology." *Memory Workshop (IMW)*, 2011 *3rd IEEE International*. IEEE, 2011, by Lisoni, J. G., et al. "Laser Thermal Anneal of polysilicon channel to boost 3D memory performance." *VLSI Technology (VLSI-Technology): Digest of Technical Papers,* 2014 *Symposium on. IEEE,* 2014, by Capogreco, Elena, et al. "Integration and electrical evaluation of epitaxially grown Si and SiGe channels for vertical NAND Memory applications." *Memory Workshop (IMW),* 2015 *IEEE International.* IEEE, 2015, Pihan, E., A. Slaoui, and Claire Maurice. "Growth kinetics and crystallographic properties of polysilicon thin films formed by aluminum-induced crystallization." *Journal of crystal growth* 305.1 (2007): 88-98, by Murley, Darren, et al. "An investigation of laser annealed and metal-induced crystallized polycrystalline silicon thin-film transistors." *IEEE Transactions on Electron Devices* 48.6 (2001): 1145-1151, by Chen, T., et al. "Single-grain Si TFTs for high-speed flexible electronics." *Proceedings of SPIE,* 2011 vol. 7956 (2011), and by Lien, Mai Thi Kieu, and Susumu Horita. "Improving crystalline quality of polycrystalline silicon thin films crystallized on yttria-stabilized zirconia crystallization-induction layers by the two-step irradiation method of pulsed laser annealing" *Japanese Journal of Applied Physics* 54.3S (2015): 03CA01, all of the forgoing are incorporated herein by reference.

FIG. 46 Y-Z 5500 vertical cut view along the channel regions could be used to illustrate the structure which could be used for such re-crystallization. It illustrates a small section of the array having a cut-able substrate 5512, a processed multilayer substrate 5510 having pillar holes 5502. These holes 5502 could be used to form indent, deposit O/N/O and channel 5504. The channel deposition could include sidewalls 5506, which could be used for the re-crystallization of the channel and then be removed. In some of the disclosed techniques, additional material such as metal, SiGe, and YSZ could be also deposited on the sidewalls silicon 5507, to help induce re-crystallization as presented in the incorporated art. Additional crystallization techniques could be used such as short laser pulse use, or thermal annealing heating first the substrate 5512 to seed the re-crystallization moving upward and into the channel regions 5504. The 'bubble' 5505 is enlargement of the channel region illustrating the O/N/O over the channel facets. The 3D NOR-P process as presented here and illustrated in FIG. 46 provide a wide range of re-crystallization techniques including slower annealing and higher temperatures applied to smaller donut like channels, which could result in very improved channel mobility and memory performance.

The channel formation could even be done by epitaxial growth of silicon from the substrate 5512 all the way through the channel holes 5502 filling the designated locations 5504. And then later have, if desired, a second punch in the channel regions 5502 to form the donut shape channel and the central body core Similar concepts have been presented in U.S. Pat. No. 9,443,865 incorporated herein by reference. In these alternatives of channel re-crystallization it is expected that the various channels in the same pillar being seeded from the same crystal would have a similar crystallographic orientation.

An additional enhancement to 3D memories is to use an alternative per layer access by sidewall strapping to the method and structure presented in reference to FIG. 18 herein. FIG. 47 is a modified structure to support this alternative method. L1, L2, L3, L4 . . . (5612, 5614, 5616, 5618) are the vertical contact pillars to provide per layer access. The number of pillars could be determined according to the number of layers so to form a contact to each layer with a dedicated pillar. Each one of these contact pillars could be programmed to connect to one wordline (WL1-WL4) by breaking a thin oxide (OTP) between it and the wordline (5641, 5642, 5643, 5644). The wordlines and/or pillars could be engineered to provide a more stable fuse when linked; for example, include a high concentration of atomically large lattice atoms, such as Arsenic in silicon, which would be incorporated into the link when fused. In addition, the programming would be designed to form a hard breakdown oxide so that a formed conductive filament does not become annealed or reconstitute due to the heating during chip operation. The connection region could include the horizontal channel programmable transistors PE1-PE9 controlled by vertically arranged gate contact—PEgate 5632, which provides a controlled connection per wordline to the vertical grounding pillar 5601 with ground contact 5600 GND. The horizontal transistors PE1-PE9 are embedded in the wordline using a similar technique presented here for the ridge select transistors. These transistors comprise charge trap so they could be programmed to be disconnected. The programming could be performed by the memory control circuit 5603 using the Vpp Gen 5602, to generate programming voltage and P Enable to enable the programming. One such list of steps follows:

1. Initially, all PEs (PE1-PE9) are erased (to low Vt) to pass ground potential to respective WLs.
2. Vpp is set to high enough voltage to break the thin oxide (OTP), than P1 is activated presenting the programming voltage Vpp on L1. Then P Enable activates the gate PEgate 5632 opening up all the horizontal programmable transistors PE1-PE9, connecting all the wordlines to ground. One fuse would break which would randomly connect L1 to one of the wordlines. Let say WL1 is connected to L1. Then the programming voltage drops as the current through the activated fuse pull the voltage on L1 down enough so no more fuses would break. A soak algorithm could also be initiated to make the fuse link more stable.
3. Then Vpp and PEgate 5632 could be set to program the connected, through the activated OTP, PE transistor to always OFF (to high Vt). In this case, PE1 transistor is programmed to high Vt. Now, only the rest of the PEs excluding PE1 would pass the ground potential when PEgate is activated.
4. After P1 is disabled, P2 is enabled and the cycle repeats creating connection between L2 and a random WL.
5. Repeat step 2 to 4 for rest of WLs.

The selection of which wordline would be fused first could be guided by changing the vertical pillar ground connection 5601 from metallic pillar to resistive pillar-like polysilicon which could give advantage to the upper wordline closest to the GND to fuse first. A similar concept of random selective fusing by parallel access to multiple anti-fuses is been implemented for a random number generator as is detailed in a paper by Chuang, K-H., et al., "Physically unclonable function using CMOS breakdown position," International Reliability Physics Symposium (IRPS), 2017 IEEE International, IEEE, 2017, incorporated herein by reference. During this programming of a per layer connection, all the relevant ridge selects could be disabled to reduce risk of sneak paths. The per layer connection technique presented in respect to FIG. 47 herein could be combined with the per layer connection technique presented in respect to FIG. 18 herein for various alternatives of mix and matched by an artisan in the art.

For a 3D NOR-P structure that uses $1^{st}$ gates which are also $1^{st}$ wordlines and $2^{nd}$ gates which are also $2^{nd}$ wordlines, it could be effective to leverage per layer contacts made to the $1^{st}$ wordlines for forming per layer contacts to the $2^{nd}$ wordlines. The technique explained in FIG. 47 could be applied regardless if the technique used for forming per layer contact to the $1^{st}$ wordlines, such as staircase technique or the programmable technique herein. Such a per layer connection to the $2^{nd}$ wordline could utilize a variation to the selected channel pillar such as presented in reference to FIG. 44K. This could include replacing the O/N/O 5366 layers with first poly channel and then O/N/O forming programmable transistors between the $1^{st}$ wordlines and $2^{nd}$ wordlines (bottom $2^{nd}$ gate 5376 and upper $2^{nd}$ gate), in which the channel pillar could serve as the controlling gate. Then using a programming technique similar to the one presented in respect to FIG. 47 herein, for the programming of a vertical pillar to one of the $2^{nd}$ wordline and then another pillar to form contact with the other $2^{nd}$ wordline. And do so for all desired layers.

An additional option of mix and match aspects of structures and processes herein is to use a row of holes such as the one illustrated in FIG. 43A for slits when such is part of the structure like 3154, 2202, 3024, 4102 and so forth. Such would allow easier formation of additional storage sites in the slits once the layer replacement or silicidation has been completed. The holes at FIG. 43A may be engineered to leave a thin space 5207 in between them to provide better mechanical stability for the structure while in-process. As previously discussed this could be engineered such that the indent process removes the 'neck' in-between 5210 for the channel to be in direct contact with the S/D. Other variations could be engineered by an artisan in memory technology, such as having the holes overlap thereby leaving a small neck to be closed by following deposition steps, or remove the 'neck' with appropriate etching at some point in the flow. Many additional mix and match of elements herein could be integrated into a memory product by an artisan in memory technology.

FIG. 47B illustrates an alternative to the use of in wordline programmable transistors PE1-PE9 5605 reducing the need for control P Enable 5604, 5632. Instead, it utilizes resistor 5653 and a diode 5652 to the controlled ground signal 5650. The diode 5652 could be constructed by having the hole 5601 be filled with N+ polysilicon 5670 serving as the cathode and the portion of the wordline interfacing the hole be formed from P+ serving as anode. That portion could be extended along the wordline grove and function as the resistor 5653. FIG. 47C, an X-Y 5669 top view of ground hole alternative for the ground hole 5601 of FIG. 47A. The control ground connection 5650 would ground the inner part 5674 while the outer part 5670 could be P+ polysilicon. The controlled ground connection 5650, 5674 could be pulled high after the per-layer contact programming operation to reduce inter-wordline leakage. The programming flow is similar to the one related to FIG. 47A:

1. Vpp is set to high enough voltage to break the thin oxide (OTP), then P1 is activated presenting the programming voltage Vpp on L1. One OTP contact would be activated which would connect L1 to one of the wordlines. The hole resistivity could be designed so the higher wordline would have lower resistivity to the controlled ground 5650, 56745, so it is more likely that WL1 would be connected to L1. Then the programming voltage drops as the current through the activated contact pulls the voltage on L1 down enough such that no additional OTPs would be activated. A soak algorithm could also be initiated to make the link more stable.
2. Then disabling voltage Vdis could be put through P1 and L1 on WL1 so it will not participate in future OTP activation. In this step, the rest of vertical lines are left floating. Vdis could be ~½ Vpp. Alternatively, the already programmed L1 could be left floating so that the self-boosting potential inhibits the unwanted further activation in L1.
3. Now P2 is enabled Vpp is put on L2 to form connection to WL2 while the forthcoming vertical lines are left floating and the forthgoing vertical line is biased ~½ Vpp. After the OTP activation Vdis could be put through P2 and L2 on WL2
4. Repeat these steps for rest of WLs.

The diode 5652 and the other elements such as the OTP/RRAM links 5641-5644 could be engineered to withstand the voltage through these connections in operation. In some 3D memories this could be a relatively high voltage ~16 v. It might require an alternative diode construction than the one presented in respect to FIG. 47C, and/or a relatively larger hole or multiple of holes. The engineering of the diode to withstand high voltage on the word lines could include having the diode pn interface to include intrinsic or lightly doped n-type or lightly doped p-type polysilicon disposed between n+ polysilicon and the p+ polysilicon. The width of the polysilicon portion in the middle may be about 20 nm, about 50 nm or even about 1 um if desired.

Alternatively the ground connection 5601 could be etched out once the per-layer connection process has been completed. Alternatively, in-wordline transistor placed between GND region 5600 and the memory cell may be incorporated to electrically shut-off the WL voltages to impact another WL potential. Alternatively, a portion of the in-wordline polysilicon or metal maybe formed as a fuse structure which forms an electrically open circuit once the programmable staircase is completed.

An additional alternative is to form the per-layer connections with multiple structures such as the one illustrated in FIG. 47A-47C. With such random connection process it is likely that any 'miss connection' would be random and could be detected with a relatively simple test of connect/disconnect between the various per layer connection L1-L4 (L1 should be connected to the parallel WL1 connections and not to anyone else). Any defect could then be corrected either by an etch-out or if RRAM is used then by erasing the wrong connection and continuing to verify and update the connection states until it reaches the desired connection. For such an option of RRAM that could be connected in a second step for low on resistance connectivity could be an interesting option. Such two step contact forming operation is detailed in U.S. Pat. No. 8,390,326 incorporated herein by reference.

The ground hole filling and structure could be designed so that the top wordline WL1 would have the lowest resistivity to the controlled ground signal 5650, and increasing resistivity for WL2 and so forth to guide the connection process to L1-L4. So the upper wordline would be connected before the lower one. FIG. 47D illustrates, X-Z 4870 cut view of such filled ground hole. It illustrates additional engineering option to increase the resistivity for the lower wordlines by having the vertical holes with tapered walls 5682 having a larger opening at the top and a smaller opening at the bottom. In FIG. 47D, 5680 indicates the wordlines, which could consist of p+ polysilicon functioning as the anode of the diode 5652, the n+ polysilicon 5681 filling the tapered hole, and functioning as the diode 5652 cathode and resistive path to the contact to the controlled ground signal 5684.

Alternatively the wordline could be made of n+ polysilicon and the tapered hole 5682 could be filled with P+ polysilicon. Such would reverse the diode 5652 and accordingly the programming direction could be reversed to have Vpp negative with respect to the controlled ground 5650.

An additional alternative is to use lateral transistors such as PE1-PE9 instead of diodes, and control their gates to full disconnect once the per layer contact programming has been completed.

In some 3D structures the wordlines are replaced so to be metallic, for example, materials such as, tungsten or silicide. In such structure the region designated for forming the resistors 5653 and part of the diodes 5652 could be first replaced to the proper polysilicon material and then protected by lithography from being replaced or silicided.

The OTP/RRAM material could be silicon oxide or other forms of oxide and could be deposited with techniques such as ALD.

An additional alternative is to add to the structure additional pillars such as 5601 with reverse diode built-in to be used for the erase programming of the RRAM if needed.

An additional option is to include a measurement step following each connection step. The measurement could confirm that only one wordline had been connected. The measurement could be resistivity to the controlled ground, which could be lower (half) if two wordlines got connected, or capacitive load which could twice higher if two wordlines got connected. If the measurement indicates that more than one wordline got connected, then the connection could be reversed and the cycle could start again. The structure could include more vertical connections than the number of layers to give alternative for defective vertical connection pillars.

Additional alternative is to add in additional set of per layer contacts (L1-L4) to be used for OTP. So after the use of RRAM to establish per layer contacts the OTP could be activated using the RRAM per layer contacts to disable all but one wordline (WLs) as per layer are programmed using the OTP. The disabling could be achieved by posting ½ Vpp on the other wordlines.

It should be noted that this per layer programmable connection process could be adapted to various 3D structures. The connection made to wordlines herein could be adapted to other 3D structures in which the per-layer horizontal wires could be bitlines, select lines etc. Such as in respect to the per-layer connections for 3D NOR presented in PCT/US2016/052726 in which the per-layer contact are to be the contact to the bitlines.

The technologies presented herein to reduce the number of times a wafer needs to be processed for deep etch are concepts that provide valuable advantages as the deep vertical etch process for 3D Memories has a significant impact on the overall device cost The use of SB or DSSB presented herein is a concept with the associated detailed implementation concept herein for 3D NOR-P, 3D NOR-C and 3D NOR-C4 fabrics. In recent U.S. patent application publication 2017/0148517, incorporated herein by reference, it is detailed that in high density 3D memories, parallel programming operations are preferred to avoid use of hot-electron and programming should use FN and direct tunneling due to their high write energy efficiency. The concept herein, utilizing SB and or DSSB together with 3D layer transfer to structure the memory control circuits (peripheral circuits) on top or under the array (see FIG. 5A-6D and FIG. 8A-8E), provides an effective use of hot-electron programming with a low energy per write operation, allowing parallel operation on multiple memory sites. An additional benefit in using SB and or DSSB together with 3D layer transfer, in conjunction with the 3D NOR-P, 3D NOR-C and 3D NOR-C4 architectures, is a high speed write operation including lower than about 100 ns or lower than about 200 ns or lower than about 70 ns write cycle options. This could be further enhanced for faster writing speed by reducing the tunneling oxide thickness to less than about 1 nm or even skipping it altogether. Such memory could be attractive for DRAM application in which the associate reduction in retention time could be well accepted.

Additional advantage of 3D memory architecture having array of relatively small units overlaid by periphery circuits as presented in PCT/US2017/052359 such as in reference to its FIG. 22A-22F, is the option to create redundancy at the unit level such as one ridge could be a redundant ridge or one layer could be a redundant layer.

Additional advantage of independent processing of the 3D memory array and the periphery circuits is the ability to independently perform the high temperatures steps for one structure without affecting the other. This opens up many annealing steps and channel crystallization options without being limited by the thermal budget of the periphery circuits.

These memory architectures could use combination of hot-electron using SB and or DSSB, and potentially with side gate or side S/D steering to define multiple storage sites per memory facet. Adding the adaptive refresh techniques, such as presented in reference to FIG. 39 herein, could result in a significant increase to the overall storage capacity of these memory structures.

An additional option that could be integrated with many of the 3D NOR-P structures herein is to replace the polysilicon channel material with an alternative thin-film, for example, such as a metal oxide, thus forming a metal oxide, compound semiconductor, or organic thin film transistor instead of the polysilicon channel based transistor. The example of metal oxide semiconductor may include but not limited to Indium gallium zinc oxide (IZGO), zinc oxide, and hafnium oxide. The example of compound semiconductor TFT may include but not limited to cadmium selenide. Those metal oxide semiconductor or compound semiconductors may be deposited by solution-based coating, CVD or sputtering. The example of organic semiconductor TFT may include but not limited to small molecules such as mbrene, tetracene, pentacene, diindenoperylene, perylene-diimides, tetracyanoquinodimethane (TCNQ), and polymers such as polythiophenes (especially poly(3-hexylthiophene) (P3HT)), polyfluorene, polydiacetylene, poly(2,5-thienylene vinylene), poly(p-phenylene vinylene) (PPV), and carbon based materials, for example, such as carbon nanotubes and graphene. Those organic materials may be deposited by solution casting small molecules. Such metal oxide thin-film transistor ("TFT") is presented in a paper by Nayak, Pradipta K., et al., "Thin film complementary metal oxide semiconductor (CMOS) device using a single-step deposition of the channel layer," *Scientific reports* 4 (2014); by Socratous, Josephine, et al., "Electronic Structure of Low-Temperature Solution-Processed Amorphous Metal Oxide Semiconductors for Thin-Film Transistor Applications." *Advanced functional materials* 25.12 (2015): 1873-1885; by Rim, You Seung, et al., "Boost Up Mobility of Solution-Processed Metal Oxide Thin-Film Transistors via Confining Structure on Electron Pathways," Advanced Materials 26.25 (2014): 4273-4278; and by Kwon, Jang Yeon, and Jae Kyeong Jeong. "Recent progress in high performance and reliable n-type transition metal oxide-based thin film transistors," *Semiconductor Science and Technology* 30.2 (2015): 024002, all of which are incorporated herein by reference.

Alternatively, the channel material may be a monolayer 2D material that could be conformally deposited by CVD. Such channel material may include but not be limited to MoS2, MoSe2, WS2, WSe2, ReS2, ReSn2, SnS2, SnSe2, PtSe2.

FIG. 48A and FIG. 48B are side cut views along the X-Z direction 4870 to illustrate differences between holes etched together/simultaneously (FIG. 48A) vs. holes punched in two independent etch steps (FIG. 48B). The side-walls-self-aligned holes 4874, 4876, 4878 in a multilayer structure 4872 could be used for different functions as illustrated in FIG. 45A. FIG. 48B illustrates holes etched into a multilayer structure 4882 in which holes 4884, 4888 are etched in one step while holes 4886 in another step. With 'Single Punch' the sidewall vertical scallop pattern of the etched hole is substantially the same as the sidewall vertical scallop pattern of the other holes etched at the same time, being processed at the same process into a uniform structure. The peak and valley pattern of the scallop is continuous along the X-Y direction between these simultaneously etched holes.

FIGS. 49A-49D illustrates an additional alternative 3D memory flow which we could call 3D NOR-P/C. The multilayer starting substrate could be oxide-poly for the poly channel option and epitaxial of SiGe and Silicon for the single crystal channel option. The oxide or the SiGe function as a sacrificial layer and could be replaced in the presented flow. The illustrations are X-Y 5800 top view.

FIG. 49A illustrates a region of the structure after a deep vertical etch punching holes 5804, 5806, 5808 in the multilayer substrate. The multilayer substrate is a multiple stack of channel material and inter-channel dielectric, where the channel material could be either the polycrystalline channel or single crystalline channel. Such structure will result in horizontal channel, horizontal gate, and vertical source/drain architecture. The dash lines 5802 illustrates that the presented region is a cut from repeating structure. The illustration present two main groups of holes. The first 5804 are to function as slits holes and the second 5806, 5808 are designated to function as S/D holes. The slits holes are in close proximity to form a slit or a valley between memory units. The S/D holes 5806 could be arranged as illustrated resembling honey comb or in other patterns such as square like. Following the holes punching, a posts forming process could take place. This post would support the overhanging structure for subsequent oxide release. Such as indenting the sacrificial layer and conformal deposition of post layer which would be etch with the sacrificial layer such as nitride. The post layer would be design to cover the holes walls while keeping the holes open for following etch processing. The ratio between the holes designated to be used for forming posts 5804 and the holes used first for layer replacement and then for S/D posts 5806, 5808 could be engineered to guarantee good posts avoiding layer(s) collapse during the layer replacement step. For the same reason, some stress mitigation scheme and dry release processes such as a critical point dryer maybe considered for the replacement step. The posts holes 5802 could be formed as parallel lines oriented in X direction or forming squares with addition lines in Y direction.

FIG. 49B illustrates the structure after forming a sealing 5812 over the slits 5804 holes. Then after, successive etch steps through the unsealed holes 5806, 5808 could be used to remove the post material first and then the sacrificial layers within the multilayer. The O/N/O layers could be conformally deposited similar to what have been presented in respect to FIG. 37E. The hole sidewall could be cleaned, preparing the structure for gate deposition. There are some options for the gate formation similar to that in respect to FIG. 37F. This could include single gates, bottom and top gates with isolation in between, or forming shielding in the middle of the isolation to help reduce cross-talk between the top gate and the bottom gate. The gate materials could be n+ polysilicon or metal such tungsten (the type of S/D material could be considered for the choice of gate material). The hole sidewalls could be cleaned during the steps of deposition to keep them open. Once the sacrificial layer is fully replaced with O/N/O gate and isolation layer an indent isotropic etch could be used to recess the gates forming a groove and then filled with isolation (oxide) to isolate the gates from the S/D pillars about to be formed (similar to flow related to FIG. 36F).

FIG. 49C illustrates the structure after filling the S/D holes with S/D pillars 5816 (as before these could be n+ polysilicon or metal with SB or DSSB or MIS). These S/D pillars could be grouped with bitlines to be selected for the choice of the storage sites. Alternatively for each of the S/D pillars a vertical select transistor could be formed similar to the structure in 3D NAND. But for the 3D NOR-P/C the control circuit could be designed to select two adjacent S/D pillars selecting the memory sites accordingly.

FIG. 49D illustrates the structure after removing the slits sealing 5812. The open slits holes 5822 could now be used to etch the posting layer and then the posting layer sidewalls to reduce leakage between the top gates and the bottom gates.

The 3D NOR-P/C could follow similar flows as described in reference to FIG. 34C to add per layer contacts etc.

Also as discussed before some of the S/D holes could be used as contacts to the channel (body). This could be per layer or in parallel.

An additional alternative is to use similar slits concept 5804 at selected regions such as the dicing streets as a stress release for the multilayer structure. In an advanced 3D memory structure the multilayer structure could be formed by stacking multilayers on top of a base multilayer. This is used to overcome the etch aspect ratio limitation. The base multilayer is first punched with holes and then additional multilayers may be formed over to be punched again. Accordingly the first multilayer could include stress relieve slits formed by the holes punched in addition to the holes punched for the memory construction.

Many of the innovative structures, processes and techniques presented herein in respect to 3D NOR-P could be adapted by a semiconductor memory artisan for the 3D NAND memory.

The 3D integration techniques such as presented herein could be used to support many derivatives of memory products by a mix and match of memory control circuits on top or below the memory array, or both sides. These could allow multiple control circuits: some that use multi-bits per cell and some that do not, and also multiple techniques of multi bit such as presented herein. The memory array could also be made with a generic size which could be customized to a specific memory product by properly designing the memory control circuit and sizing the end product by the setting of the dicing lines.

It will also be appreciated by persons of ordinary skill in the art that the invention is not limited to what has been particularly shown and described hereinabove. For example, the use of SiGe as the designated sacrificial layer or etch stop layer could be replaced by compatible material or combination of other material including additive materials to SiGe like carbon or various doping materials such as boron or other variations. And for example, drawings or illustrations may not show nor p wells for clarity in illustration. Further, any transferred layer or substrate or wafer preparation illustrated or discussed herein may include one or more undoped regions or layers of semiconductor material. Further, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus, the invention is to be limited only by appended claims.

We claim:

1. A 3D memory device, the device comprising:
   a first vertical pillar, said first vertical pillar comprises a transistor source;
   a second vertical pillar, said second vertical pillar comprises a transistor drain,
      wherein said first vertical pillar and said second vertical pillar function as a source or a drain for a plurality of overlaying horizontally-oriented memory transistors,
      wherein at least of one of said plurality of overlaying horizontally-oriented memory transistors is disposed between said first vertical pillar and said second vertical pillar,
      wherein said plurality of overlaying horizontally-oriented memory transistors are self-aligned being formed following the same lithography step; and
   memory control circuits,
      wherein said memory control circuits are disposed at least partially directly underneath said plurality of overlaying horizontally-oriented memory transistors, or are disposed at least partially directly above said plurality of overlaying horizontally-oriented memory transistors.

2. The 3D memory device according to claim 1,
   wherein said plurality of overlaying horizontally-oriented memory transistors each comprise a tunneling oxide region and a charge trap region, and
   wherein said tunneling oxide region is thinner than 1 nm or does not exist to enable said 3D memory device to operate at high speed.

3. The 3D memory device according to claim 1, further comprising:
   a third vertical pillar,
      wherein said third vertical pillar and said second vertical pillar function as a source or a drain for a second plurality of overlaying horizontally-oriented memory transistors.

4. The 3D memory device according to claim 1,
   wherein said memory control circuits are structured to provide a periodic memory refresh operation to said plurality of overlaying horizontally-oriented memory transistors.

5. The 3D memory device according to claim 1,
   wherein said first vertical pillar comprises metal and does not comprise n+ type silicon.

6. The 3D memory device according to claim 1,
   wherein said first vertical pillar and said second vertical pillar each comprise a filled cylinder shape.

7. The 3D memory device according to claim 1,
   wherein each of said plurality of overlaying horizontally-oriented memory transistors comprises a unique channel region, and
   wherein said unique channel regions are isolated from each other.

8. A 3D memory device, the device comprising:
   a first vertical pillar, said first vertical pillar comprises a transistor source;
   a second vertical pillar, said second vertical pillar comprises said transistor drain,
      wherein said first vertical pillar and said second vertical pillar function as a source or a drain for a plurality of overlaying horizontally-oriented memory transistors,
      wherein said plurality of overlaying horizontally-oriented memory transistors are self-aligned being formed following the same lithography step,
      wherein at least of one of said plurality of overlaying horizontally-oriented memory transistors is disposed between said first vertical pillar and said second vertical pillar,
      wherein said plurality of overlaying horizontally-oriented memory transistors each comprise a tunneling oxide region and a charge trap region, and
      wherein said tunneling oxide region is thinner than 1 nm or does not exist to enable said 3D memory device to operate at high speed.

9. The 3D memory device according to claim 8, further comprising:
   memory control circuits,
      wherein said memory control circuits are structured to provide a periodic memory refresh operation to said plurality of overlaying horizontally-oriented memory transistors.

10. The 3D memory device according to claim 8 further comprising:
    a third vertical pillar,
       wherein said third vertical pillar and said second vertical pillar function as a source or a drain for a second plurality of overlaying horizontally-oriented memory transistors.

11. The 3D memory device according to claim 8, further comprising:
    a plurality of gate-lines,
       wherein each of said plurality of gate-lines control one of said plurality overlaying horizontally-oriented memory transistors, and
       wherein said plurality of gate-lines each comprise a built-in control transistor.

12. The 3D memory device according to claim 8,
    wherein said first vertical pillar comprises metal and does not comprise n+ type silicon.

13. The 3D memory device according to claim 8,
    wherein said first vertical pillar and said second vertical pillar each comprise a filled cylinder shape.

14. The 3D memory device according to claim 8,
    wherein each of said plurality of overlaying horizontally-oriented memory transistors comprises a unique channel region, and
    wherein said channel regions are isolated from each other.

15. A 3D memory device, the device comprising:
    a first vertical pillar, said first vertical pillar comprises a transistor source;
    a second vertical pillar, said second vertical pillar comprises a transistor drain, wherein said first vertical pillar and said second vertical pillar function as a source or a drain for a first plurality of overlaying horizontally-oriented memory transistors, wherein at least of one of said first plurality of overlaying horizontally-oriented memory transistors is disposed between said first vertical pillar and said second vertical pillar, wherein said first plurality of overlaying horizontally-oriented memory transistors are self-aligned being formed following the same lithography step; and a third vertical pillar, wherein said third vertical pillar and said second vertical pillar function as a source or a drain for a second plurality of overlaying horizontally-oriented memory transistors.

16. The 3D memory device according to claim 15,
wherein said plurality of overlaying horizontally-oriented memory transistors each comprise a tunneling oxide region and a charge trap region, and
wherein said tunneling oxide region is thinner than 1 nm or does not exist to enable said 3D memory device to operate at high speed.

17. The 3D memory device according to claim 15, further comprising:
memory control circuits,
wherein said memory control circuits are structured to provide a periodic memory refresh operation to said plurality of overlaying horizontally-oriented memory transistors.

18. The 3D memory device according to claim 15,
wherein said first vertical pillar comprises metal and does not comprise n+ type silicon.

19. The 3D memory device according to claim 15,
wherein said first vertical pillar and said second vertical pillar each comprise a filled cylinder shape.

20. The 3D memory device according to claim 15,
wherein each of said plurality of overlaying horizontally-oriented memory transistors comprises a unique channel region, and
wherein said channel regions are isolated from each other.

* * * * *